(12) United States Patent
Lin et al.

(10) Patent No.: US 11,923,411 B2
(45) Date of Patent: Mar. 5, 2024

(54) INTEGRATED CHIP AND METHOD OF FORMING THEREOF

(71) Applicant: Taiwan Semiconductor Manufacturing Company, Ltd., Hsin-Chu (TW)

(72) Inventors: Meng-Han Lin, Hsinchu (TW); Yong-Shiuan Tsair, Tainan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 17/586,519

(22) Filed: Jan. 27, 2022

(65) Prior Publication Data

US 2022/0157937 A1    May 19, 2022

Related U.S. Application Data

(63) Continuation of application No. 16/217,405, filed on Dec. 12, 2018, now Pat. No. 11,239,313.
(Continued)

(51) Int. Cl.
*H01L 29/423*    (2006.01)
*H01L 21/762*    (2006.01)
(Continued)

(52) U.S. Cl.
CPC .... *H01L 29/0653* (2013.01); *H01L 21/76224* (2013.01); *H01L 21/823828* (2013.01);
(Continued)

(58) Field of Classification Search
CPC .......... H01L 29/42372; H01L 29/42376; H01L 29/4238
See application file for complete search history.

(56) References Cited

U.S. PATENT DOCUMENTS

| 6,153,478 A | 11/2000 | Lin et al. |
| 6,541,351 B1 | 4/2003 | Bartlau et al. |

(Continued)

FOREIGN PATENT DOCUMENTS

| JP | 2011071431 A | 4/2011 |
| KR | 20080003556 A | 1/2008 |

(Continued)

OTHER PUBLICATIONS

Sonnet, Sachin. "Conquering the 'Kink' in Sub-Threshold Power MOSFET Behavior: A Simple Compact Modeling Approach." EDN Network. Jan. 6, 2015.
(Continued)

*Primary Examiner* — Jae Lee
(74) *Attorney, Agent, or Firm* — Eschweiler & Potashnik, LLC

(57) ABSTRACT

An integrated chip comprises a substrate, an isolation structure and a gate structure. The isolation structure is disposed in the substrate and enclosing an active region in the substrate. The active region comprises a source region and a drain region separated by a channel region along a first direction. The gate structure is disposed over the channel region and comprising a first gate electrode region and a second gate electrode region arranged one next to another laterally along a second direction perpendicular to the first direction. The first gate electrode region has a first composition, and the second gate electrode region has a second composition different than the first composition.

20 Claims, 53 Drawing Sheets

Related U.S. Application Data

Figure 1A:
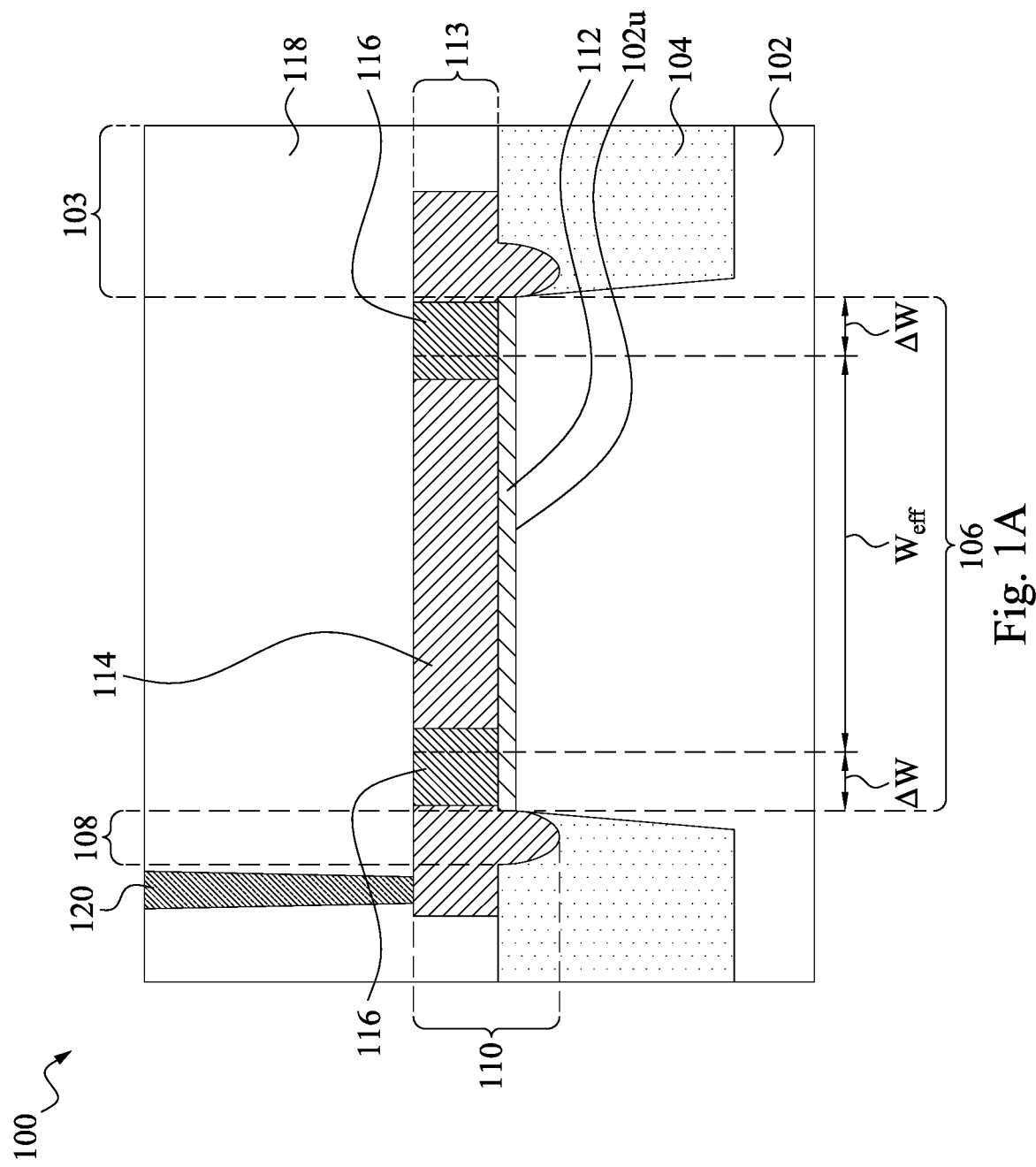

(60) Provisional application No. 62/752,708, filed on Oct. 30, 2018.

(51) Int. Cl.
  *H01L 21/8238* (2006.01)
  *H01L 27/092* (2006.01)
  *H01L 29/06* (2006.01)
  *H01L 29/08* (2006.01)
  *H01L 29/10* (2006.01)
  *H01L 29/66* (2006.01)

(52) U.S. Cl.
  CPC .... *H01L 21/823878* (2013.01); *H01L 27/092* (2013.01); *H01L 29/0847* (2013.01); *H01L 29/1033* (2013.01); *H01L 29/42356* (2013.01); *H01L 29/66545* (2013.01)

(56) References Cited

U.S. PATENT DOCUMENTS

| | | | |
|---|---|---|---|
| 7,304,354 | B2 | 12/2007 | Morris |
| 7,514,940 | B1 | 4/2009 | Bu |
| 7,932,143 | B1 | 4/2011 | Pal et al. |
| 10,468,410 | B2 | 11/2019 | Lin et al. |
| 2004/0126990 | A1 | 7/2004 | Ohta |
| 2007/0075351 | A1 | 4/2007 | Schulz et al. |
| 2007/0187760 | A1 | 8/2007 | Furuta et al. |
| 2008/0124872 | A1 | 5/2008 | Verma et al. |
| 2009/0140334 | A1 | 6/2009 | Chang |
| 2009/0181477 | A1 | 7/2009 | King et al. |
| 2010/0006926 | A1 | 1/2010 | Zhu et al. |
| 2010/0084717 | A1 | 4/2010 | Tanaka |
| 2011/0198699 | A1 | 8/2011 | Hung et al. |
| 2011/0309417 | A1 | 12/2011 | Wang et al. |
| 2012/0001271 | A1 | 1/2012 | Chae et al. |
| 2012/0223390 | A1 | 9/2012 | Liang et al. |
| 2012/0292665 | A1 | 11/2012 | Marino et al. |
| 2013/0334595 | A1 | 12/2013 | Liaw |
| 2014/0167177 | A1 | 6/2014 | Kim et al. |
| 2016/0190305 | A1 | 6/2016 | Jian et al. |
| 2017/0170278 | A1 | 6/2017 | Peng et al. |
| 2018/0190773 | A1* | 7/2018 | Huang ................ H01L 29/7833 |
| 2019/0131417 | A1 | 5/2019 | Hong et al. |
| 2019/0378905 | A1 | 12/2019 | Lin et al. |
| 2021/0343875 | A1* | 11/2021 | Wang ................ H01L 29/42384 |

FOREIGN PATENT DOCUMENTS

| | | |
|---|---|---|
| KR | 20150122295 A | 11/2015 |
| WO | 2012116528 A1 | 9/2012 |

OTHER PUBLICATIONS

CH. Hollauer: Modeling of Thermal Oxidation and Stress Effects. The date of publication is unknown. Retrieved online on Oct. 16, 2017 from http://www.iue.tuwien.ac.at/phd/hollauer/node7.html.

Evans, David, "Microelectronic Device Fabrication I, Lecture 5: The Effect of Electric Field on the Semiconductor Surface." Portland State University. The date of publication is unknown, retrieved online on Nov. 14, 2017 from http://web.pdx.edu/~davide/notes.pdf.

Anonymous Author. "2. The Threshold Voltage." Apr. 9, 2018. retrieved from https://nanopdf.com/download/2-threshold-voltage_pdf#.

U.S. Appl. No. 15/989,606, filed May 25, 2018.
U.S. Appl. No. 15/989,648, filed May 25, 2018.
Non Final Office Action dated Mar. 21, 2019 in connection with U.S. Appl. No. 15/989,648.
Non Final Office Action dated Mar. 28, 2019 in connection with U.S. Appl. No. 15/989,606.
Notice of Allowance dated Sep. 25, 2019 in connection with U.S. Appl. No. 15/989,606.
Non-Final Office Action dated Dec. 11, 2019 in connection with U.S. Appl. No. 16/574,205.
Non-Final Office Action dated Mar. 4, 2020 in connection with U.S. Appl. No. 16/550,497.
Notice of Allowance dated Mar. 24, 2020 in connection with U.S. Appl. No. 16/574,205.
Non-Final Office Action dated Apr. 30, 2020 in connection with U.S. Appl. No. 16/661,108.
Non-Final Office Action dated Jan. 23, 2020 for U.S. Appl. No. 16/217,405.
Non-Final Office Action dated Jun. 22, 2020 for U.S. Appl. No. 16/217,405.
Final Office Action dated Dec. 15, 2020 for U.S. Appl. No. 16/217,405.
Non-Final Office Action dated Apr. 15, 2021 for U.S. Appl. No. 16/217,405.
Notice of Allowance dated Sep. 17, 2021 for U.S. Appl. No. 16/217,405.

* cited by examiner

INTEGRATED CHIP AND METHOD OF FORMING THEREOF

REFERENCE TO RELATED APPLICATIONS

This Application is a Continuation of U.S. application Ser. No. 16/217,405, filed on Dec. 12, 2018, which claims the benefit of U.S. Provisional Application No. 62/752,708, filed on Oct. 30, 2018. The contents of the above-referenced Patent Applications are hereby incorporated by reference in their entirety.

BACKGROUND

Modern day integrated chips comprise millions or billions of semiconductor devices formed on a semiconductor substrate (e.g., a silicon substrate). To improve the functionality of integrated chips, the semiconductor industry has continually reduced the dimension of semiconductor devices to provide for integrated chips with small, densely populated devices. By forming integrated chips having small and densely populated devices, the speed of the devices increases and the power consumption of devices decreases.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1A illustrates a cross-sectional view of an integrated chip according to some embodiments of the present disclosure.

FIG. 1B illustrates a top view of the integrated chip in FIG. 1A.

FIG. 2 illustrates a graph showing some embodiments of exemplary absolute threshold voltages corresponding to the transistor device of FIGS. 1A-1B.

FIG. 3A illustrates a top view of an integrated chip according to some embodiments of the present disclosure.

FIGS. 3B-3D illustrate cross-sectional views of the integrated chip in FIG. 3A.

FIGS. 4A, 5A, 6A, 7A, 8A, and 9A illustrate top views showing some alternative embodiments of integrated chips.

FIGS. 4B, 5B, 6B, 7B, 8B, and 9B illustrate cross-sectional views showing some alternative embodiments of integrated chips.

FIGS. 10A, 11A, 12A and 13A illustrate a top view of an integrated chip at various stages of a method in accordance with some embodiments of the present disclosure.

FIGS. 10B, 11B, 12B, 13B and 14-20 illustrate a cross-sectional view of an integrated chip at various stages of a method in accordance with some embodiments of the present disclosure.

FIG. 21 illustrates a flow diagram of some embodiments of a method of forming an integrated chip.

FIGS. 22A, 23A, 24A and 25A illustrate a top view of an integrated chip at various stages of a method in accordance with some embodiments of the present disclosure.

FIGS. 22B, 23B, 24B, 25B, 26-34 illustrate a cross-sectional view of an integrated chip at various stages of a method in accordance with some embodiments of the present disclosure.

FIG. 35 illustrates a flow diagram of some embodiments of a method of forming an integrated chip.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In integrated chips, active devices (e.g., MOSFET (metal-oxide-semiconductor field effect transistor) devices, embedded memory devices, etc).) are generally arranged on a shared semiconductor substrate (e.g., a silicon substrate). However, semiconductor materials can electrically conductive, such that leakage currents may travel between active devices that are located within a semiconductor substrate in close proximity to one another. If such leakage currents are not properly mitigated, cross-talk between adjacent devices can lead to integrated chip failure.

To prevent leakage currents from traveling between adjacent devices, many modern day integrated chips use shallow trench isolation (STI) structures. STI structures are formed by forming a pad oxide over a substrate, patterning the pad oxide according to a nitride masking layer, etching trenches in the substrate according to the nitride masking layer, filling the trenches with one or more dielectric materials (such as silicon dioxide or silicon nitride), and removing excess of the one or more dielectric materials from over the substrate. STI formation processes may furthermore use a wet etching process to remove the nitride masking layer and/or the pad oxide used during formation of the STI structures.

However, it has been appreciated that during the formation of an STI structure, divots may form within an upper surface of the STI structure (e.g., due to the wet etching process used to remove the nitride masking layer and/or pad oxide). Such divots can negatively impact electrical behavior (e.g., both threshold and sub-threshold voltages) of the devices, leading to an unpredictable performance of the devices. For example, during fabrication of a transistor device, a conductive gate material can fill divots within an STI structure, causing the conductive gate material to have sharp edges that can enhance an electric field generated by a gate structure during operation of a transistor device. The enhanced electric field reduces a threshold voltage of the transistor device, resulting in a problem called kink effect (e.g., defined by a double hump in a drain current vs. gate voltage relation). The kink effect has a number of negative consequences, such as being difficult to model (e.g., in SPICE curve fitting and/or parameter extraction).

The present disclosure, in some embodiments, relates to a transistor device having a gate structure comprising multiple gate electrode regions having different work functions and being disposed within an active area having a shape configured to reduce a susceptibility of the transistor device to the performance degradation (e.g., the kink effect) caused by divots in an adjacent isolation structure, and associated method of formation. The transistor device includes a substrate having interior surfaces defining a trench within an upper surface of the substrate. One or more dielectric materials are arranged within the trench. The one or more dielectric materials define an active region in the substrate. The active region has a source region, a drain region, and a channel region between the source and drain regions. The source region and the drain region have widths that are smaller than the channel region. A gate structure extends over the active region at a location between the source and the drain regions. Because the source region and the drain region have smaller widths than the channel region, a resulting effective channel region extending between the source and drain regions will be separated from edges of the isolation structure by a non-zero distance. Separating the effective channel region from the edges of the isolation structure by the non-zero distance reduces an effect that divots within the isolation structure on the effective channel region. Moreover, the gate structure includes a first gate electrode region having a first composition of one or more materials and a second gate electrode having a second composition of one or more materials different than the first composition of one or more materials. The different compositions of materials within the gate structure have different work functions that are able to be used to tune a threshold voltage of the transistor device to offset the undesirable effect of divots and/or dopant diffusion on the threshold voltage.

Figure 1B:
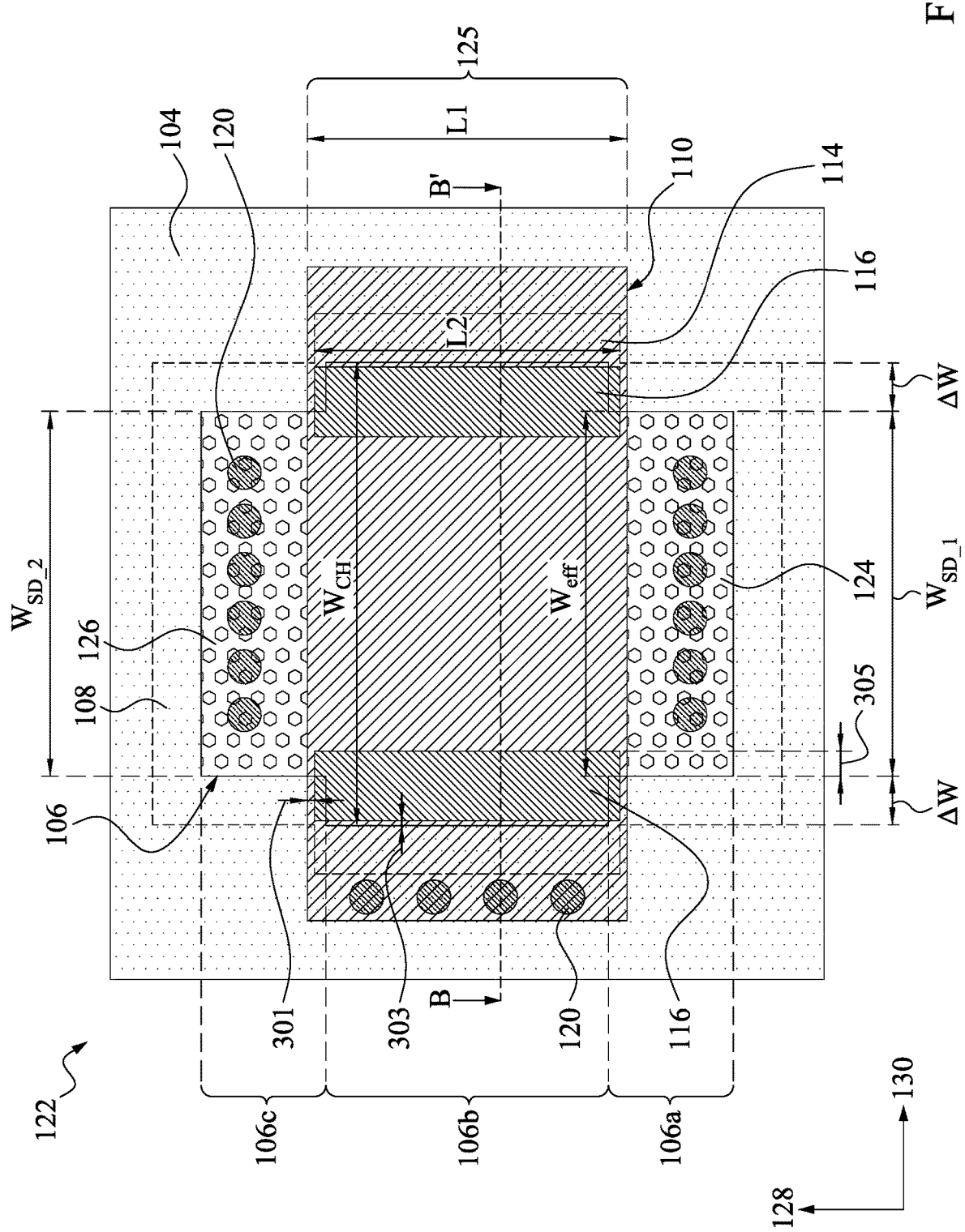

FIGS. 1A-1B illustrate some embodiments of an integrated chip having a transistor device comprising a gate structure configured to improved device performance, wherein FIG. 1A illustrates a cross-sectional view 100 of the integrated chip along a cross-sectional line B-B' of FIG. 1B. Moreover, the transistor device is within an active area having a shape configured to improved device performance.

As shown in cross-sectional view 100 of FIG. 1A, the integrated chip includes a substrate 102 having interior surfaces defining a trench 103 extending within an upper surface 102u of the substrate 102. An isolation structure 104 (e.g., a shallow trench isolation (STI) structure) comprising one or more dielectric material is disposed within the trench 103. The isolation structure 104 includes sidewalls defining an active region 106 in the substrate 102 (i.e., a region of the substrate 102 where a transistor device is located). The isolation structure 104 further includes surfaces defining one or more divots 108 that are recessed below an uppermost surface of the isolation structure 104. The one or more divots 108 may be arranged along edges of the isolation structure 104 that are proximate to the active region 106.

As shown in the top view 122 of FIG. 1B, the isolation structure 104 continuously extend around the active region 106, and the one or more divots 108 within the isolation structure 104 surround the active region 106. A first doped region 124 and a second doped region 126 are arranged in the substrate 102 within the active region 106. The first doped region 124 and the second doped region 126 are highly doped regions disposed in the substrate 102. In some embodiments, the first and second doped regions 124 and 126 comprise n-type dopants such as phosphorus, arsenic, etc. In some embodiments, the first and second doped regions 124 and 126 comprise p-type dopants such as boron, gallium, etc. The first doped region 124 is separated from the second doped region 126 along the first direction 128 by an effective channel region 125. A gate structure 110 extends over the effective channel region 125 along a second direction 130 that is perpendicular to the first direction 128.

Referring again to cross-sectional view 100 of FIG. 1A, the gate structure 110 is disposed over the substrate 102 and extends past opposing edges of the active region 106. The gate structure 110 comprises a gate dielectric 112 arranged over the substrate 102, and a gate electrode 113 separated from the substrate 102 by the gate dielectric 112. A conductive contact 120 is arranged within a dielectric structure 118 (e.g., an inter-level dielectric (ILD) layer) over the substrate 102. The conductive contact 120 vertically extends from a top of the gate structure 110 to a top of the dielectric structure 118.

The gate structure 110 includes a first gate electrode region 114 and a second gate electrode region 116. The first gate electrode region 114 has a first work function and the second gate electrode region 116 has a second work function that is different than the first work function. In some embodiments, the first gate electrode region 114 includes a first composition of one or more materials having the first work function and the second gate electrode region 116 includes a second composition of one or more materials that is different than the first composition of one or more materials, and that has the second work function. In some embodiments, the first composition of one or more materials and the second composition of one or more materials do not include the same material.

In some embodiments, wherein the transistor device is a NMOS device, the first composition of one or more materials (in the first gate electrode region 114) comprises an n-type gate metal with a first work function, while the second composition of one or more materials (in the second gate electrode region 116) comprises a p-type gate metal with a second work function that is greater than the first work function (so as to increase an absolute value of a threshold voltage below the second gate electrode region 116). In other embodiments, wherein the transistor device is a PMOS device, the first composition of one or more materials (in the first gate electrode region 114) comprises a p-type gate metal with a first work function, while the second composition of one or more materials (in the second gate electrode region 116) comprises an n-type gate metal with a second work function that is less than the first work function (so as to increase an absolute value of a threshold voltage below the second gate electrode region 116).

As shown in the top view 122 of FIG. 1B, the first gate electrode region 114 and the second gate electrode region 116 are arranged directly over the effective channel region 125. In some embodiments, the effective channel region 125 continuously extends from directly below the second gate electrode region 116 to past outer edges of the second gate electrode region 116 along the first direction 128 and along the second direction 130.

During operation, the gate structure 110 is configured to form a conductive channel within the effective channel region 125 in response to an applied gate voltage. The different work functions of the different gate electrode regions cause charge carriers within the effective channel region 125 to respond differently to the applied voltage. For example, the greater work function of the second gate electrode region 116 causes the gate electrode 113 to use a higher threshold voltage to form a conductive channel below the second gate electrode region 116 than below the first gate electrode region 114. The higher threshold voltage to form a conductive channel below the second gate electrode region 116 offsets a decrease in threshold voltage that is caused by the one or more divots 108 and/or by diffusion of dopants (e.g., boron) from the substrate 102 into the isolation structure 104. By mitigating an effect of the one or more divots 108 and/or by the diffusion of dopants from the substrate 102 into the isolation structure 104, a performance of the transistor device is improved (e.g., the kink effect in the drain current is reduced).

Figure 2:
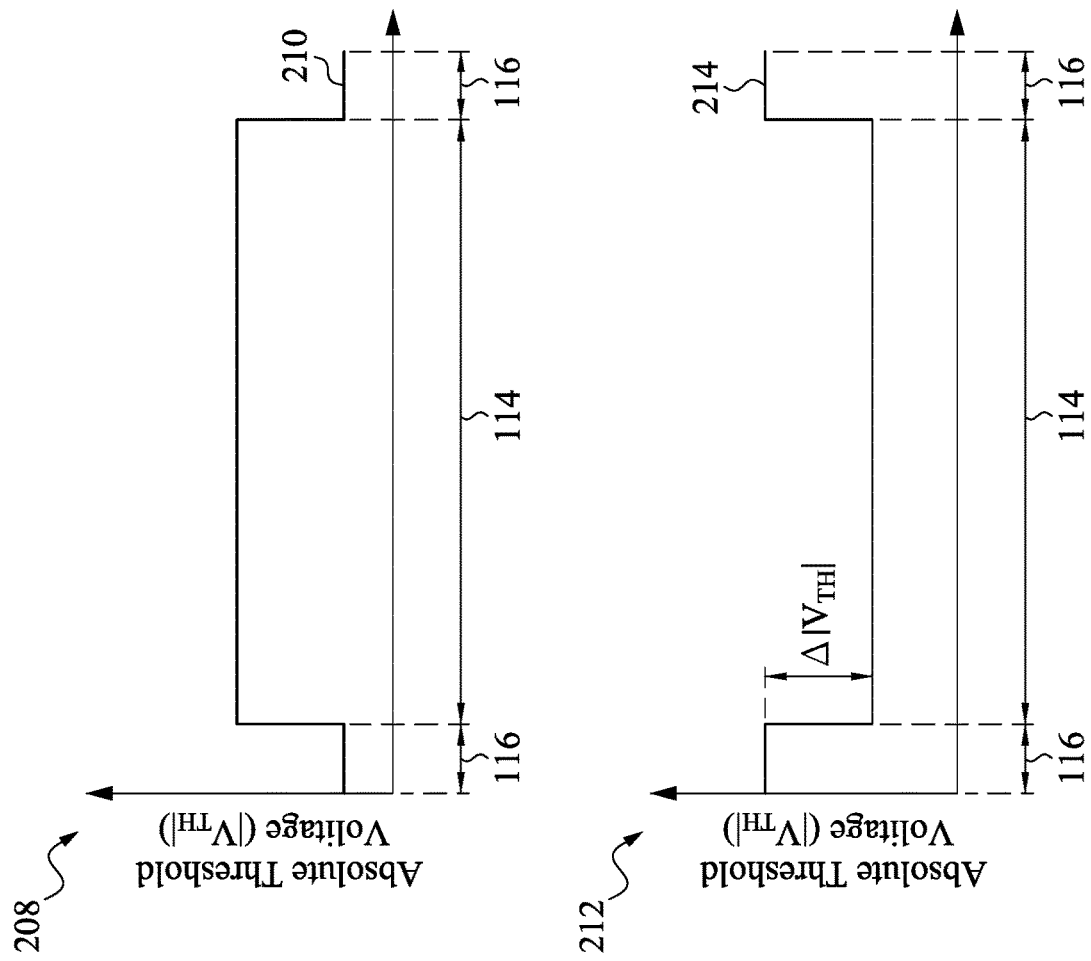

FIG. 2 illustrates some embodiments of graphs, 208 and 212, showing examples of how different features of the integrated chip affect the absolute threshold voltage (shown along the y-axis) as a function of a position within an active area (shown along the x-axis).

Graph 208 illustrates an example of an effect of divots and/or dopant (e.g., boron) diffusion on the absolute threshold voltage. As shown by line 210 of graph 208, due to the one or more divots within the isolation structure and/or dopant diffusion into the isolation structure, an absolute threshold voltage is lower below the second gate electrode region 116 than below the first gate electrode region 114, thus resulting in the kink effect.

Graph 212 illustrates an example of an effect of the different work functions of the first gate electrode region 114 and the second gate electrode region 116 on the absolute threshold voltage. As shown by line 214 of graph 212, due to the different work functions of the first gate electrode region 114 and the second gate electrode region 116, the gate structure has a higher absolute threshold voltage below the second gate electrode region 116 than below the first gate electrode region 114. In some embodiments, a difference in the absolute threshold voltage $\Delta|V_{TH}|$ below the first gate electrode region 114 and below the second gate electrode region 116 is in a range of between approximately 0.5 V and approximately 1.5 V.

The higher absolute threshold voltage below the second gate electrode region 116 (shown in graph 212) offsets the decrease in absolute threshold voltage that is caused by the one or more divots and/or by the diffusion of dopants (shown in graph 208) from the substrate into the isolation structure. By mitigating the effect of the one or more divots or by the diffusion of dopants from the substrate into the isolation structure, a performance of the transistor device is improved (e.g., the kink effect in the drain current caused by the effect of the one or more divots on the electric field generated by the gate structure is reduced).

Referring again to cross-sectional view 122 of FIG. 1B, the active region 106 has a source region 106a that is separated from a drain region 106c along a first direction 128 by a channel region 106b. Along the second direction 130, the source region 106a has a first width $W_{SD\_1}$, the drain region 106c has a second width $W_{SD\_2}$, and the channel region 106b has a third width $W_{CH}$ that is larger than the first width $W_{SD\_1}$ and the second $W_{SD\_2}$. In some embodiments, the first width $W_{SD\_1}$ and the second width $W_{SD\_2}$ may be substantially equal. In some embodiments, a difference between the first width $W_{SD\_1}$ and the third width $W_{CH}$ is greater than or equal to proximately twice a width of one or more divots 108.

A first doped region 124 is disposed within the source region 106a and a second doped region 126 is disposed within the drain region 106c. The first doped region 124 and the second doped region 126 are highly doped regions within an upper surface of the substrate 102. In some embodiments, the first doped region 124 has a width that is substantially equal to the first width $W_{SD\_1}$ and the second doped region 126 has a width that is substantially equal to the second width $W_{SD\_2}$. In some embodiments, the channel region 106b extends past opposing sides of the first doped region 124 and the second doped region 126 along the second direction 130. The gate structure 110 extends over the active region 106 at a location between the first doped region 124 and the second doped region 126.

During operation, the gate structure 110 is configured to generate an electric field that forms a conductive channel within the effective channel region 125 extending within the substrate 102 between the first doped region 124 and the second doped region 126. Since the widths of the first doped region 124 and the second doped region 126 are less than the third width $W_{CH}$ of the channel region 106b, the effective channel region 125 has an effective channel width $W_{eff}$ that is separated from the one or more divots 108 within the isolation structure 104 along the second direction 130 by a non-zero distance $\Delta W$. Separating the effective channel width $W_{eff}$ of the effective channel region 125 from the one or more divots 108 within the isolation structure 104 by the non-zero distance $\Delta W$ reduces an effect of the one or more divots 108 on the electric field generated by the gate structure 110 along edges of the effective channel region 125. By reducing an effect of the one or more divots 108 on the effective channel region 125, a performance of the transistor device is improved (e.g., the kink effect in the drain current caused by the effect of the one or more divots 108 on the electric field generated by the gate structure 110 is reduced).

As shown in the top view 122 of FIG. 1B, the second gate electrode region 116 extends past opposing sides of the channel region 106b along the first direction 128 by a non-zero distance 301. The second gate electrode region 116 thus extends to above the divot 108 along the first direction. In some embodiments, the second gate electrode region 116 is set back from (i.e., offset from or separated from) a boundary between the divot 108 and the channel region 106b along the second direction 130 by a non-zero distance 303. In some embodiments, the second gate electrode region 116 extends to a non-zero distance 305 over opposing sides of source region 106a (or drain region 106c) along the second direction 130. In some embodiments, the first gate electrode region 114 may have a first length $L_1$ along the first direction 128 greater than a second length $L_2$ of the second gate electrode region 116. In some embodiments, the first gate electrode region 114 and the second gate electrode region 116 may be substantially symmetric along a first line extending in the first direction 128 and/or along a second line extending in the second direction 130.

FIGS. 3A-3D illustrate some additional embodiments of an integrated chip comprising a transistor device within an active area having a shape configured to improved device performance.

Figure 3A:
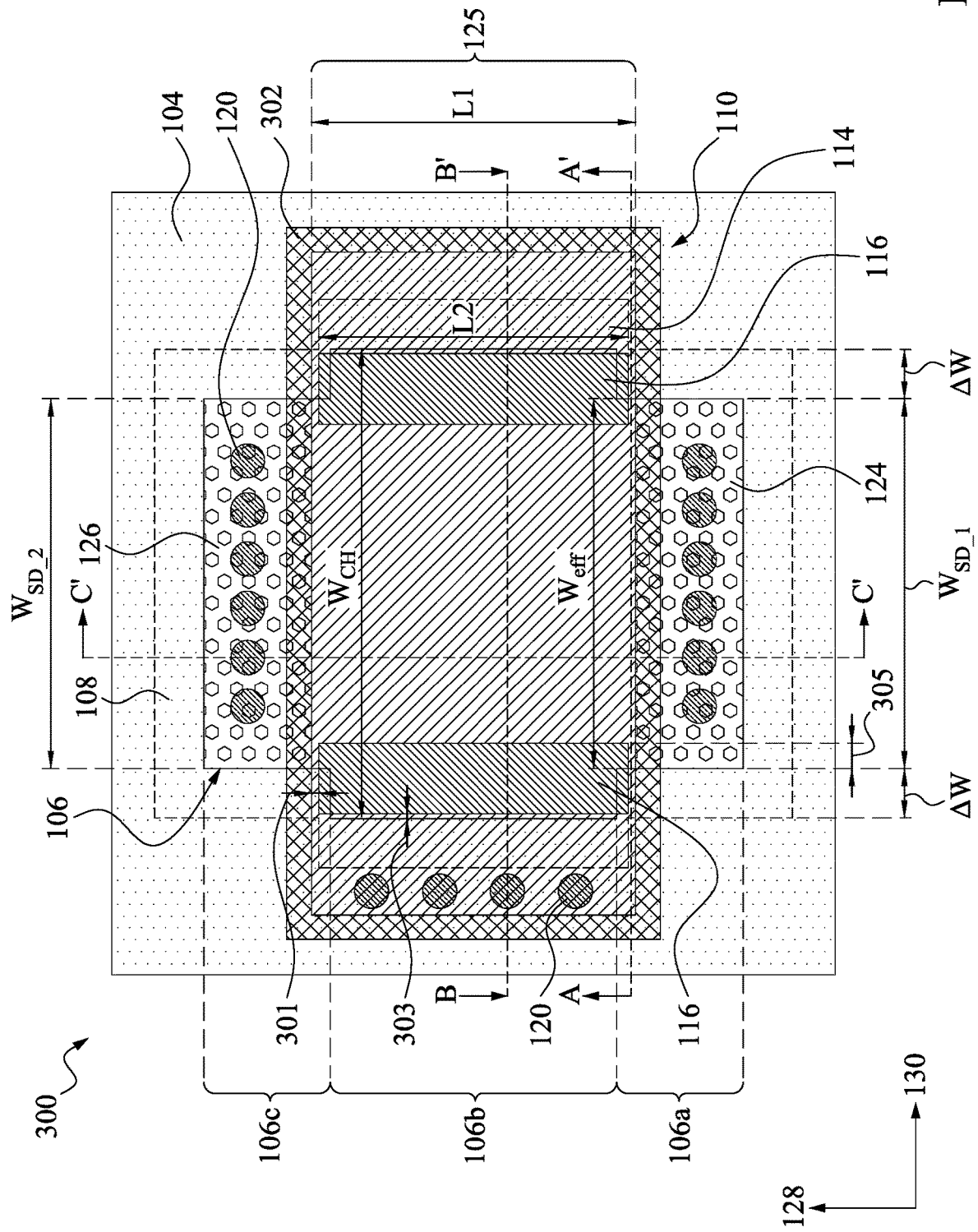

As shown in top view 300 of FIG. 3A, the integrated chip has an isolation structure 104 with sidewalls that define an active region 106 over a substrate (102 of FIG. 3B) including a source region 106a and a drain region 106c separated along a first direction 128 by a channel region 106b. A first doped region 124 is within the source region 106a and has a width (along a second direction 130) that is substantially equal to a width of the source region 106a, and the second doped region 126 is within the drain region 106c and has a width that is substantially equal to a width of the drain region 106c. In some embodiments, the active region 106 is substantially symmetric about a line bisecting the first doped region 124 and the second doped region 126. In some alternative embodiments (not shown), the active region 106 may not be symmetric about a line bisecting the first doped region 124 and the second doped region 126. For example, a middle region of the active region 106 may extend a greater distance past a first side of the source region 106a than past an opposing second side of the source region 106a.

A gate structure 110 is arranged between the first doped region 124 and the second doped region 126 along the first direction 128. The gate structure 110 extends over the active region 106 along the second direction 130. The gate structure 110 includes a first gate electrode region 114 and a second gate electrode region 116. In some embodiments, the first gate electrode region 114 includes a continuous segment, while the second gate electrode region 116 may include two or more separate and distinct segments. In some embodiments where the transistor device is an NMOS (n-type metal oxide semiconductor) transistor, the first gate electrode region 114 may include an n-type metal (e.g., a metal having a work function of less than or equal to approximately 4.2 eV), while the second gate electrode region 116 may include a p-metal (e.g., a metal having a work function of greater than or equal to approximately 5.0 eV). For example, in some embodiments where the transistor device is an NMOS transistor, the first gate electrode region 114 may include an n-type metal such as aluminum, tantalum, titanium, hafnium, zirconium, titanium silicide, tantalum nitride, tantalum silicon nitride, chromium, tungsten, copper, titanium aluminum, or the like. In some embodiments, the second gate electrode region 116 may include a p-type gate metal such as nickel, cobalt, molybdenum, platinum, lead, gold, tantalum nitride, molybdenum silicide, ruthenium, chromium, tungsten, copper, or the like. In some embodiments where the transistor device is a PMOS (p-type metal oxide semiconductor) transistor, the first gate electrode region 114 may include a p-type metal, while the second gate electrode region 116 may include an n-metal. For example, in some embodiments where the transistor device is a PMOS transistor, the first gate electrode region 114 may include a p-type gate metal such as nickel, cobalt, molybdenum, platinum, lead, gold, tantalum nitride, molybdenum silicide, ruthenium, chromium, tungsten, copper, or the like. In some embodiments, the second gate electrode region 116 may include an n-type metal such as aluminum, tantalum, titanium, hafnium, zirconium, titanium silicide, tantalum nitride, tantalum silicon nitride, chromium, tungsten, copper, titanium aluminum, or the like.

In some embodiments, the first gate electrode region 114 contacts the second gate electrode region 116 along the first direction 128 and along a second direction 130 that is perpendicular to the first direction 128. In some embodiments, the second gate electrode region 116 is arranged within apertures (i.e., openings) in the first gate electrode region 114. The segments of the second gate electrode region 116 may be separated by a center portion of the first gate electrode region 114. In some embodiments, the first gate electrode region 114 extends around a perimeter of the gate structure 110, so that the second gate electrode region 116 is completely surrounded by a peripheral portion of the first gate electrode region 114.

In some embodiments, sidewall spacers 302 may be arranged along outer sidewalls of the gate structure 110. The sidewall spacers 302 include one or more dielectric materials. For example, in some embodiments, the sidewall spacers 302 may include an oxide (e.g., silicon oxide), a nitride (e.g., silicon nitride, silicon oxy-nitride, etc.), a carbide (e.g., silicon carbide), or the like. In some embodiments, the gate structure 110 and/or the sidewall spacers 302 may extend along the first direction 128 over the first doped region 124 and/or the second doped region 126.

Figure 3B:
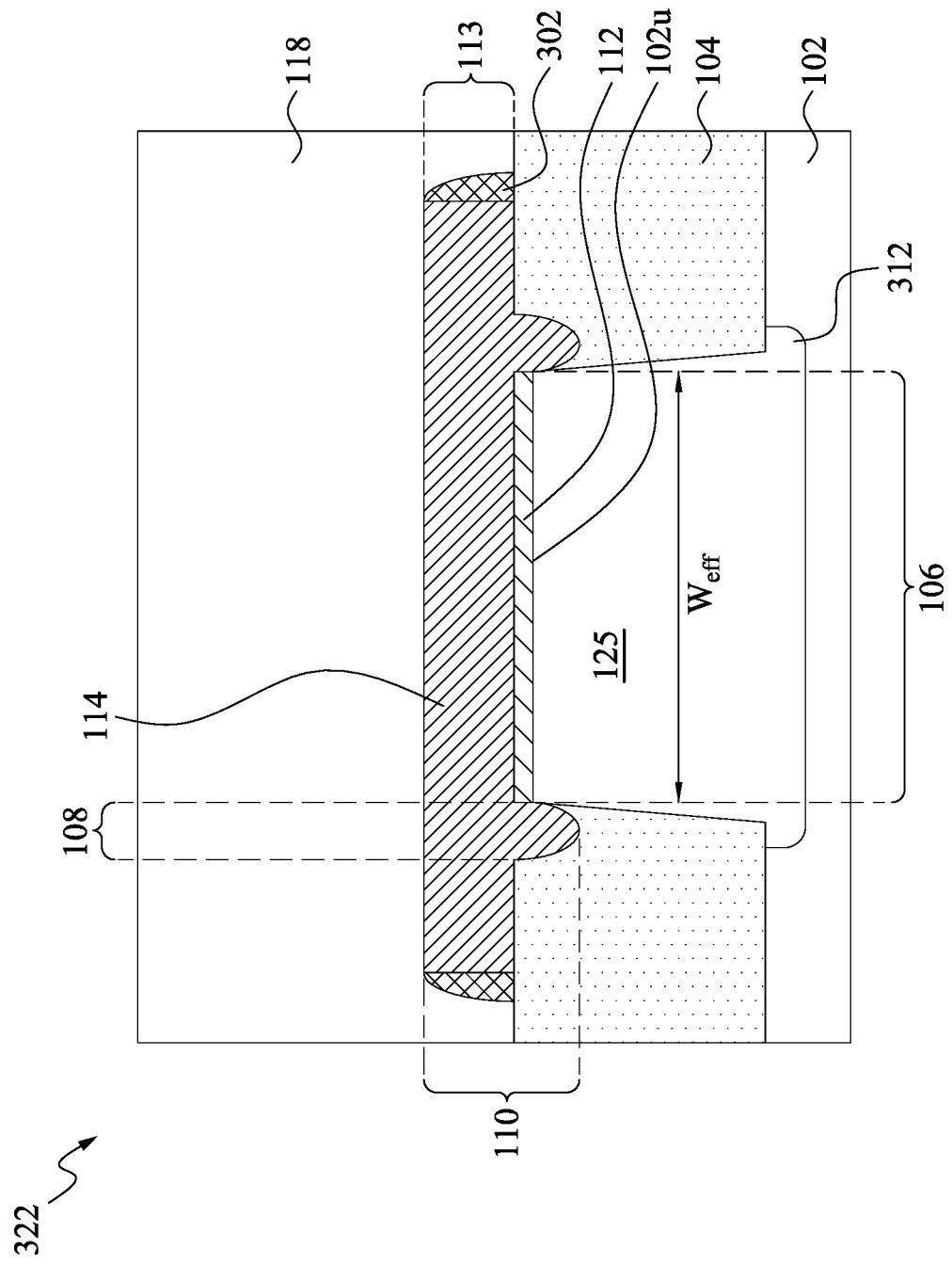
Figure 3C:
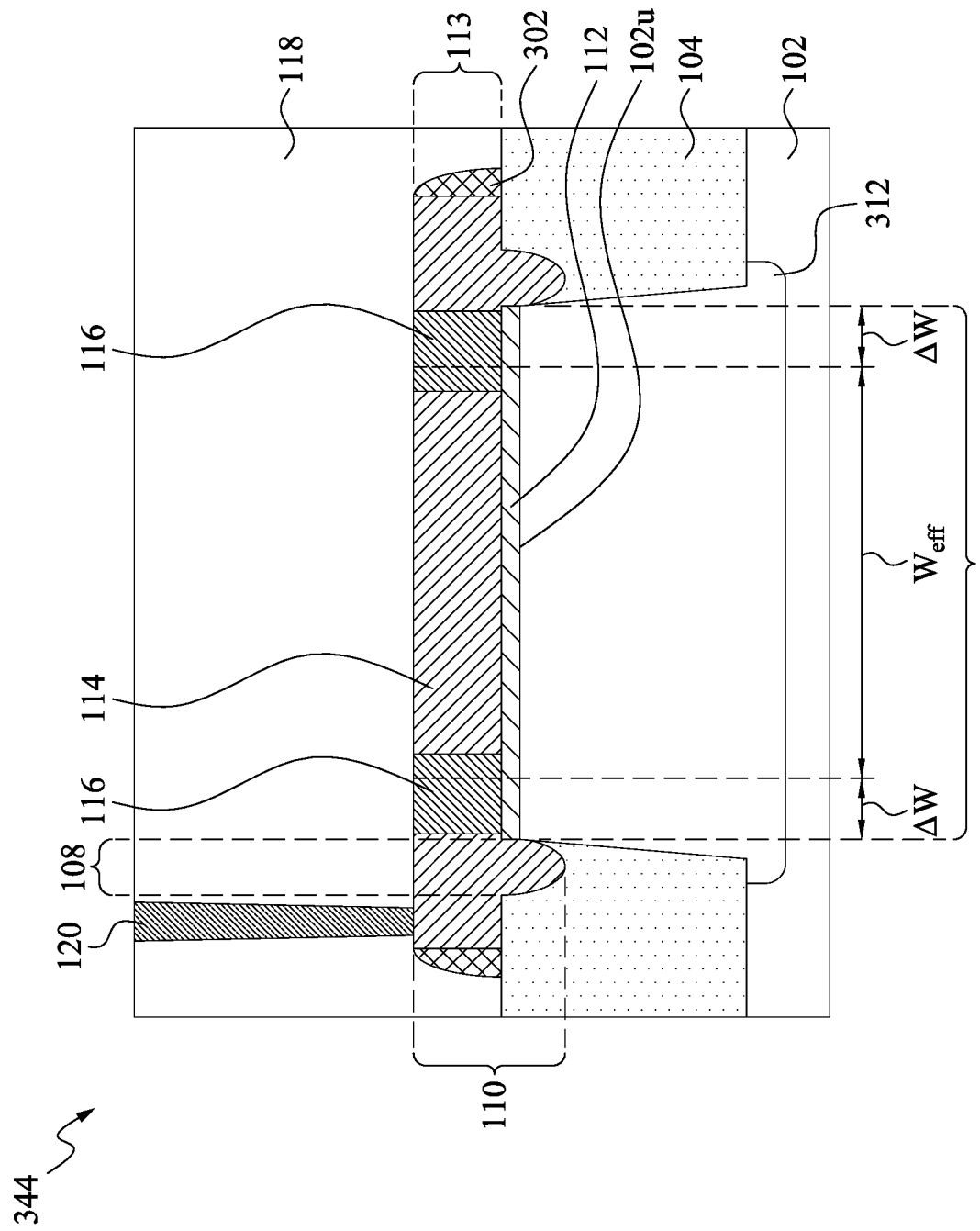

FIGS. 3B and 3C illustrate cross-sectional views 322 and 344, of the integrated chip of FIG. 3A along cross-sectional lines A-A' and B-B'. As shown in the cross-sectional view 322 of FIG. 3B, along the cross-sectional line A-A', a side portion of the active region 106 has a first width $W_{eff}'$ that is substantially equal to an effective channel width $W_{eff}$ of an effective channel region 125 between the first doped region 124 and the second doped region 126 (see FIG. 3A). As shown in cross-sectional view 308 of FIG. 3C, along the cross-sectional line B-B', a middle region of the active region 106 has a second width of $W_{eff}+2\Delta W$, which is greater than the first width by a distance that is equal to twice a non-zero distance $\Delta W$ (i.e., $2\Delta W$).

In some embodiments, a size of the non-zero distance $\Delta W$ may be in a range of between approximately 2% and approximately 10% of a size of the effective width $W_{eff}$. For example, in some embodiments, the non-zero distance $\Delta W$ may have a size of between approximately 10 nm and approximately 1,000 nm, while the effective width $W_{eff}$ may have a size of between approximately 100 nm and approximately 50,000 nm. Having the non-zero distance $\Delta W$ greater than approximately 2% of the effective channel width $W_{eff}$ provides for a large enough distance between the divot and the effective channel region so as to decrease an impact of electric field changes caused by the one or more divot 108 on the effective channel region. Having the non-zero distance $\Delta W$ less than 10% of the effective width $W_{eff}$ keeps a footprint of the transistor device small enough to be cost effective.

In some embodiments, a well region 312 may be disposed within the substrate 102 below the active region 106. The well region 312 has a doping type that is different than that of the substrate 102. For example, in some embodiments where the transistor device is an NMOS transistor device, the substrate 102 may have an n-type doping, the well region 312 may have a p-type doping, and the first doped region 124 and the second doped region 126 may have the n-type doping. In other embodiments where the transistor device is a PMOS transistor device, the substrate 102 may have an n-type doping, the well region 312 may have the n-type doping, and the first doped region 124 and the second doped region 126 may have the p-type doping.

A dielectric structure 118 (e.g., an inter-level dielectric (ILD) layer) is arranged over the substrate 102. In some embodiments, the dielectric structure 118 may include borophosphosilicate glass (BPSG), borosilicate glass (BSG), phosphosilicate glass (PSG), or the like. A conductive contact 120 vertically extends through the dielectric structure 118 to the gate structure 110. The conductive contact 120 contacts the first gate electrode region 114.

Figure 3D:
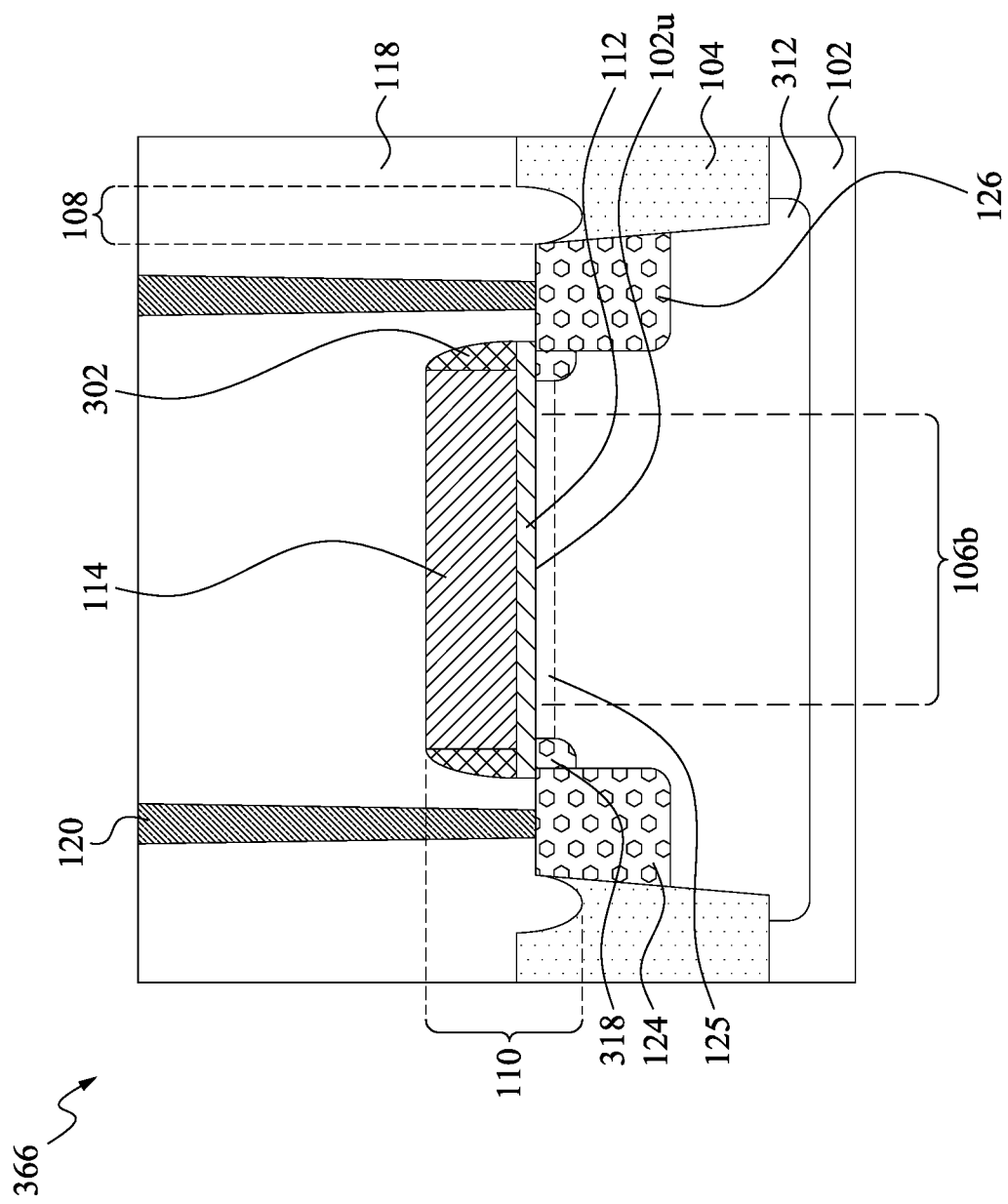

FIG. 3D illustrates a cross-sectional view 366 of the integrated chip along a cross-sectional line C-C' of FIG. 3A. As shown in cross-sectional view 366, the first doped region 124 and the second doped region 126 are arranged within the well region 312 on opposing sides of the gate structure 110.

The effective channel region 125 has a length along the first direction 128 approximately equal to the first length $L_1$ (See FIG. 3A) of the first gate electrode region 114. In other embodiments, the length of the effective channel region 125 is less than the first length $L_1$ of the first gate electrode region 114. In some embodiments, source and drain extension regions 318 may protrude outward from the first doped region 124 and the second doped region 126 to below the sidewall spacers 302 and/or the gate structure 110. In such embodiments, the effective channel region 125 extends between the source and the drain extension regions 318. In some embodiments, a silicide layer (not shown) may be arranged on the first doped region 124 and the second doped region 126. In some embodiments, the silicide layer may include a nickel silicide, cobalt silicide, titanium silicide, or the like.

Figure 4A:
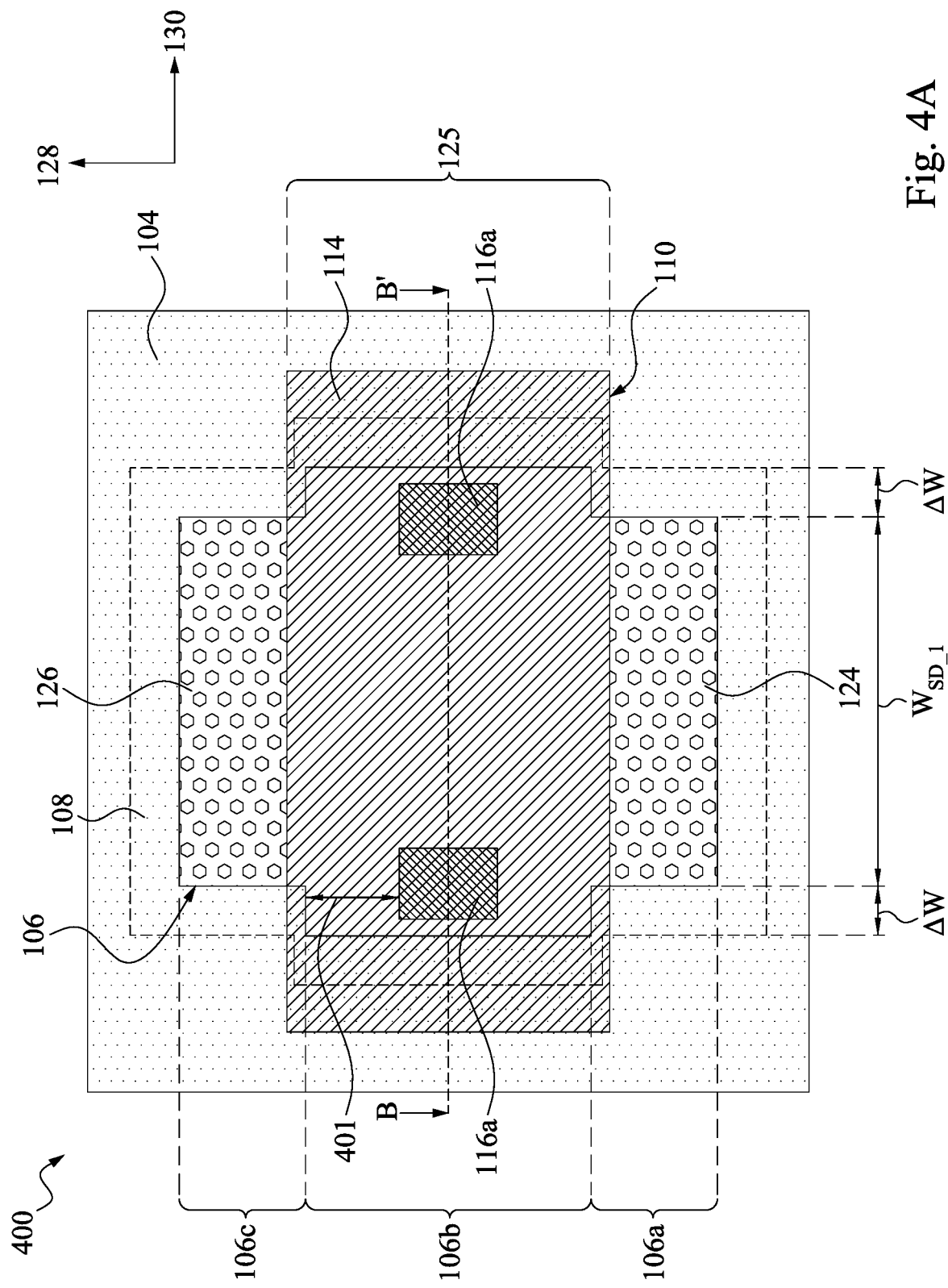
Figure 4B:
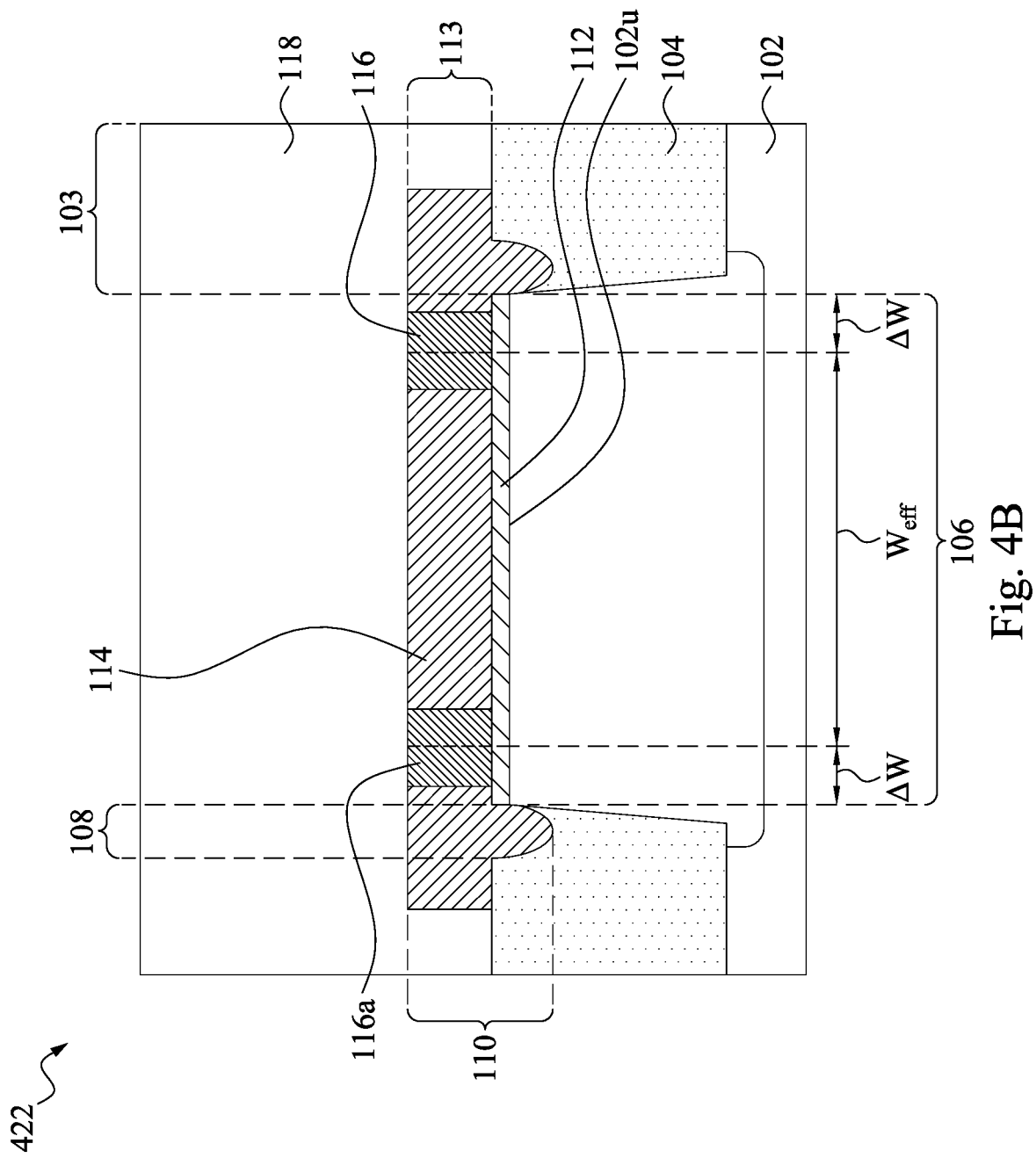

FIGS. 4A-4B respectively illustrate a top view 400 and a cross-sectional view 422 showing some alternative embodiments of integrated chips having a transistor device comprising a gate structure configured to improved device performance. FIGS. 4A-4B illustrate substantially the same transistor device as FIGS. 1A-1B, except for the second gate electrode region 116a. As illustrated top view 400 of FIG. 4A, the second gate electrode region 116a does not extend past opposing sides of the channel region 106b. Instead, the second gate electrode region 116a is set back from a boundary between the divot 108 and the channel region 106b along the first direction 128 by a non-zero distance 401.

Figure 5A:
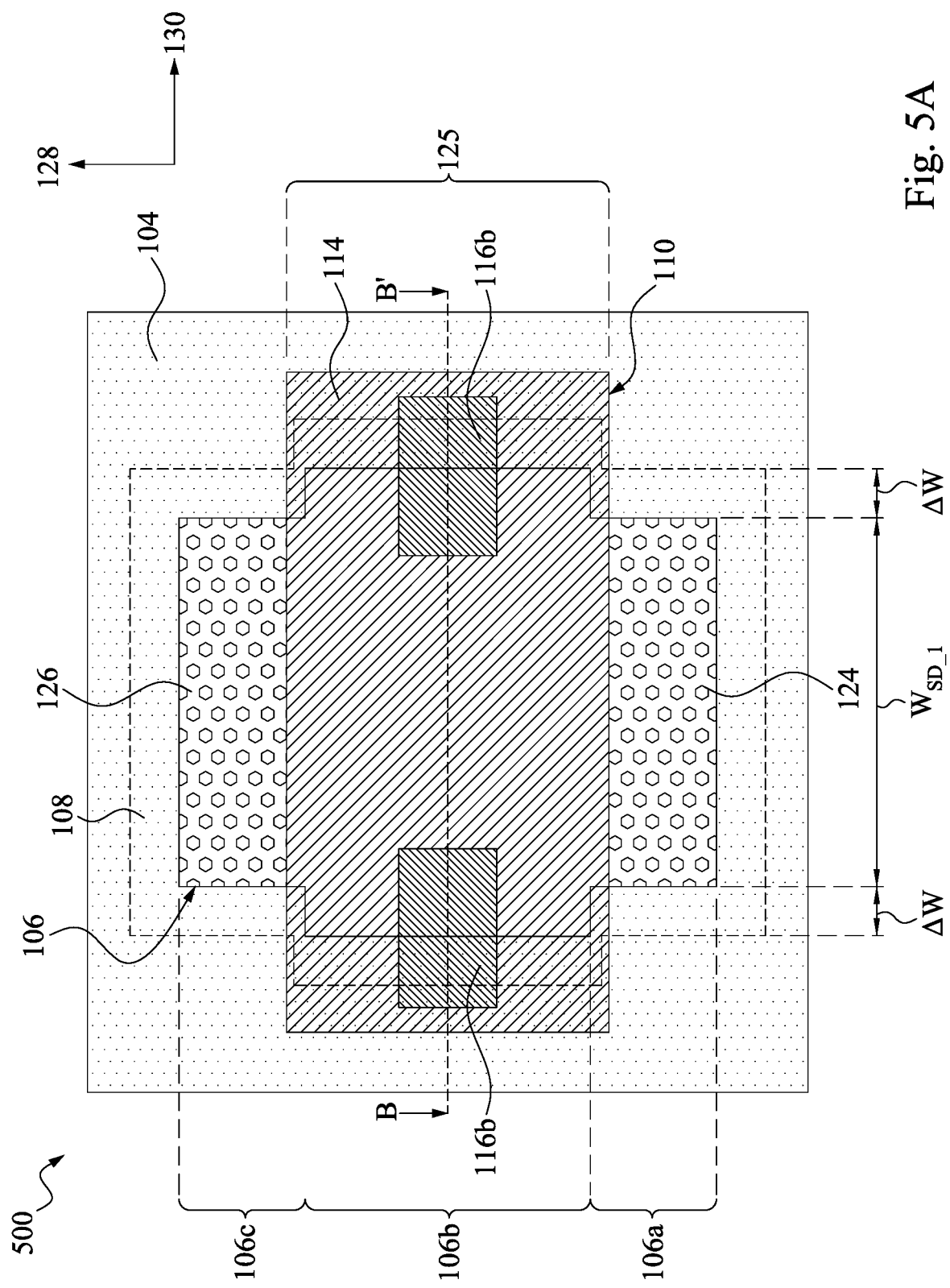
Figure 5B:
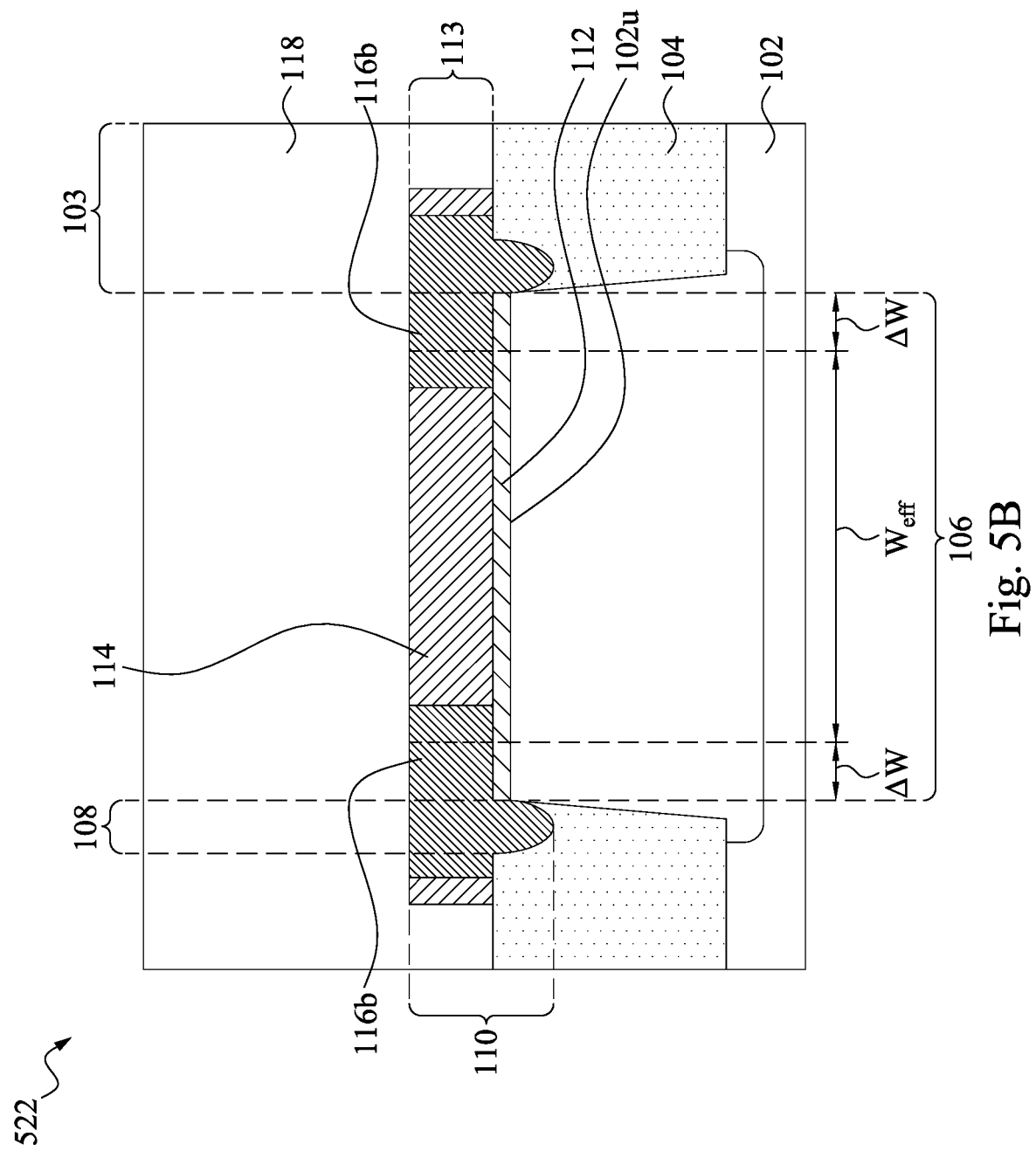

FIGS. 5A-5B illustrate a top view 500 and a cross-sectional view 522 showing some alternative embodiments of integrated chips having a transistor device comprising a gate structure configured to improved device performance. FIGS. 5A-5B illustrate substantially the same transistor device as FIGS. 1A-1B, except for the second gate electrode region 116b. As shown in top view 500 of FIG. 5A, the second gate electrode region 116b extends past opposing sides of the divot 108 along the second direction 130. Stated differently, the second gate electrode region 116b extends across the divot 108 along the second direction 130.

Figure 6A:
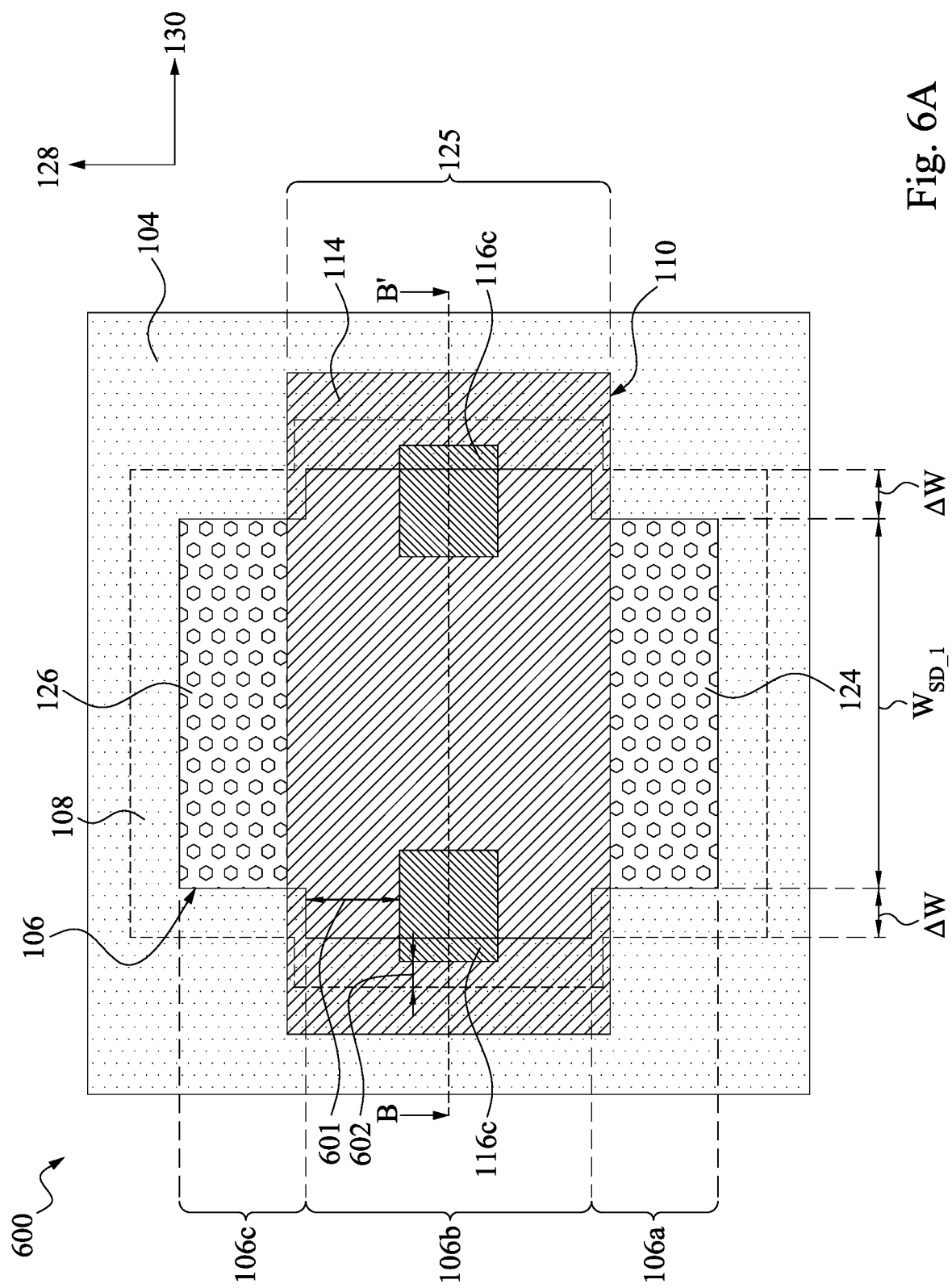
Figure 6B:
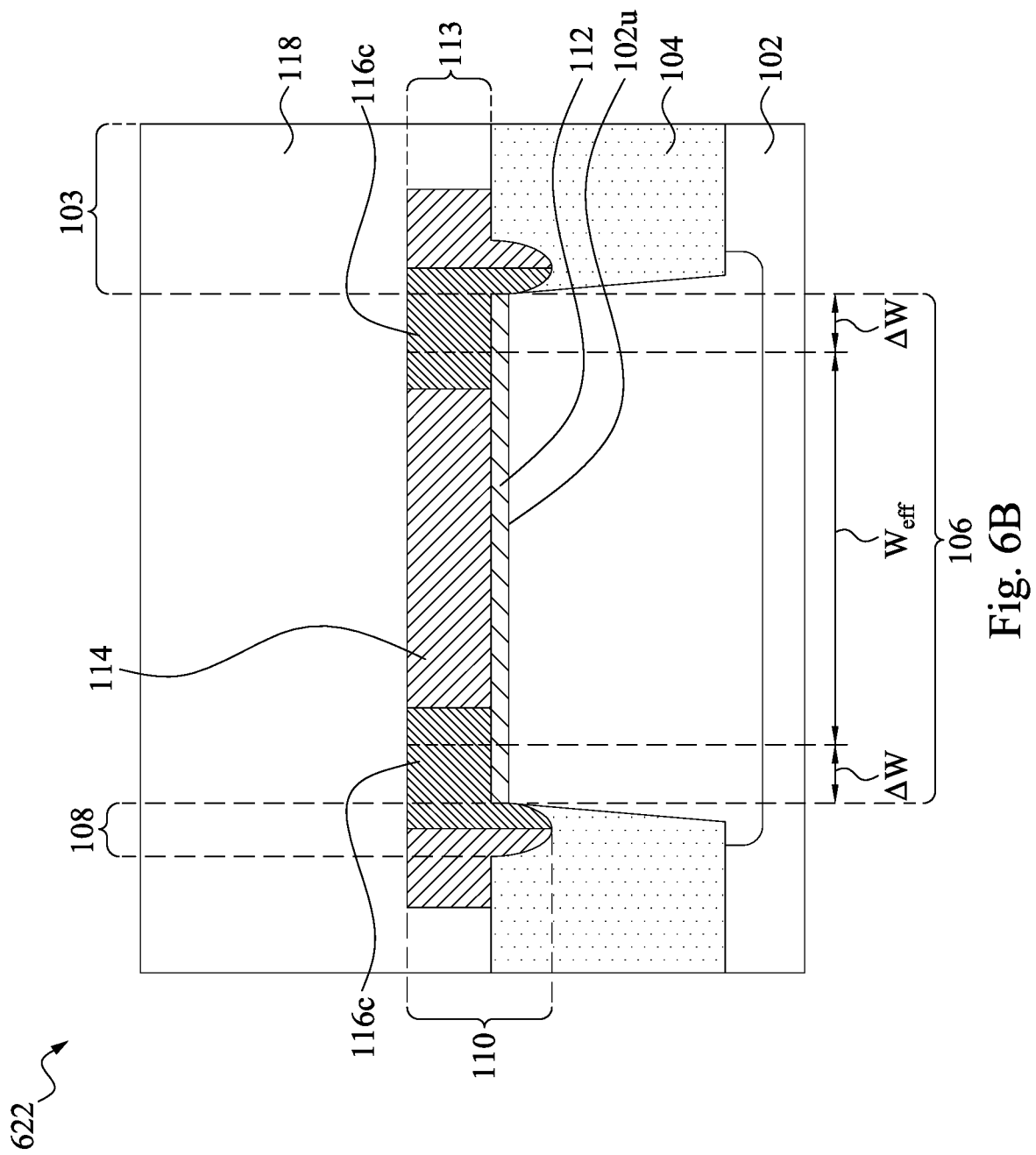

FIGS. 6A-6B illustrate a top view 600 and a cross-sectional view 622 showing some alternative embodiments of integrated chips having a transistor device comprising a gate structure configured to improved device performance. FIGS. 6A-6B illustrate substantially the same transistor device as FIGS. 1A-1B, except for the second gate electrode region 116c. As shown in top view 600 of FIG. 6A, the second gate electrode region 116c is set back from a boundary between the divot 108 and the channel region 106b along the first direction 128 by a non-zero distance 601. Moreover, the second gate electrode region 116c extends past the boundary between the divot 108 and the channel region 106b along the second direction 130, but is set back from an outer edge of the divot 108 along the second direction 130 by a non-zero distance 602.

Figure 7A:
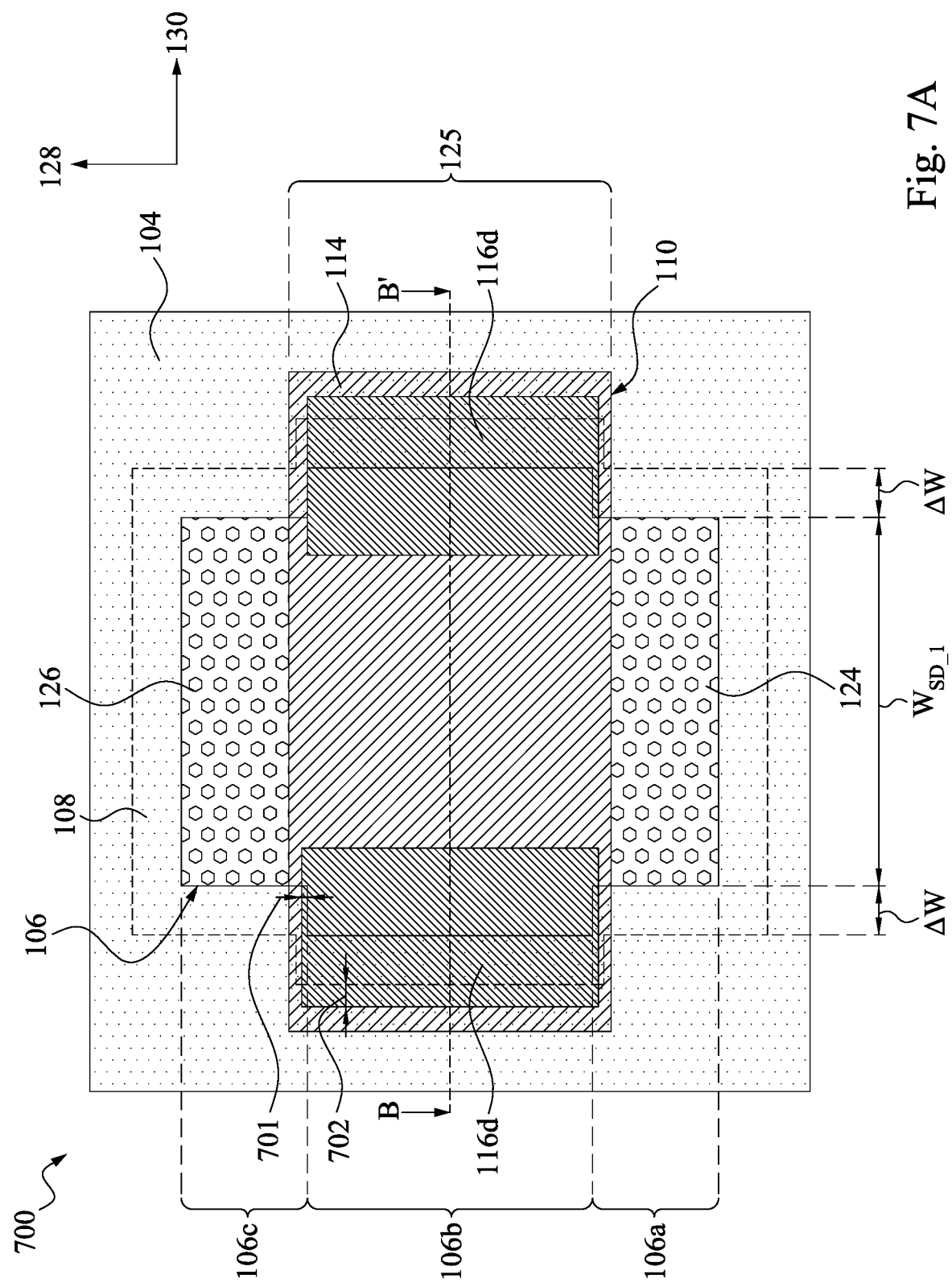
Figure 7B:
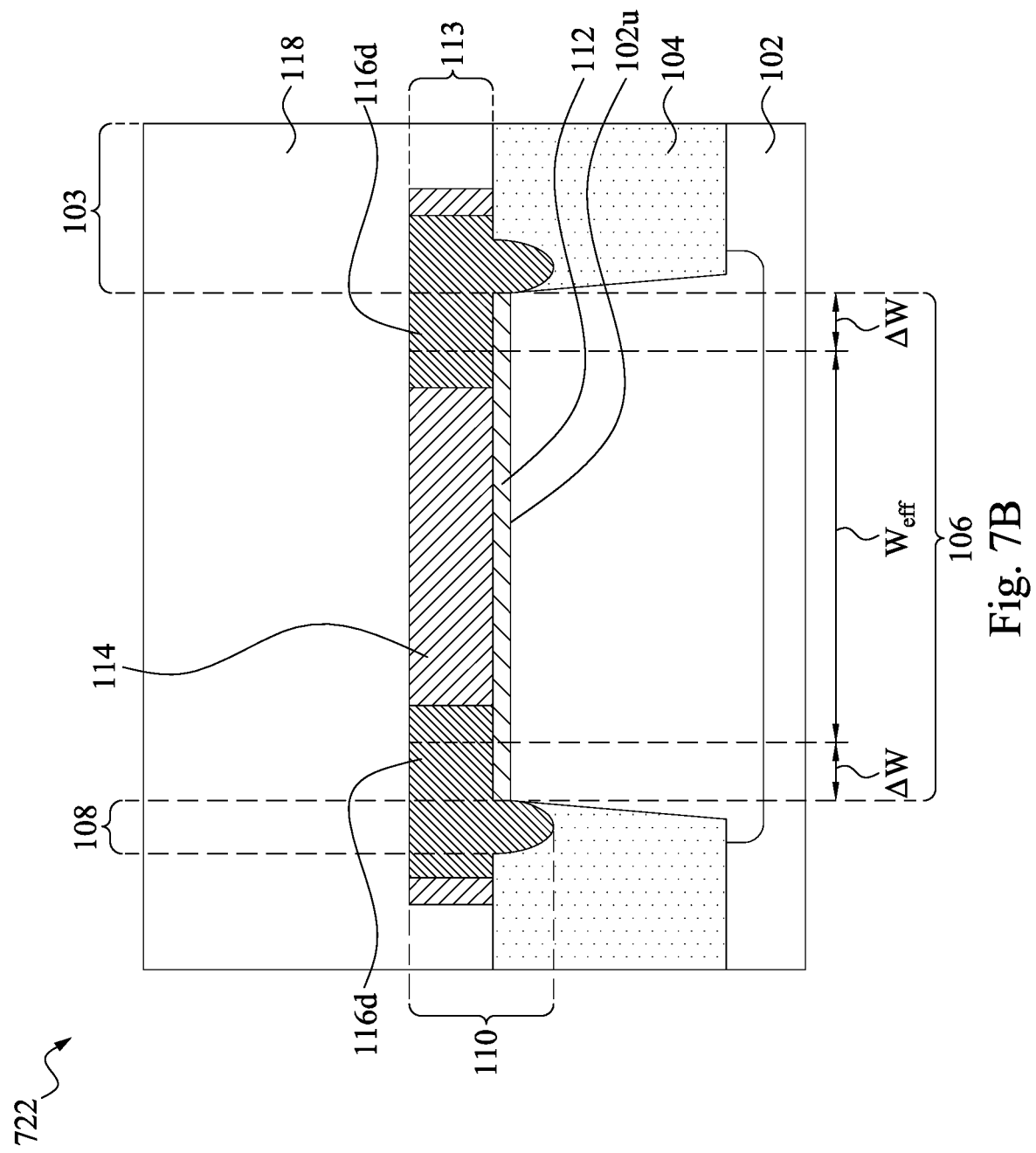

FIGS. 7A-7B illustrate a top view 700 and a cross-sectional view 722 showing some alternative embodiments of integrated chips having a transistor device comprising a gate structure configured to improved device performance. FIGS. 7A-7B illustrate substantially the same transistor device as FIGS. 1A-1B, except for the second gate electrode region 116d. As shown in top view 700 of FIG. 7A, the second gate electrode region 116d extends past opposing sides of the channel region 106b along the first direction 128 by a non-zero distance 701. Moreover, the second gate electrode region 116d extends past an outer edge of the divot 108 along the second direction 130 by a non-zero distance 702.

Figure 8A:
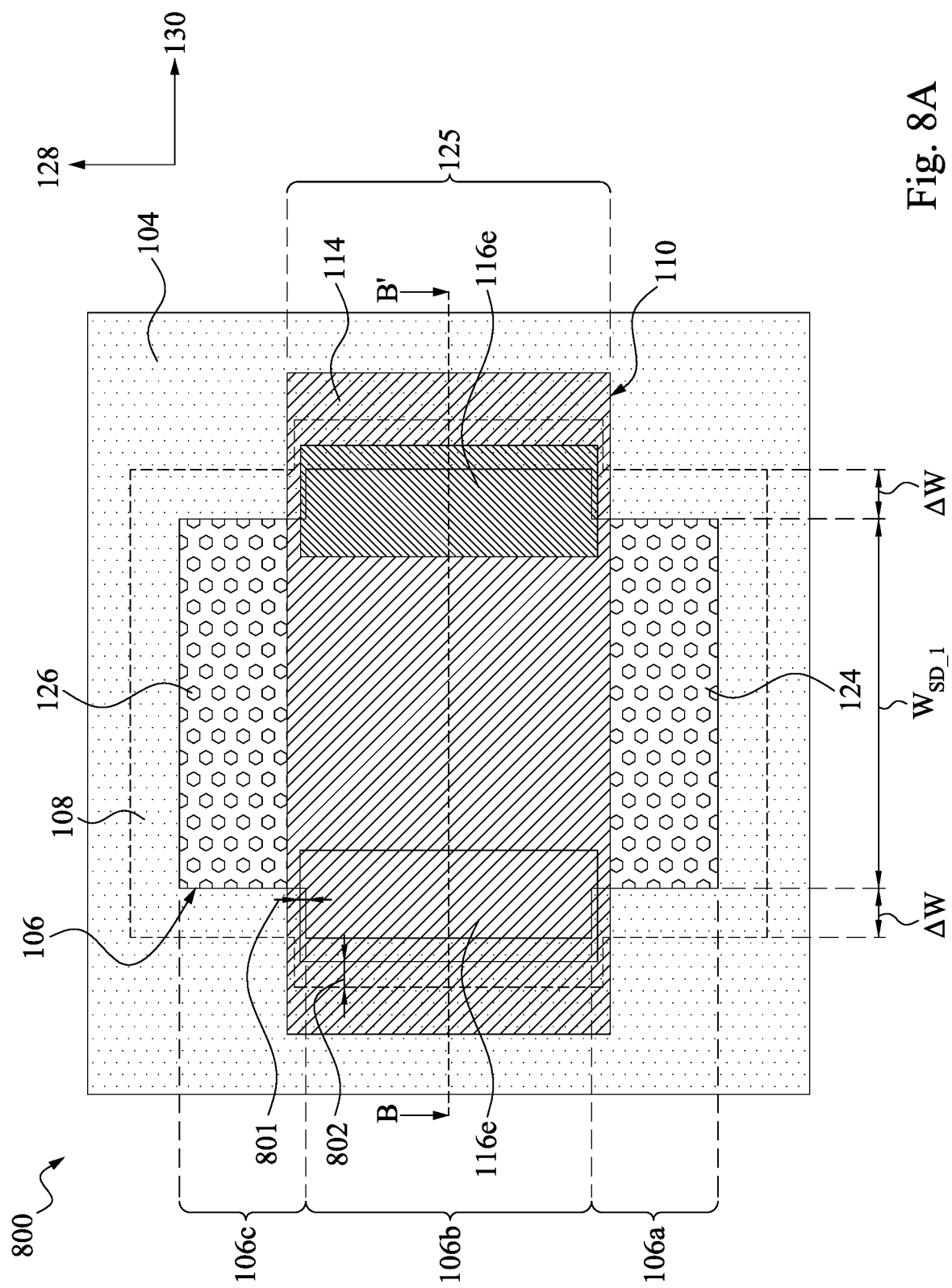
Figure 8B:
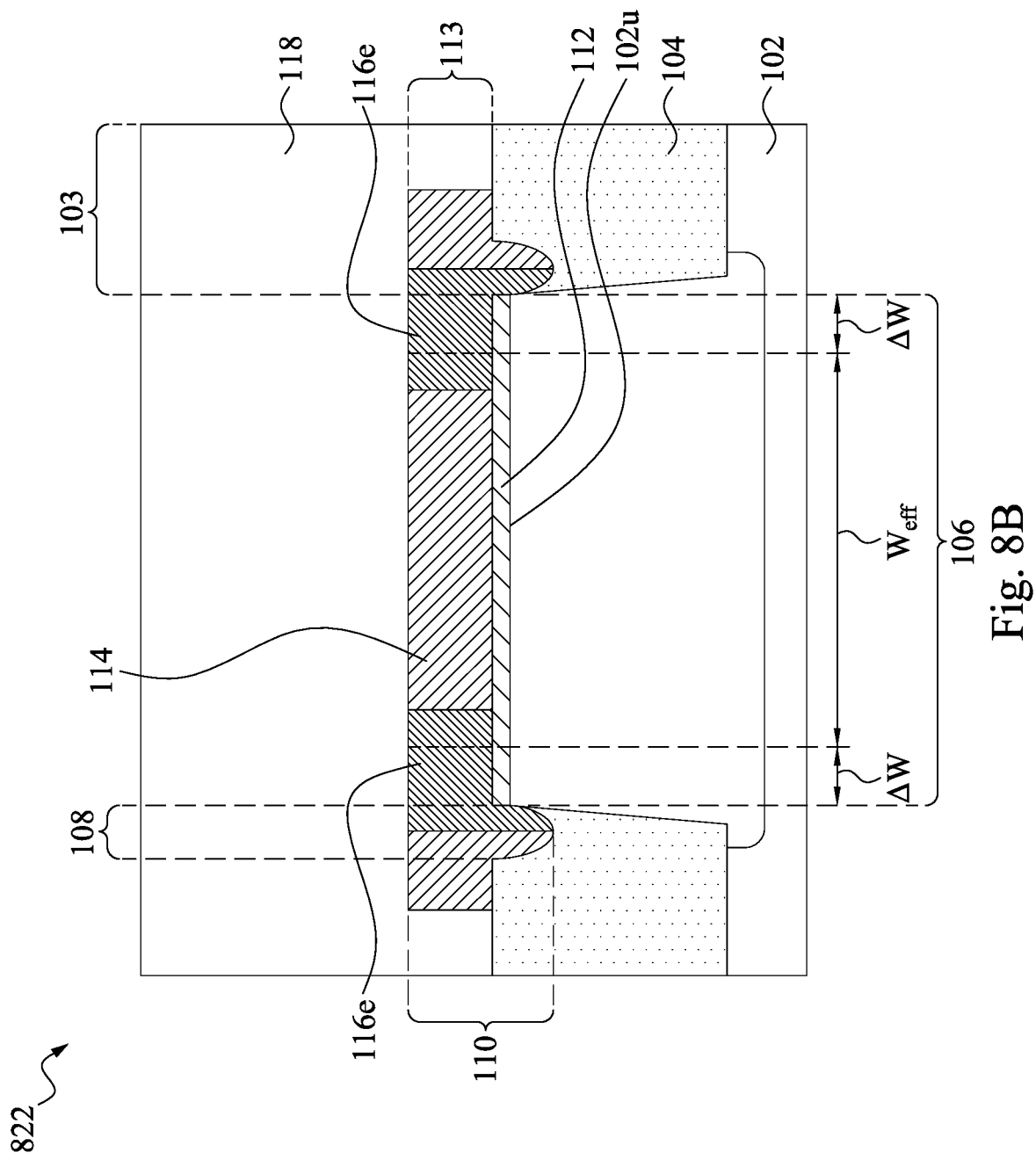

FIGS. 8A-8B illustrate a top view 800 and a cross-sectional view 822 showing some alternative embodiments of integrated chips having a transistor device comprising a gate structure configured to improved device performance. FIGS. 8A-8B illustrate substantially the same transistor device as FIGS. 1A-1B, except for the second gate electrode region 116e. As shown in top view 800 of FIG. 8A, the second gate electrode region 116e extends past opposing sides of the channel region 106b along the first direction 128 by a non-zero distance 801. Moreover, the second gate electrode region 116e extends past the boundary between the divot 108 and the channel region 106b along the second direction 130, but is set back from an outer edge of the divot 108 along the second direction 130 by a non-zero distance 802.

Figure 9A:
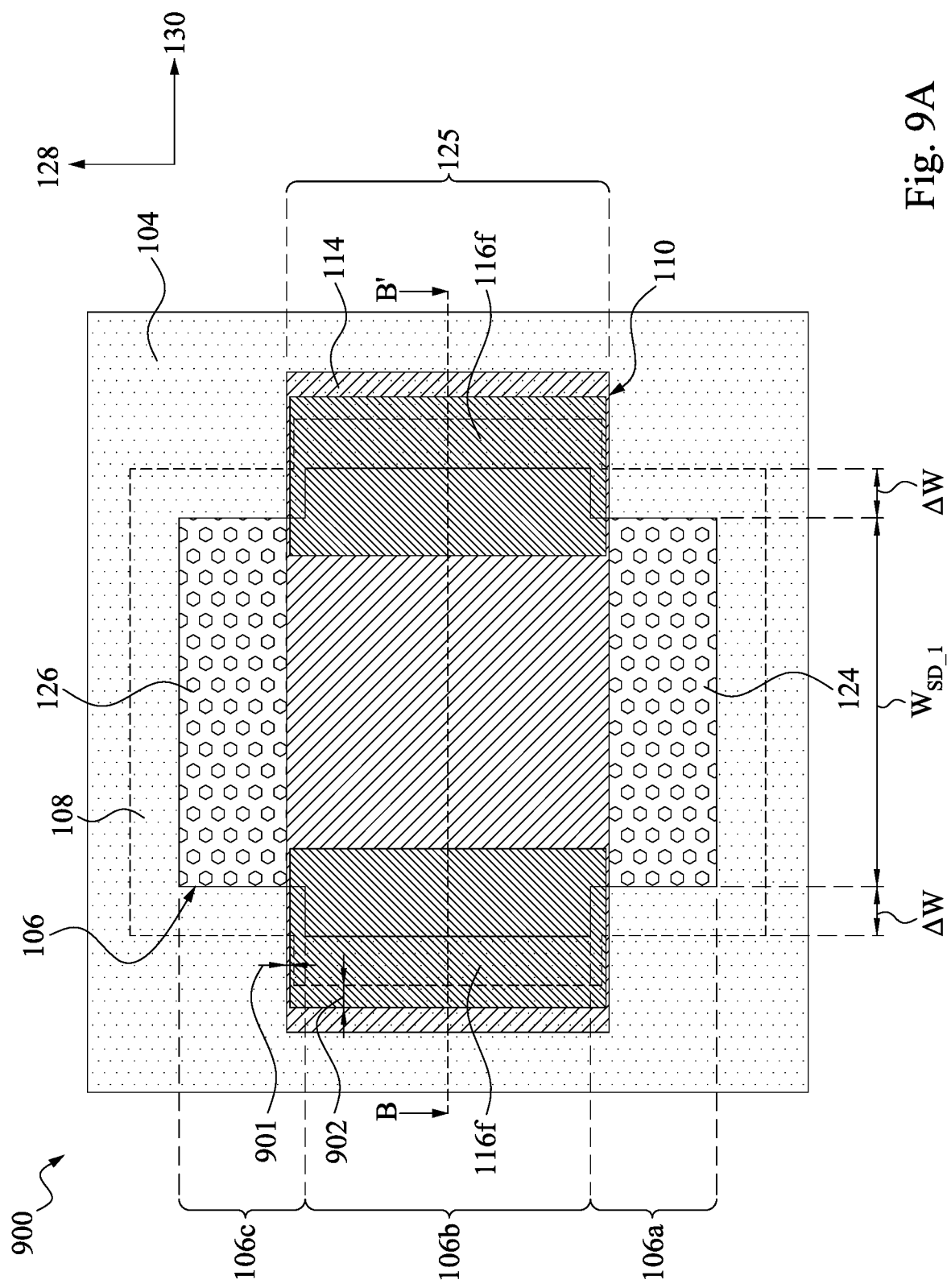
Figure 9B:
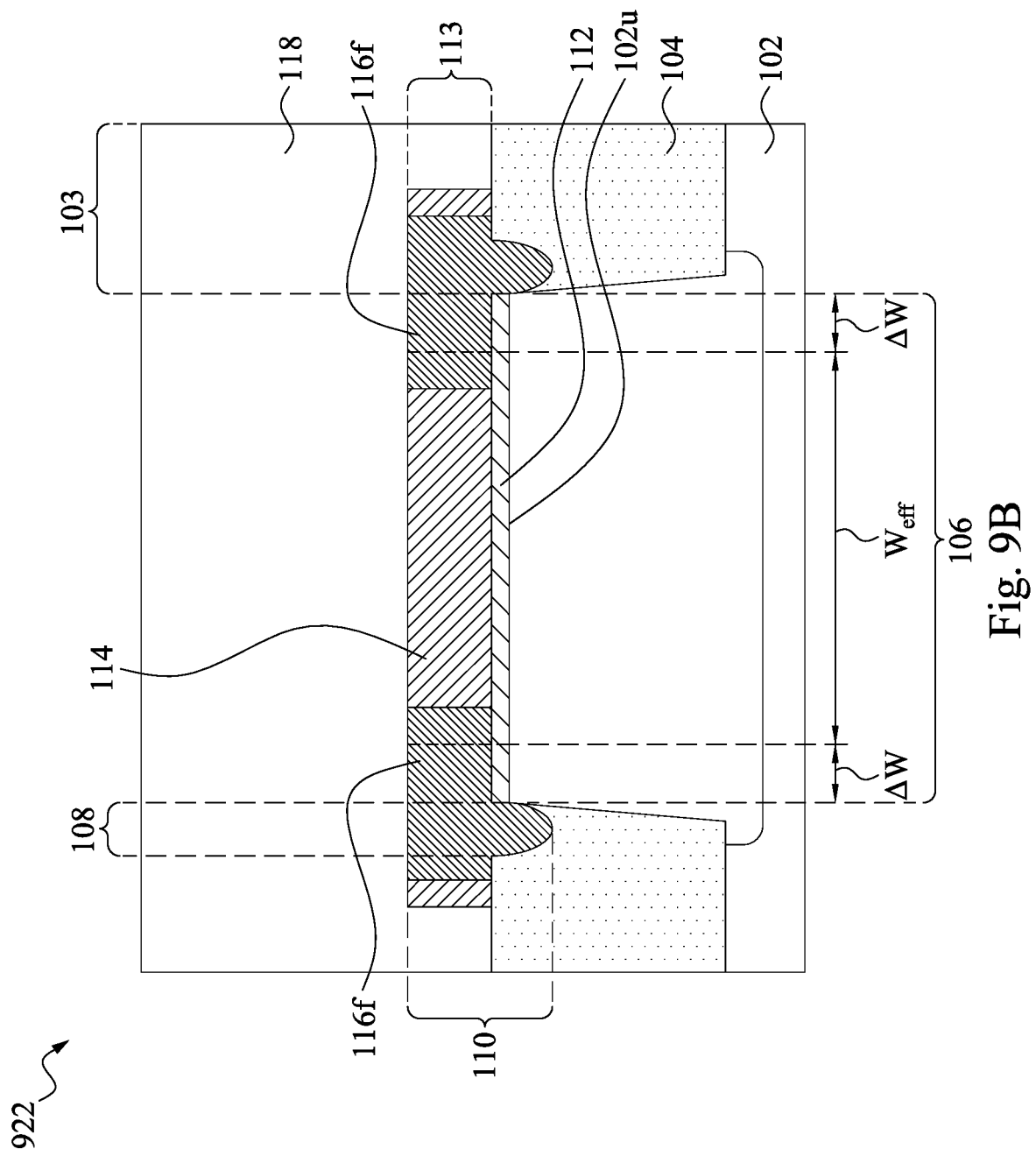

FIGS. 9A-9B illustrate a top view 900 and a cross-sectional view 922 showing some alternative embodiments of integrated chips having a transistor device comprising a gate structure configured to improved device performance. FIGS. 9A-9B illustrate substantially the same transistor device as FIGS. 1A-1B, except for the second gate electrode region 116f. As shown in top view 900 of FIG. 9A, the second gate electrode region 116f extends past an outer edge of the divot 108 along the first direction 128 by a non-zero distance 901. Moreover, the second gate electrode region 116e extends past an outer edge of the divot 108 along the second direction 130 by a non-zero distance 902.

FIGS. 10A-20 illustrate cross-sectional views and top views corresponding to some alternative embodiments of a method of forming an integrated chip having a transistor device comprising a gate structure configured to improved device performance. Moreover, the transistor device is within an active area having a shape configured to improved device performance. Although FIGS. 10A-20 are described with reference to a method, it will be appreciated that the structures shown in FIGS. 10A-20 are not limited to the method but rather may stand alone separate of the method.

Figure 10A:
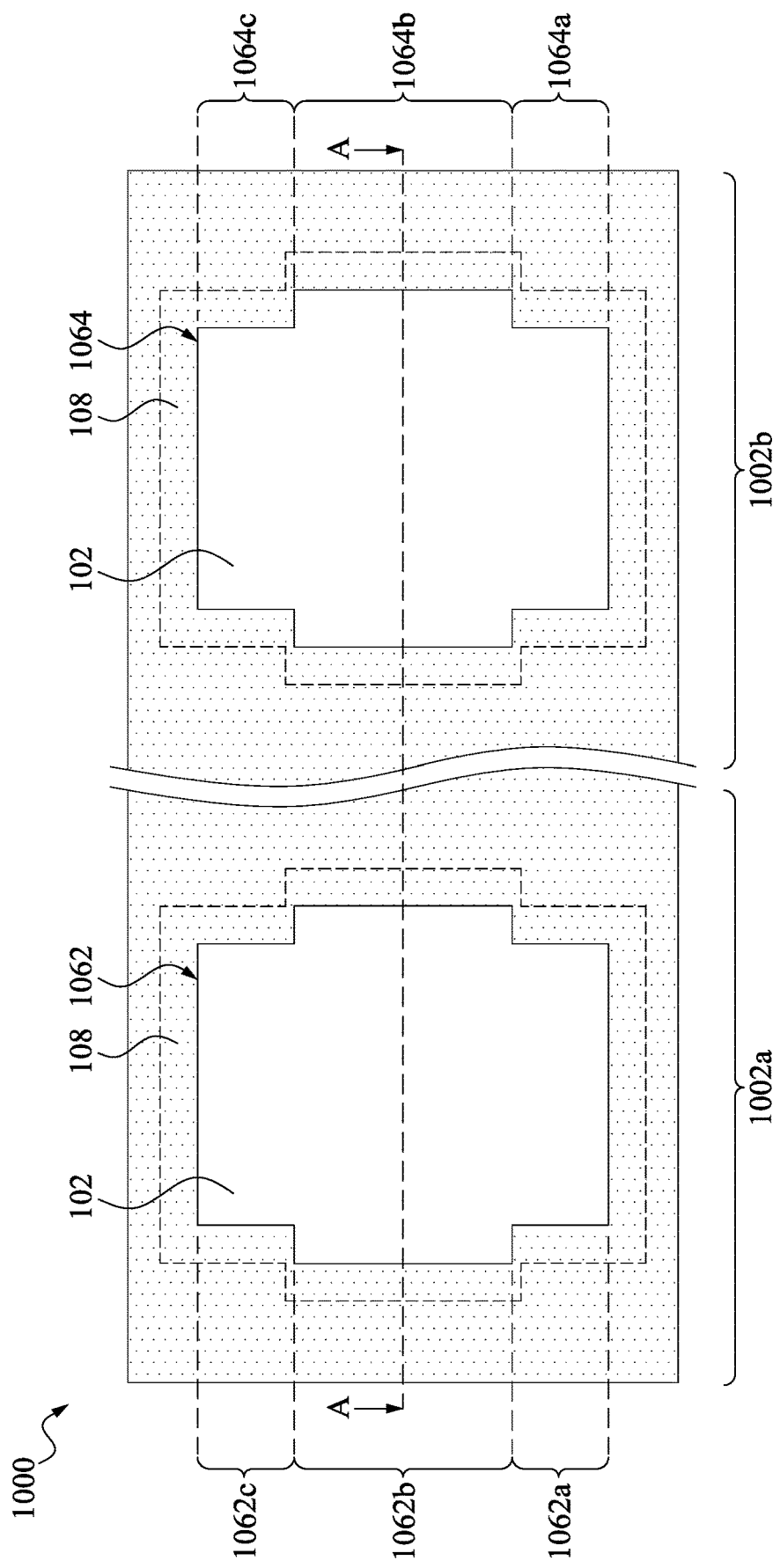
Figure 10B:
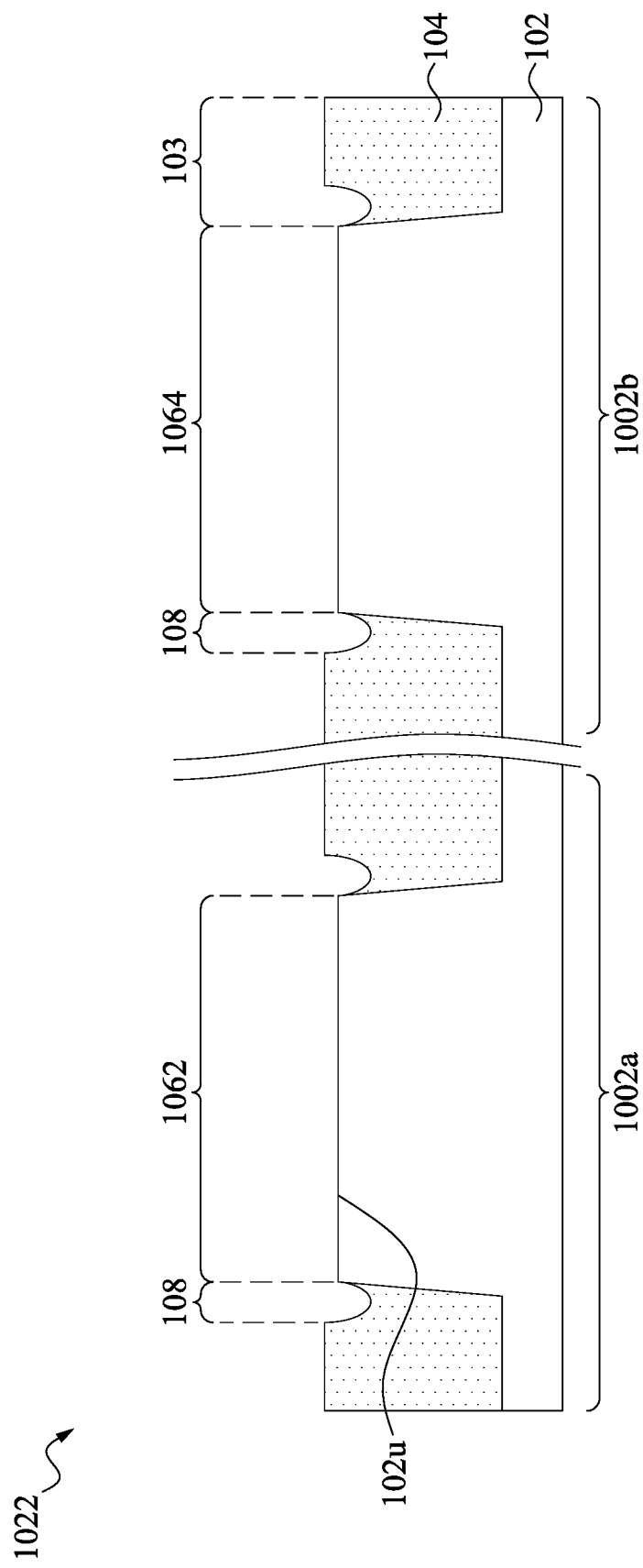

As shown in top view 1000 of FIG. 10A and cross-sectional view 1022 of FIG. 10B, an isolation structure 104 is formed within a trench 103 within a substrate 102. The isolation structure 104 defines a first active region 1062 within a first region 1002a corresponding to a first transistor type (e.g., an NMOS transistor) and a second active region 1064 within a second region 1002b corresponding to a second transistor type (e.g., a PMOS transistor). In some embodiments, the first region 1002a is equivalently referred to as an NMOS region, and the second region 1002b is equivalently referred to as a PMOS region. The first active region 1062 and the second active region 1064 expose upper surfaces 102u of the substrate 102. As shown in top view 1000 of FIG. 10A, the first active region 1062 has a source region 1062a, a drain region 1062c, and a channel region 1062b. The channel region 1062b is arranged between the source region 1062a and the drain region 1062c along a first direction 128. The source region 1062a and the drain region 1062c have smaller widths than the channel region 1062b along a second direction 130 that is perpendicular to the first direction 128. The second active region 1064 has a source region 1064a, a drain region 1064c, and a channel region 1064b. The channel region 1064b is arranged between the source region 1064a and the drain region 1064c along the first direction 128. The source region 1064a and the drain region 1064c have smaller widths than the channel region 1064b along the second direction. The isolation structure 104 is arranged within a trench 103 defined by interior surfaces of the substrate 102. During formation of the isolation structures 104, one or more divots 108 may be formed within the isolation structure 104 that are recessed below a top of the isolation structure 104. The one or more divots 108 may be arranged along edges of the isolation structure 104 that are proximate to the active regions 1062 and 1064.

In some embodiments, the isolation structure 104 may be formed by selectively etching the substrate 102 to form the trench 103. One or more dielectric materials are subsequently formed within the trench 103. In various embodiments, the substrate 102 may be selectively etched by a wet etchant (e.g., hydrofluoric acid, potassium hydroxide, or the like) or a dry etchant (e.g., having an etching chemistry comprising fluorine, chlorine, or the like). In various embodiments, the substrate 102 may be any type of semiconductor body (e.g., silicon, SiGe, SOI, etc.), as well as any other type of semiconductor, epitaxial, dielectric, or metal layers, associated therewith. In various embodiments, the one or more dielectric materials may comprise an oxide, a nitride, a carbide, or the like.

In some additional embodiments, the isolation structure 104 may be formed by using a thermal process to form a pad oxide over the substrate 102, followed by the formation of a nitride film over the pad oxide. The nitride film is subsequently patterned (e.g., using a photosensitive material, such as photoresist), and the pad oxide and substrate 102 are patterned according to the nitride film to form the trench 103 within the substrate 102. The trench 103 is then filled with one or more dielectric materials, followed by a planarization process (e.g., a chemical mechanical planarization (CMP) process) to expose a top of the nitride film and an etch process to remove the nitride film.

Figure 11A:
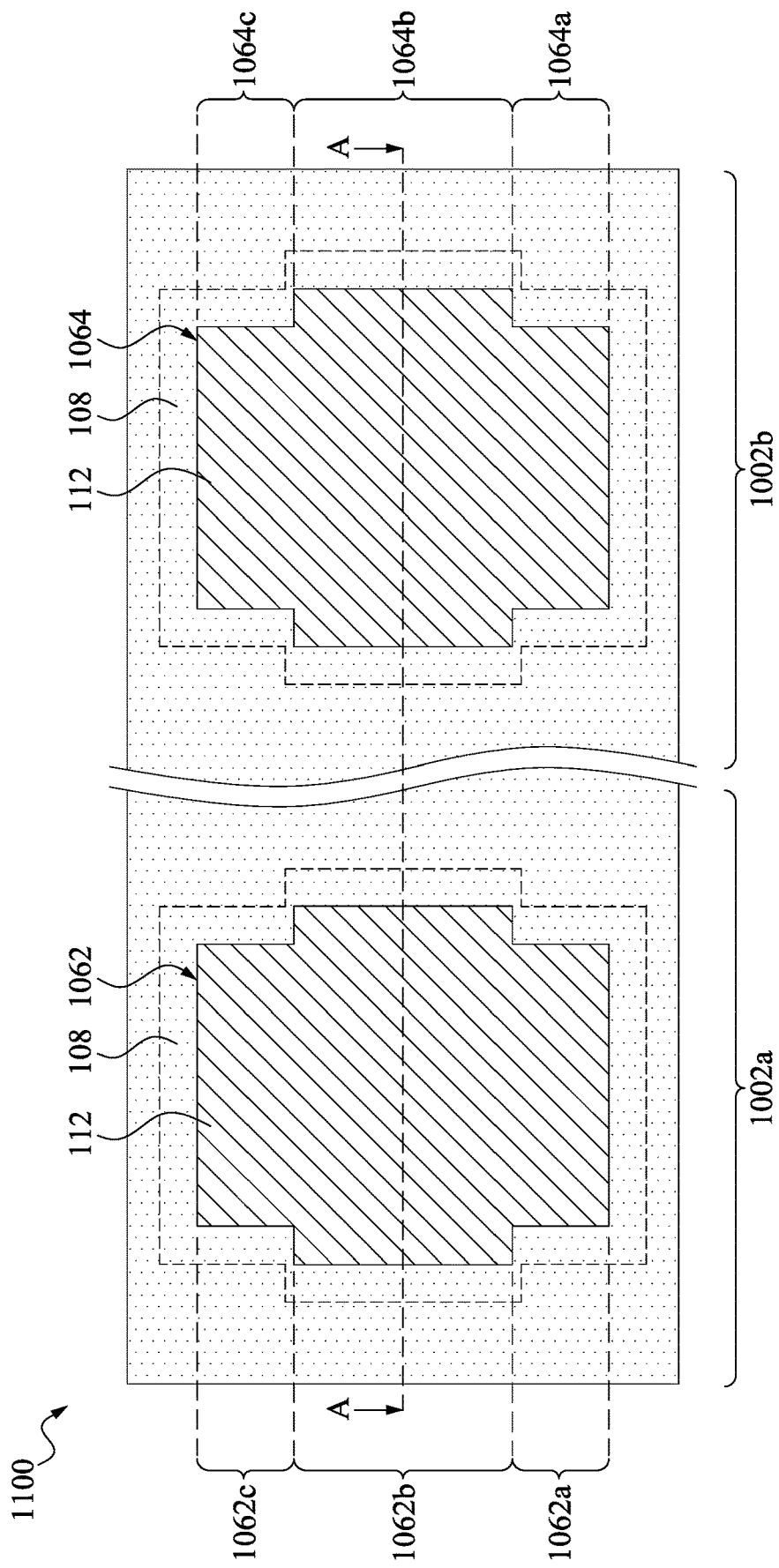
Figure 11B:
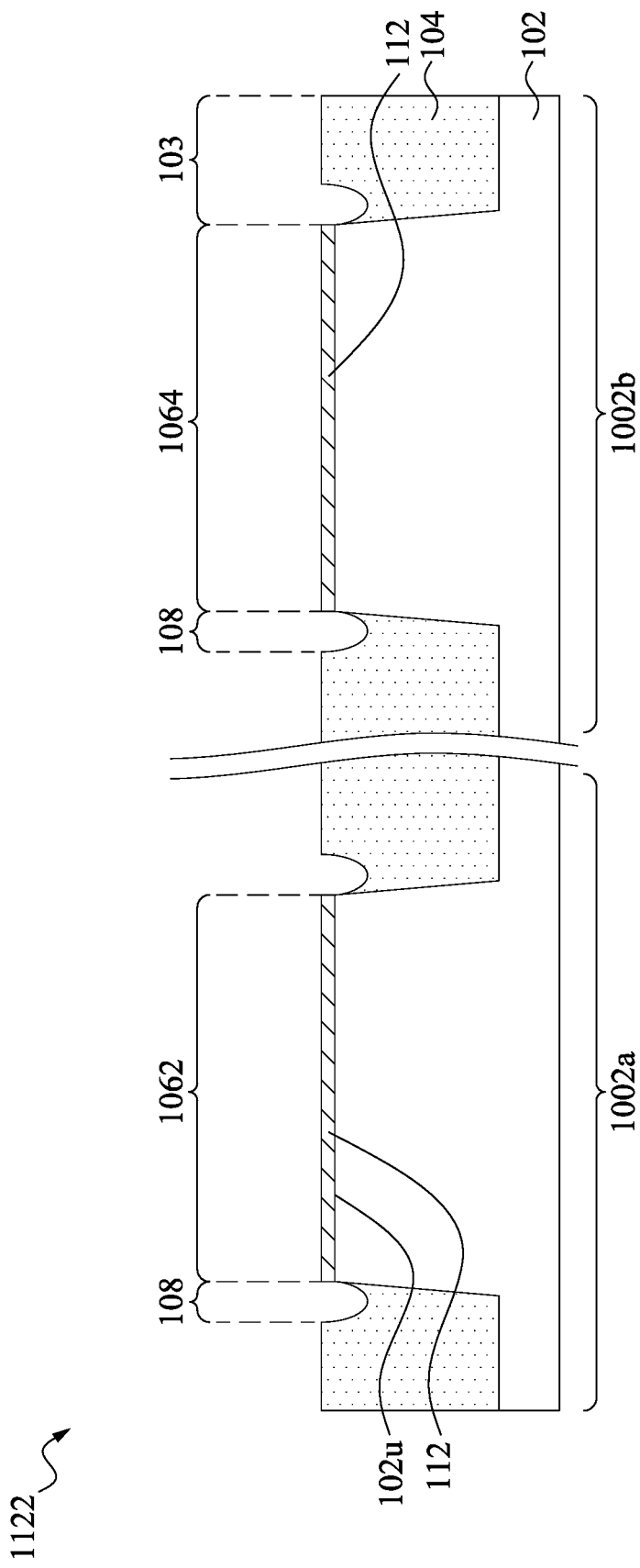

As shown in top view 1100 of FIG. 11A and cross-sectional view 1122 of FIG. 11B, a gate dielectric 112 is formed over the substrate 102 and within the first active region 1062 and the second active region 1064. In some embodiments, the gate dielectric 112 may comprise an oxide (e.g., silicon oxide), a nitride (e.g., silicon oxy-nitride), a high κ gate dielectric layer (dielectric constant κ greater than about 3.9), some other suitable dielectric(s), the like, or combinations thereof. In some embodiments, the gate dielectric 112 may be formed by way of a vapor deposition technique (e.g., PVD, CVD, PE-CVD, ALD, etc.). In other embodiments, the gate dielectric 112 may be formed by way of a thermal growth process. In some embodiments, an implantation process may be performed prior to the formation of the gate dielectric 112 to form a well region (not shown) in the substrate 102. In some such embodiments, a sacrificial dielectric layer (not shown) may be formed over the substrate 102 prior to the implantation process to regulate a depth of the well region. The sacrificial dielectric layer is subsequently removed prior to the formation of the gate dielectric.

In some embodiments, the gate dielectric 112 may be formed as part of a multiple gate dielectric process, in which different gate dielectric layers are formed within different regions of the substrate 102. For example, in some embodiments, the multiple gate dielectric process may form a high voltage gate dielectric layer (e.g., by a thermal process) over a high voltage well within the substrate 102. The high voltage gate dielectric layer may be subsequently removed from one or more regions of a chip (e.g., within an embedded memory region), and a dual-gate dielectric layer may be formed over a logic well within the substrate 102 (e.g., by one or more deposition processes). It has been appreciated that the formation of multiple gate dielectric layers may increase a size of the one or more divots 108 within the isolation structures 104 due to the additional etch processes that are performed to remove the gate dielectric layers from different regions of the substrate, thereby aggravating the kink effect within associated transistor devices.

Figure 12A:
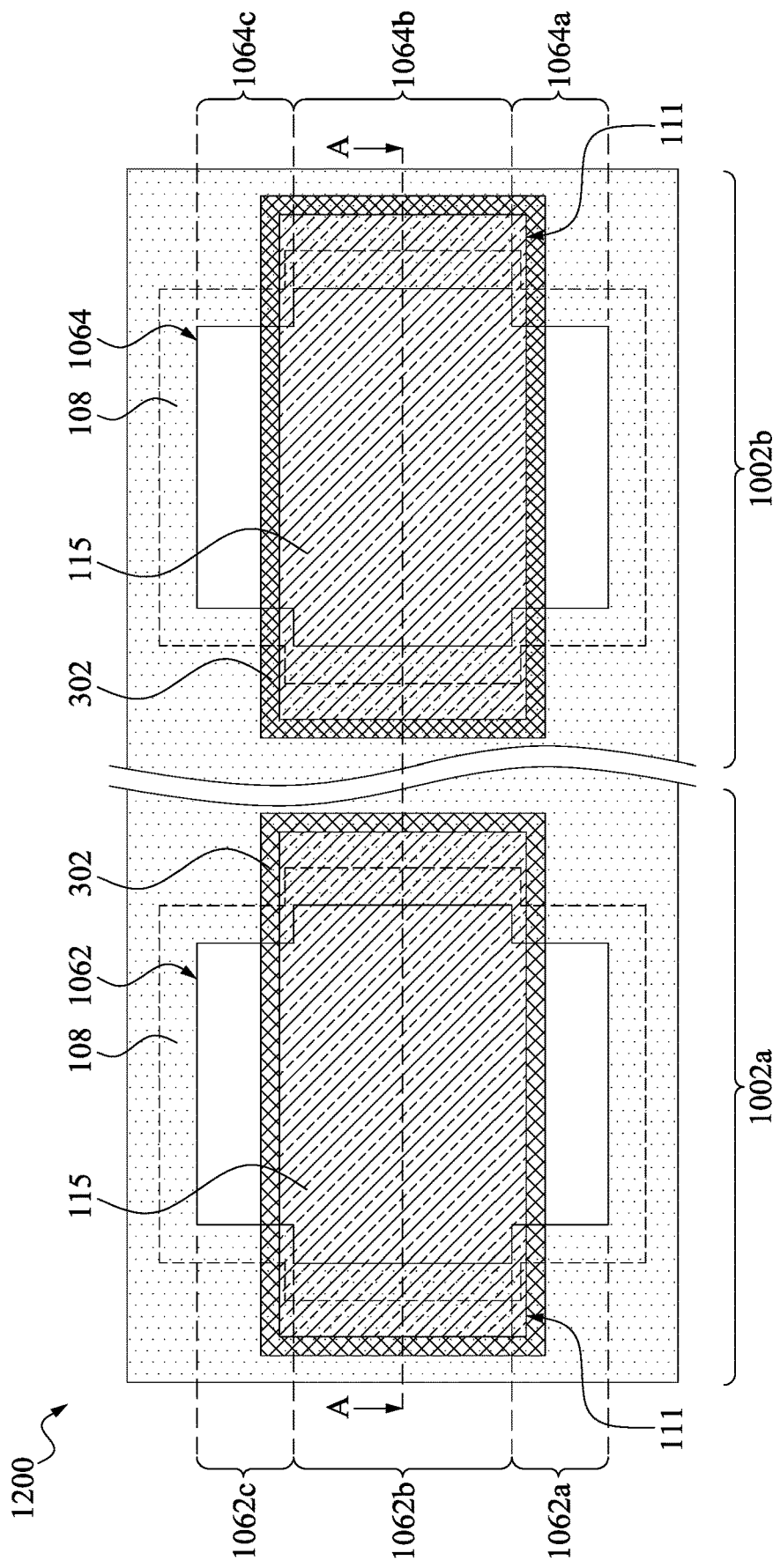
Figure 12B:
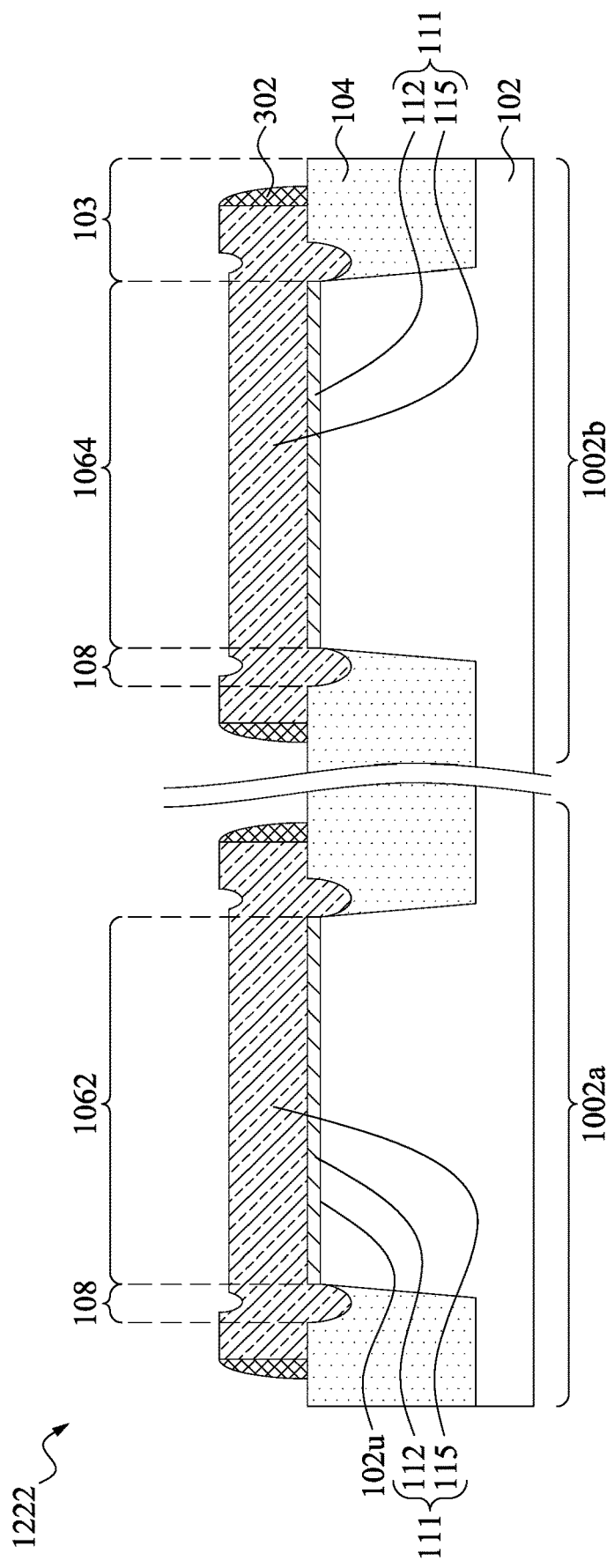

As shown in top view 1200 of FIG. 12A and cross-sectional view 1222 of FIG. 12B, a sacrificial gate material 115 is formed over the gate dielectric 112 and within the divots 108 in the isolation structure 104. The sacrificial gate material 115 may be formed by way of a deposition process (e.g., CVD, PE-CVD, PVD, or ALD). In some embodiments, the sacrificial gate material 115 may comprise doped polysilicon or undoped polysilicon. In some embodiments (not shown), the sacrificial gate material 115 may comprise a material that is subsequently replaced with a metal gate material, such as aluminum, cobalt, ruthenium, or the like. The gate dielectric 112 and the sacrificial gate material 115 are patterned to define sacrificial gate structures 111 extending over the first active region 1062 and the second active region 1064 and over the isolation structure 104. The sacrificial gate structures 111 may fill the one or more divots 108 within the upper surface of the isolation structure 104. In some embodiments, sidewall spacers 302 may be formed along sides of the sacrificial gate structures 111.

The gate dielectric 112 and the sacrificial gate material 115 may be selectively patterned according to a masking layer (not shown) formed over the sacrificial gate material 115. In some embodiments, the masking layer may comprise a photosensitive material (e.g., photoresist) formed by a spin coating process. In such embodiments, the layer of photosensitive material is selectively exposed to electromagnetic radiation according to a photomask. The electromagnetic radiation modifies a solubility of exposed regions within the photosensitive material to define soluble regions. The photosensitive material is subsequently developed to define openings within the photosensitive material by removing the soluble regions. In other embodiments, the masking layer may comprise a hard mask layer (e.g., a silicon nitride layer, a silicon carbide layer, or the like).

In some embodiments, one or more sidewall spacers 302 are formed on opposing sides of the sacrificial gate structures 111. In some embodiments, the one or more sidewall spacers 302 may be formed by depositing a spacer material (e.g., a nitride, an oxide, or a combination thereof) onto horizontal and vertical surfaces of the sacrificial gate structures 111, and subsequently etching the spacer material to remove the spacer material from the horizontal surfaces to form the one or more sidewall spacers 302.

Figure 13A:
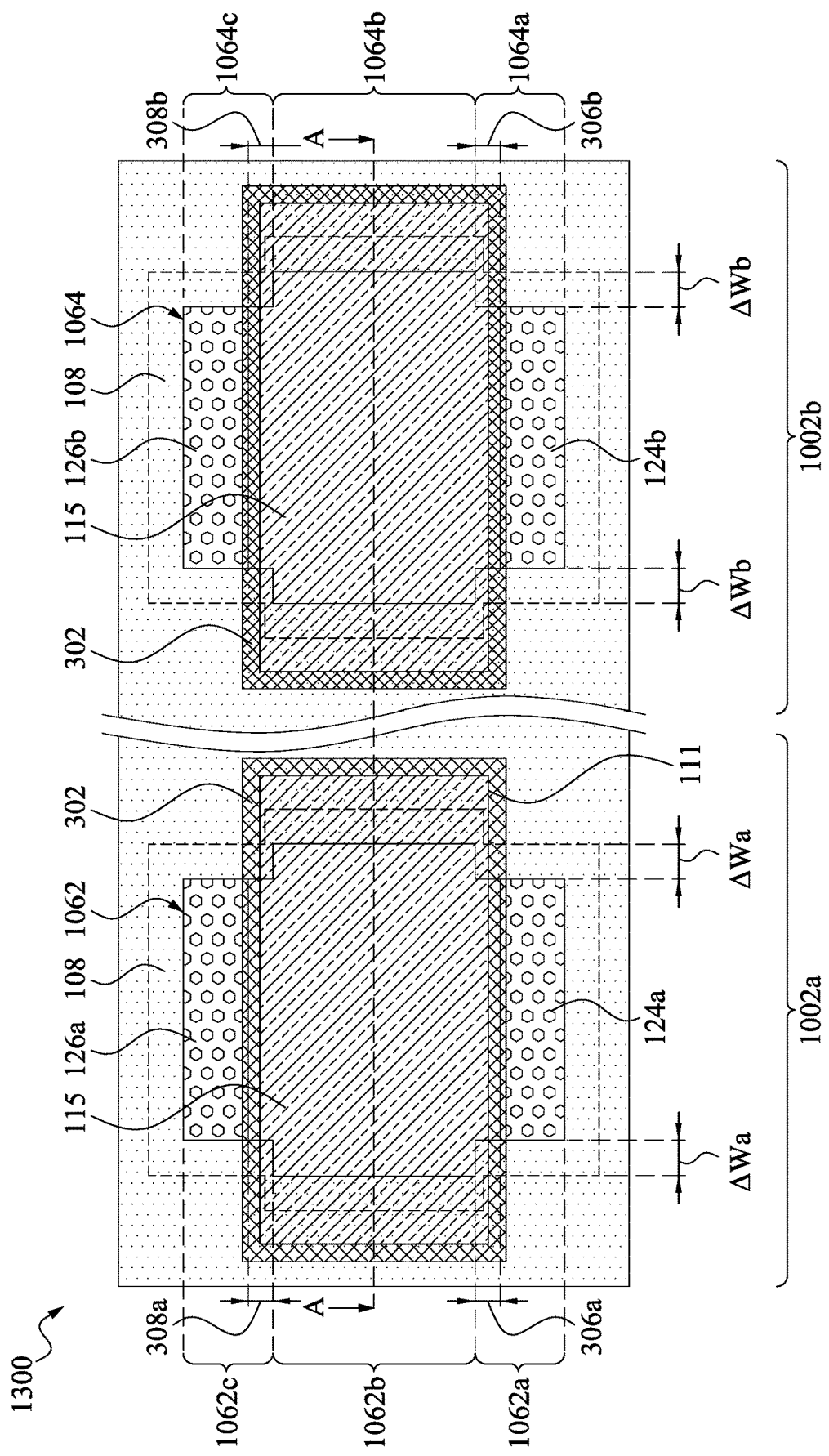
Figure 13B:
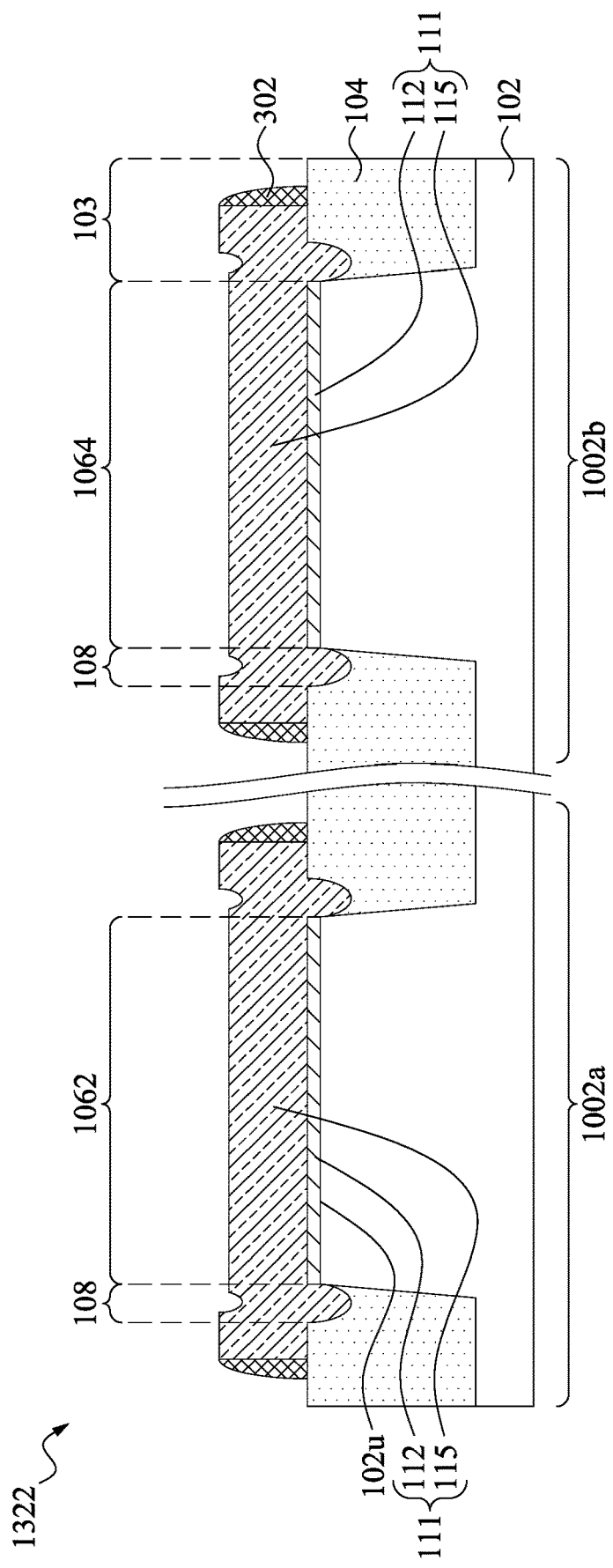

As shown in top view 1300 of FIG. 13A and cross-sectional views 1322 of FIG. 13B, a first doped region 124a, and a second doped region 126a are formed within the substrate 102 on opposing sides of the sacrificial gate material 115 within the first active region 1062. A first doped region 124b and a second doped region 126b are formed within the substrate 102 on opposing sides of the sacrificial gate material 115 within the second active region 1064. In some embodiments, the first doped region 124a and the second doped region 126a may be formed by a first implantation process, while the first doped region 124b and the second doped region 126b may be formed by a second implantation process. For example, the first implantation process may be performed by selectively implanting a first dopant species (e.g., comprising an n-type dopant, such as phosphorus, arsenic, etc.) into the substrate 102 according to a first mask covering the second region 1002b. Similarly, the second implantation process may be performed by selectively implanting a second dopant species (e.g., comprising a p-type dopant, such as boron, gallium, etc.) into the substrate 102 according to a second mask covering the first region 1002a.

In some embodiments, the first doped region 124a is set back from a boundary between the source region 1062a and the channel region 1062b by a non-zero distance 306a and the second doped region 126a is set back from a boundary between the drain region 1062c and the channel region 1062b by a non-zero distance 308a. By setting the first doped region 124a and the second doped region 126a back from the channel region 1062b (along the first direction 128), the first doped region 124a and the second doped region 126a have widths that are less than a width of the channel region 1062b. The smaller widths of the first doped region 124a and the second doped region 126a cause the first doped region 124a and the second doped region 126a to also be set back from sidewalls of the isolation structure 104 defining the channel region 1062b by a non-zero distance ΔWa along the second direction 130 that is substantially perpendicular to the first direction 128. Setting the first doped region 124a and the second doped region 126a back from sidewalls of the isolation structure 104 separates an effective channel region (between the first doped region 124a and the second doped region 126a) from the one or more divots 108 within the isolation structure 104, and thereby decreases an effect the one or more divots 108 have on an electric field generated by a gate structure within the effective channel region.

Similarly, the first doped region 124b is set back from a boundary between the source region 1064a and the channel region 1064b by a non-zero distance 306b and the second doped region 126b is set back from a boundary between the drain region 1064c and the channel region 1064b by a non-zero distance 308b. By setting the first doped region 124b and the second doped region 126b back from the channel region 1064b (along the first direction 128), the first doped region 124b and the second doped region 126b have widths that are less than a width of the channel region 1064b. The smaller widths of the first doped region 124b and the second doped region 126b cause the first doped region 124b and the second doped region 126b to also be set back from sidewalls of the isolation structure 104 defining the channel region 1064b by a non-zero distance ΔWb along the second direction 130 that is substantially perpendicular to the first direction 128. Setting the first doped region 124b and the second doped region 126b back from sidewalls of the isolation structure 104 separates an effective channel region (between the first doped region 124b and the second doped region 126b) from the one or more divots 108 within the isolation structure 104, and thereby decreases an effect the one or more divots 108 have on an electric field generated by a gate structure within the effective channel region.

Figure 14:
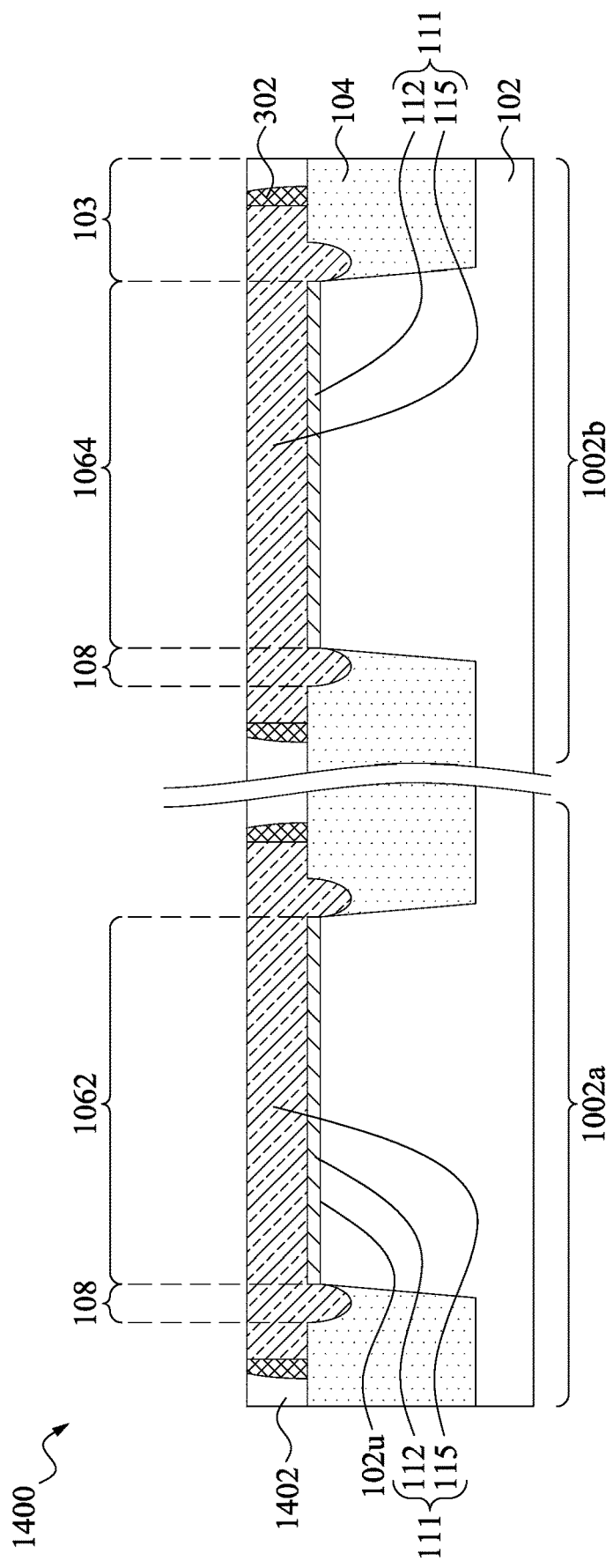

As shown in cross-sectional view 1400 of FIG. 14, a first dielectric layer 1402 (e.g., a first inter-level dielectric (ILD) layer) is formed over the substrate 102. The first dielectric layer 1402 covers the sacrificial gate material 115 and the sidewall spacers 302. A planarization process is performed to remove the first dielectric layer 1402 from over the sacrificial gate material 115 and the sidewall spacers 302. In various embodiments, the first dielectric layer 1402 may include an oxide, PSG, a low k dielectric, or some other dielectric, and may be formed by vapor deposition process (e.g., CVD, PVD, or ALD).

Figure 15:
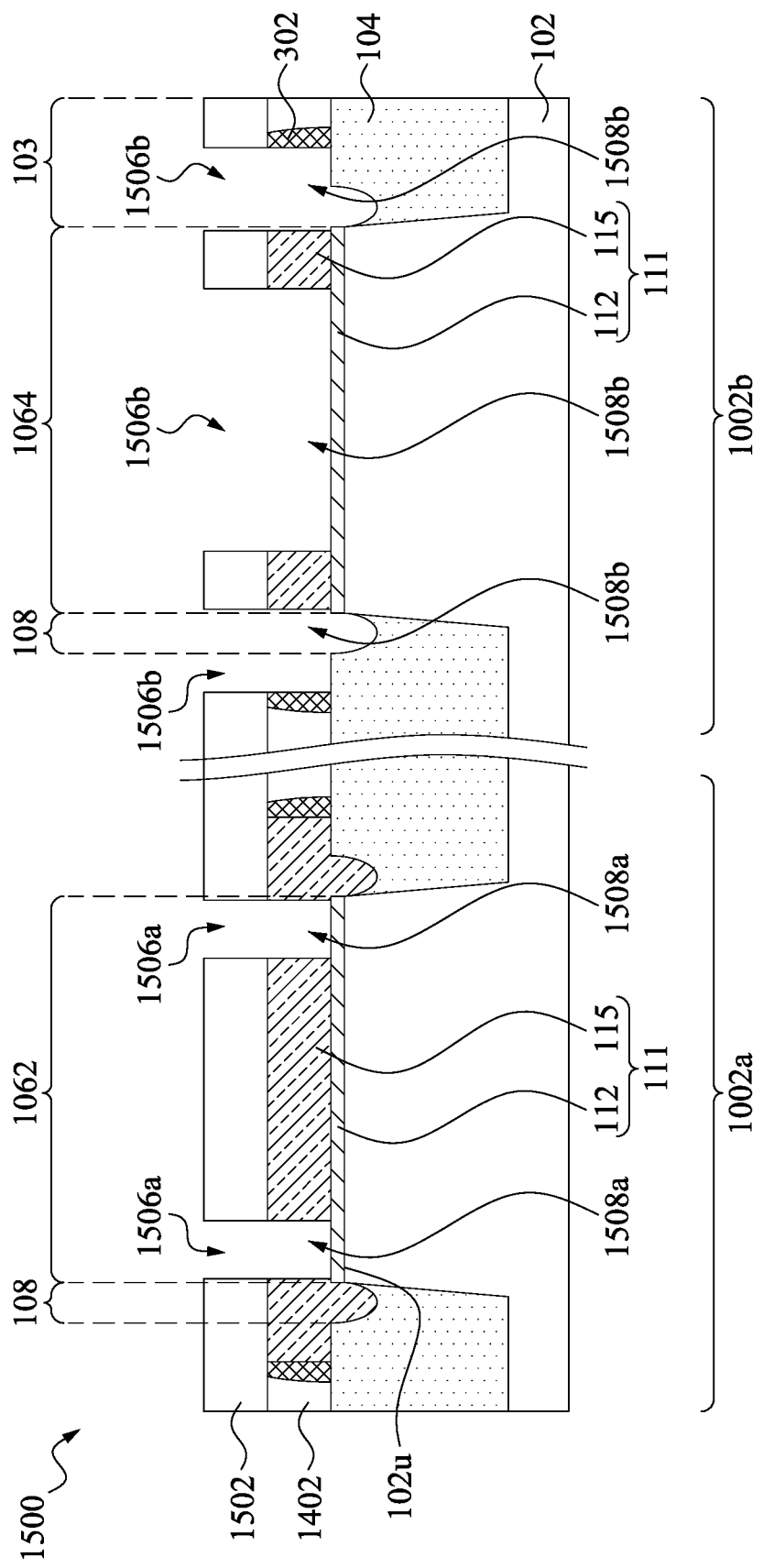

As shown in cross-sectional view 1500 of FIG. 15, a photosensitive material 1502 is formed over the sacrificial gate material 115. In some embodiments, the photosensitive material 1502 may include a positive photoresist or a negative photoresist formed over the substrate 102 by way of a spin-coating process. The photosensitive material 1502 is selectively exposed to electromagnetic radiation according to a photomask. The electromagnetic radiation modifies a solubility of exposed regions within the photosensitive material 1502 to define soluble regions. The photosensitive material 1502 is subsequently developed to define first and second openings 1506a and 1506b within the photosensitive material 1502 by removing the soluble regions, wherein the first openings 1506a are within the first region 1002a and the second openings 1506b are within the second region 1002b. Thereafter, parts of the sacrificial gate material 115 that underlie the openings 1506a and 1506b within the patterned photosensitive material 1502 are selectively removed. The parts of the sacrificial gate material 115 may be removed by selectively exposing the sacrificial gate material 115 to an etchant according to the photosensitive material 1502. Removal of the parts of the sacrificial gate material 115 results in one or more first and second openings 1508a and 1508b extending through the sacrificial gate material 115 to the gate dielectric 112 and the isolation structure 104, wherein the first openings 1508a are within the first region 1002a and the second openings 1508b are within the second region 1002b. The one or more second openings 1508b are over the one or more divots 108. In various embodiments, the etchant used for etching the sacrificial gate material 115 may comprise a dry etchant having an etching chemistry comprising a fluorine species (e.g., $CF_4$, $CHF_3$, $C_4F_8$, etc.) or a wet etchant comprising hydrofluoric acid (HF).

Figure 16:
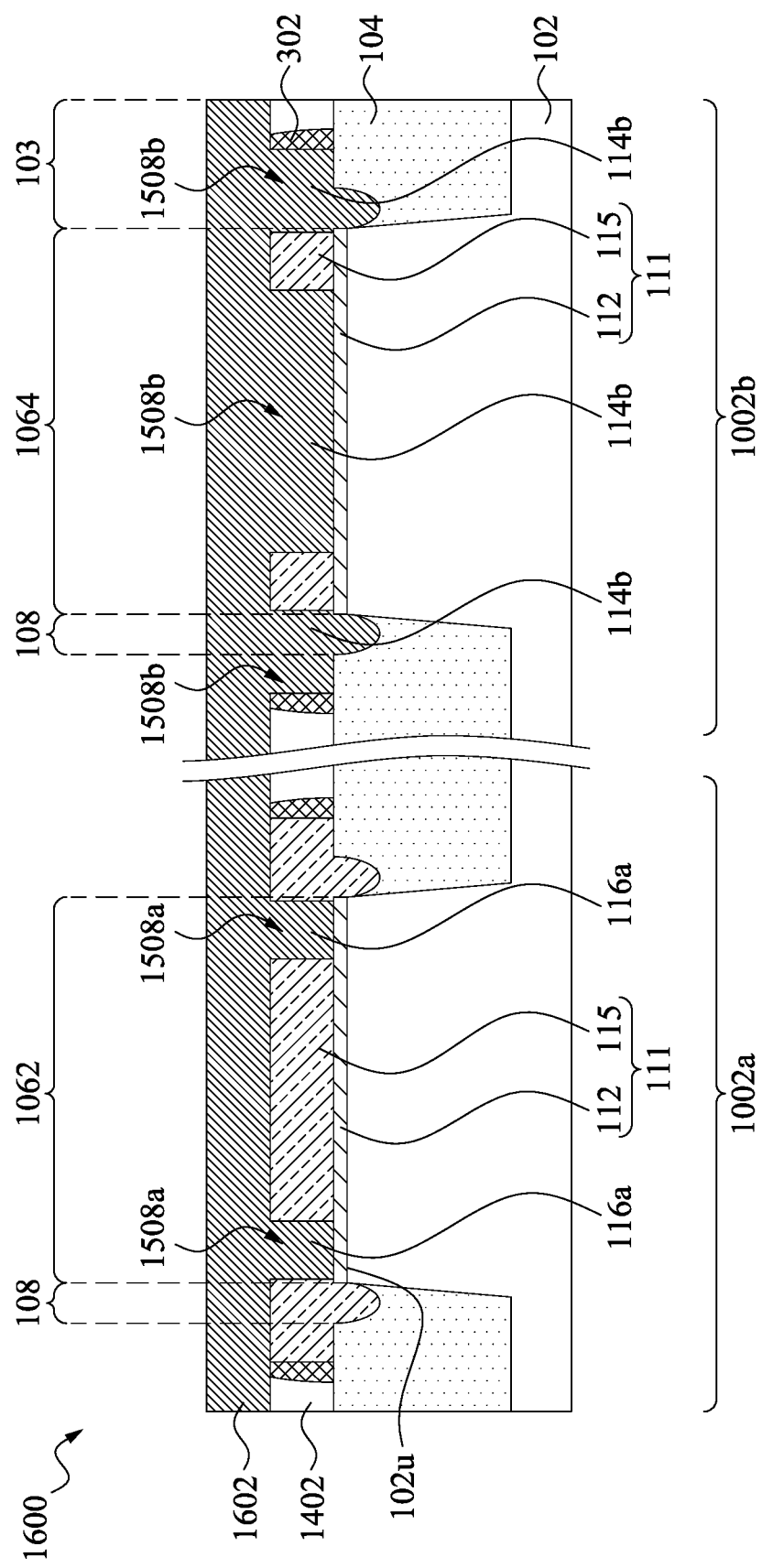

As shown in cross-sectional view 1600 of FIG. 16, a second composition of one or more materials (e.g., second metal stack 1602 including p-type gate metal) is formed within the one or more openings 1508a and 1508b to form a second gate electrode region 116a within the NMOS region 1002a and form a first gate electrode region 114b within the PMOS region 1002b. The second metal stack 1602 laterally contacts the sacrificial gate material 115. In some embodiments, the second metal stack 1602 may completely fill the one or more the openings 1508a and 1508b. In various embodiments, the second metal stack 1602 includes a p-type gate metal such as nickel, cobalt, molybdenum, platinum, lead, gold, tantalum nitride, molybdenum silicide, ruthenium, chromium, tungsten, copper, or the like. In various embodiments, the p-type gate metal 1602 may be formed by way of a vapor deposition technique (e.g., PVD, CVD, PE-CVD, ALD, etc.).

Figure 17:
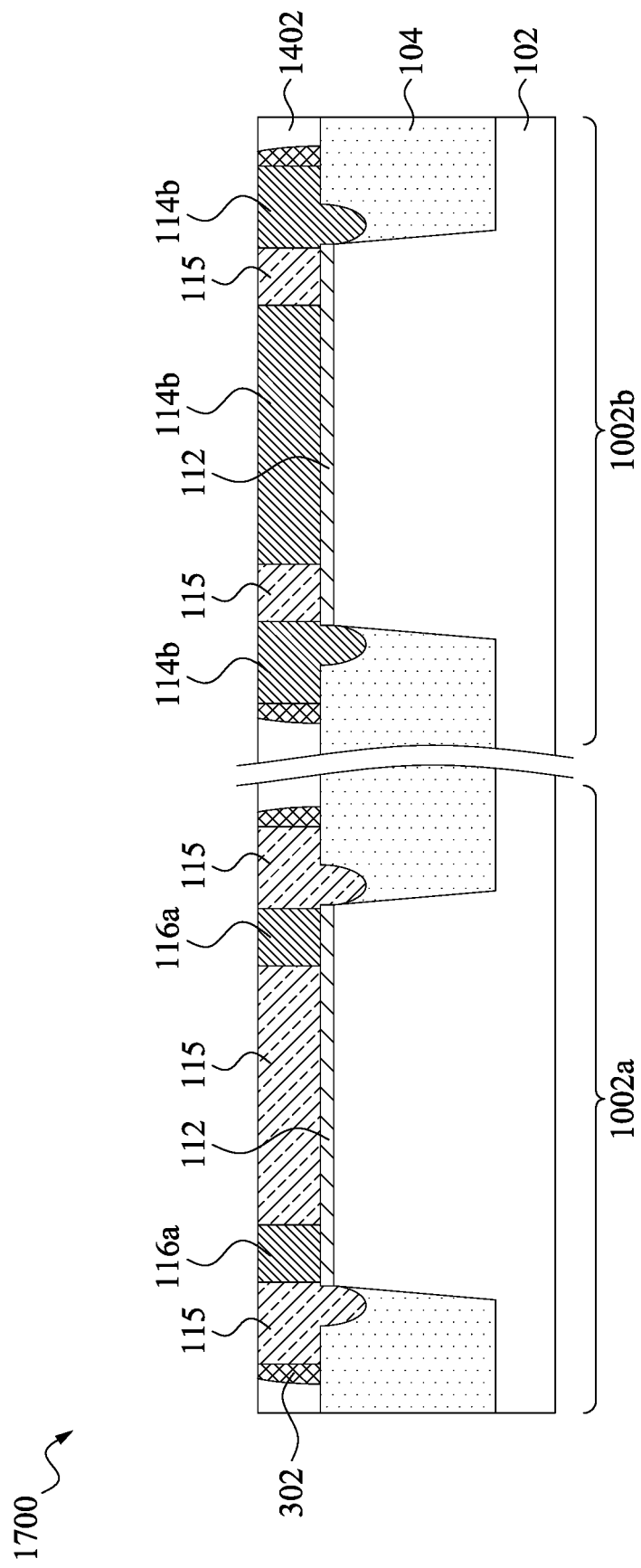

As shown in cross-sectional view 1700 of FIG. 17, a planarization process is performed on the second metal stack 1602 until reaching the sacrificial gate material 115. In this way, the remaining sacrificial gate material 115 can be exposed. In some embodiments, the planarization process is a chemical mechanical planarization (CMP) process.

Figure 18:
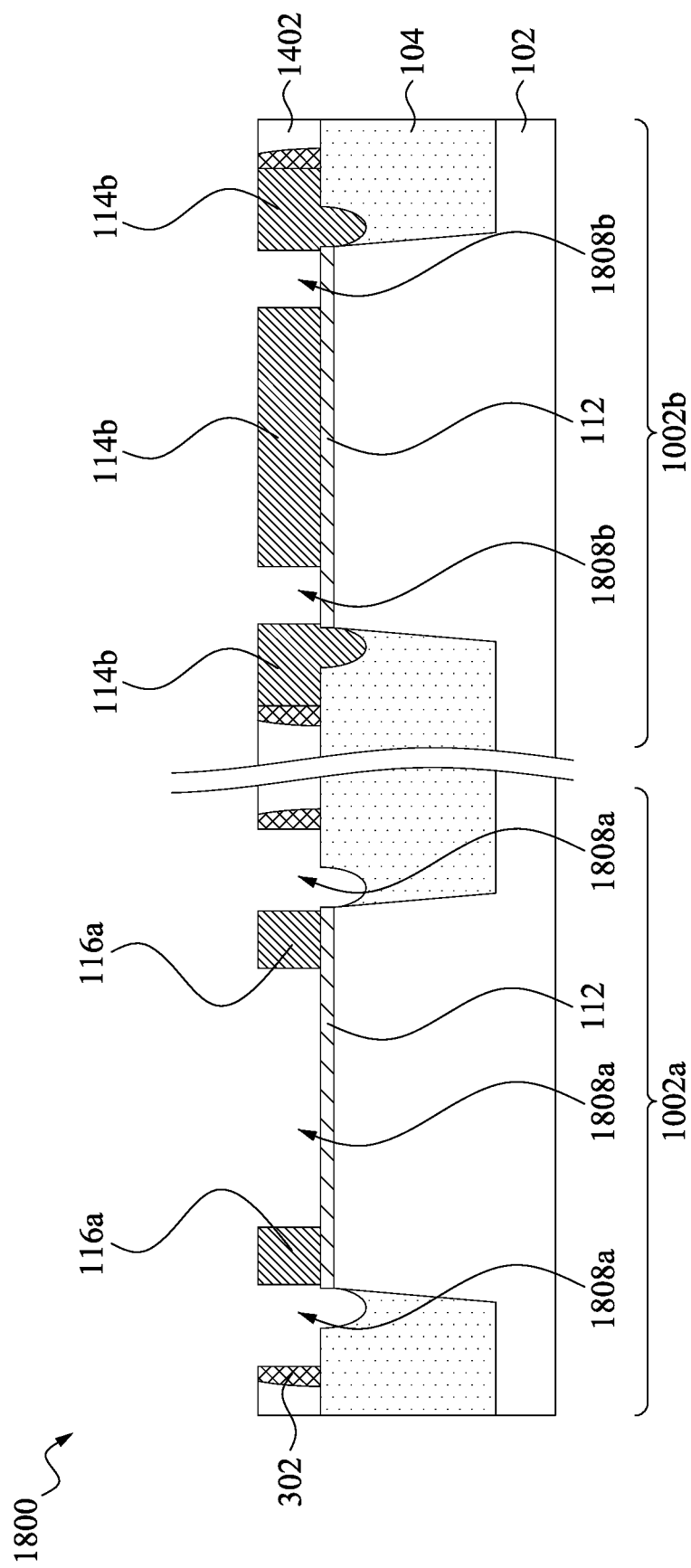

As shown in cross-sectional view 1800 of FIG. 18, the remaining sacrificial gate material 115 is removed by selective etching. Removal of the parts of the sacrificial gate material 115 results in one or more first openings 1808a within the NMOS region 1002a and one or more second openings 1808b within the PMOS region 1002b. The second gate electrode regions 116a within the NMOS region 1002a are separated by the first openings 1808a, and the first gate electrode region 114b within the PMOS region 1002b are separated by the second openings 1808b. The one or more first openings 1808a are over the one or more divots 108. In various embodiments, the etchant used for etching the sacrificial gate material 115 may comprise a dry etchant having an etching chemistry comprising a fluorine species (e.g., $CF_4$, $CHF_3$, $C_4F_8$, etc.) or a wet etchant comprising hydrofluoric acid (HF).

Figure 19:
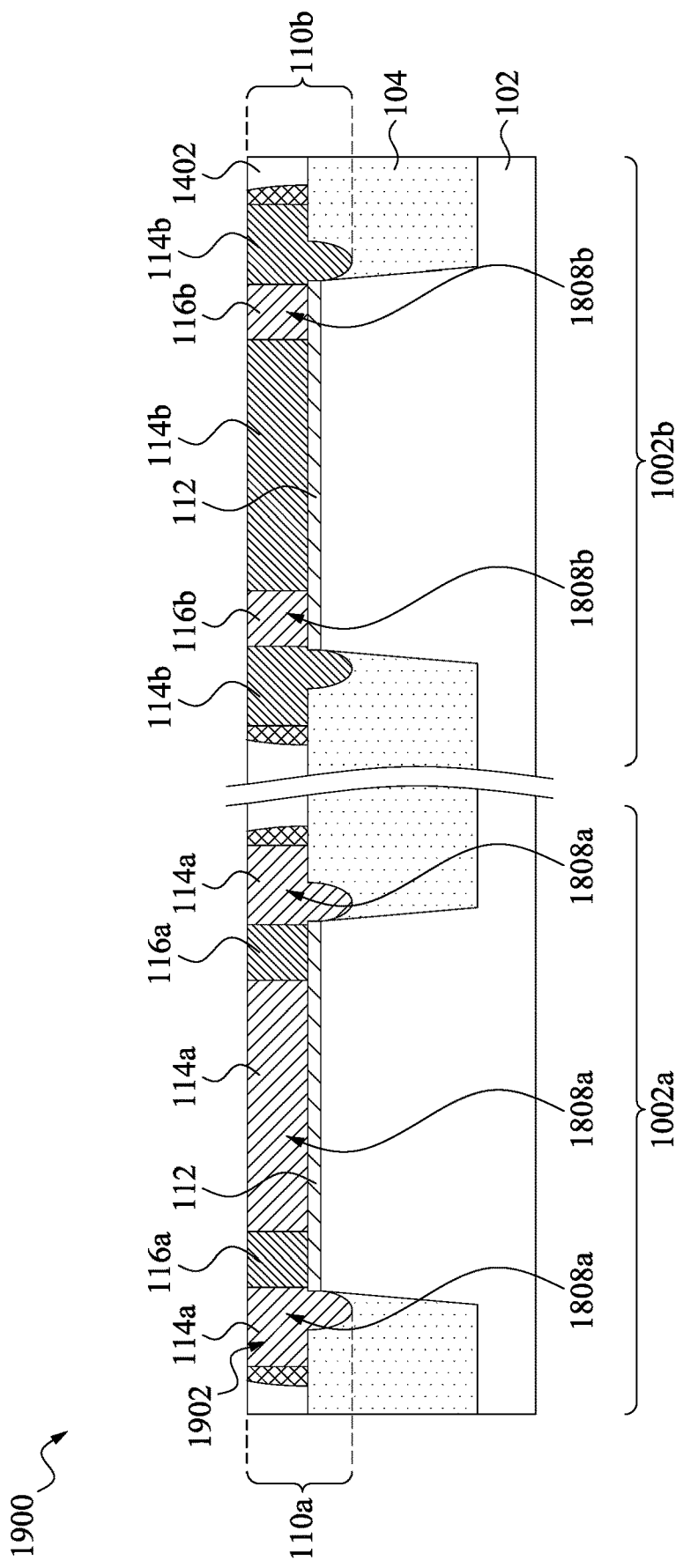

As shown in cross-sectional view 1900 of FIG. 19, a first composition of one or more materials (e.g., a first metal stack 1902 including an n-type gate metal) is formed within the openings 1808a and 1808b. A planarization process is performed on the n-type gate metal 1902 to remove excess portions of the first metal stack 1902 outside the openings 1808a and 1808b. Remaining portions of the first metal stack 1902 in the openings 1808a serve as the first gate electrode regions 114a within the NMOS region 1002a, and remaining portions of the first metal stack 1902 in the openings 1808b serve as the second gate electrode regions 116b within the PMOS region 1002b. In some embodiments, the first metal stack 1902 includes an n-type gate metal such as aluminum, tantalum, titanium, hafnium, zirconium, titanium silicide, tantalum nitride, tantalum silicon nitride, chromium, tungsten, copper, titanium aluminum, or the like. In various embodiments, the first metal stack 1902 may be formed by way of a vapor deposition technique (e.g., PVD, CVD, PE-CVD, ALD, etc.). The first and second gate electrode regions 114a and 116a are in combination referred to as a first gate structure 110a in the NMOS region 1002a, and the first and second gate electrode regions 114b and 116b are in combination referred to as a second gate structure 110b in the PMOS region 1002b. Within the NMOS region 1002a the first gate electrode region 114a has a first work function different from (e.g., less than) a second work function of the second gate electrode region 116a. Within the PMOS region 1002b the first gate electrode region 114b has a first work function different from (e.g., greater than) a second work function of the second gate electrode region 116b.

Figure 20:
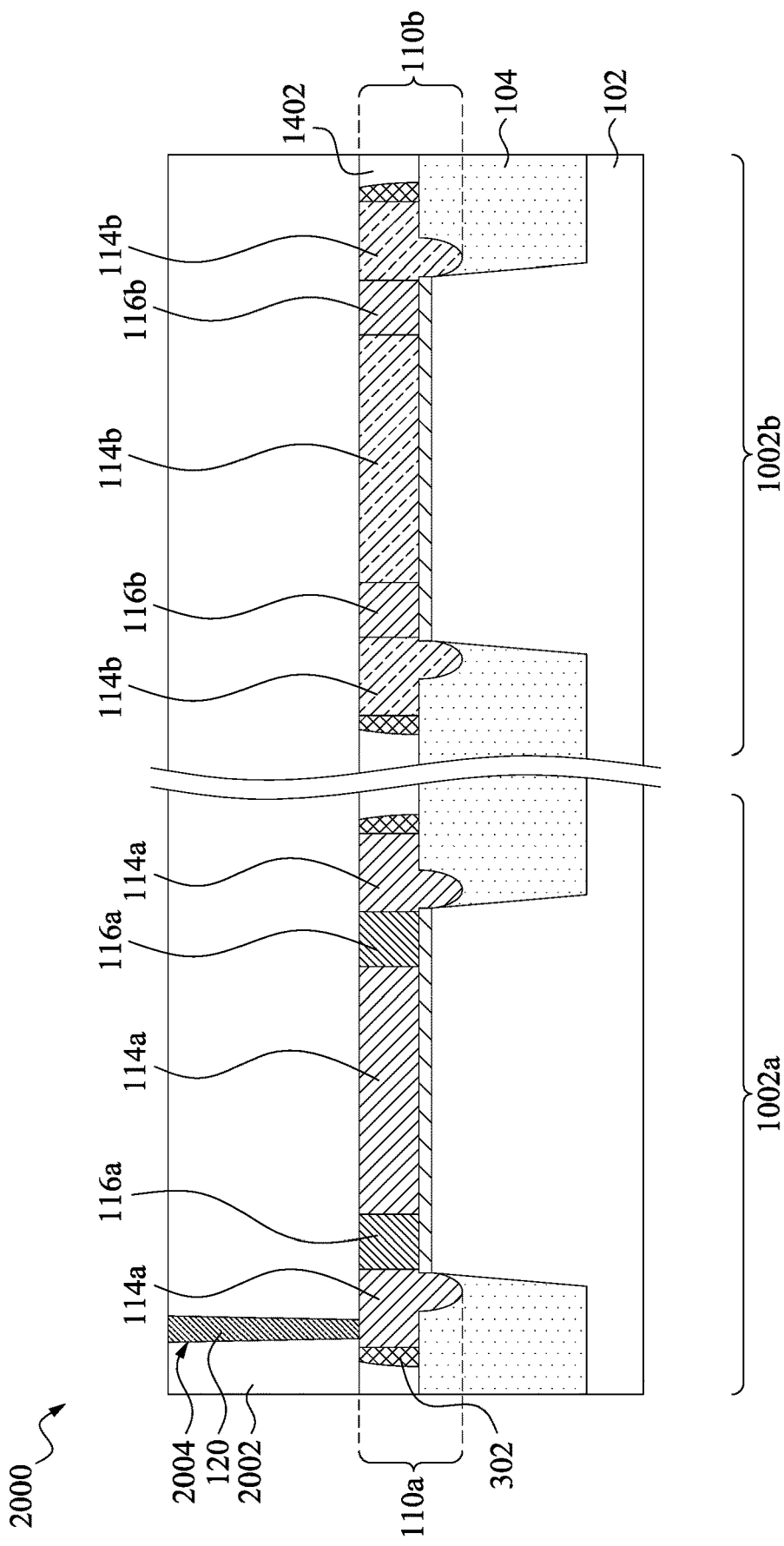

As shown in cross-sectional view 2000 of FIG. 20, a second dielectric layer 2002 (e.g., a second ILD layer) is formed over the first dielectric layer 1402 and the first and second gate structures 110a and 110b. A conductive contact 120 is formed within the second dielectric layer 2002. The conductive contact 120 extends from a top surface of the second dielectric layer 2002 to the gate structure 110a. In some embodiments, the conductive contact 120 may be formed by selective etching the second dielectric layer 2002 to form an opening 2004. The opening 2004 is subsequently filled with a conductive material to form the conductive contact 120. A planarization process (e.g., a chemical mechanical polishing process) may be performed after filling the conductive material to co-planarize upper surfaces of the second dielectric layer 2002 and the conductive contact 120. In various embodiments, the conductive material may include tungsten, copper, aluminum copper, or some other conductive material.

Figure 21:
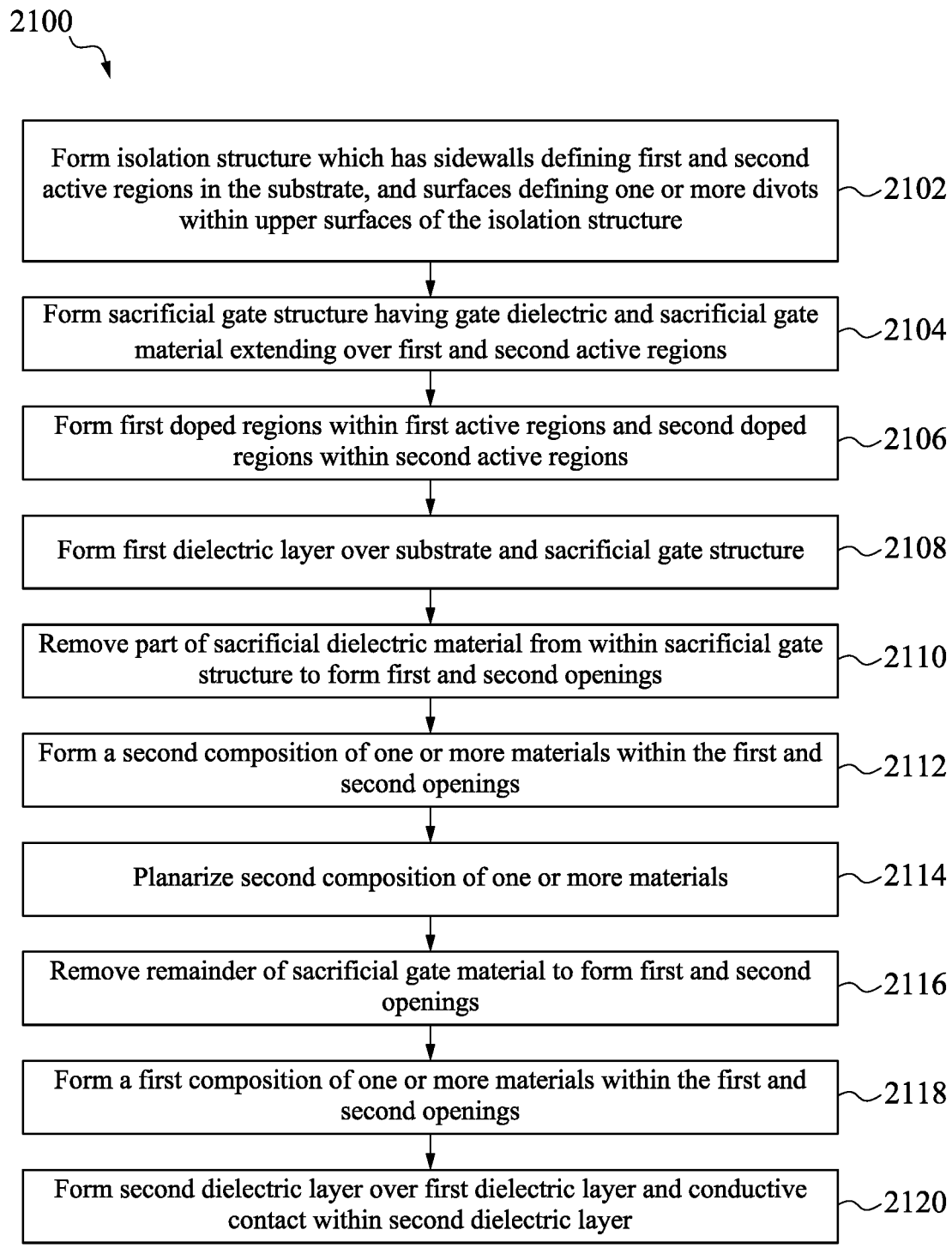

FIG. 21 illustrates a flow diagram of some embodiments of a method 2100 of forming an integrated chip having a transistor device comprising a gate structure configured to improved device performance.

While the disclosed methods (e.g., methods 2100 and 3500) are illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At block 2102, an isolation structure is formed within a substrate. The isolation structure includes sidewalls defining first and second active regions in the substrate and surfaces defining one or more divots within upper surfaces of the isolation structure. The first and second active regions are within NMOS and PMOS regions, respectively. FIGS. 10A-10B illustrate some embodiments corresponding to block 2102.

At block 2104, a sacrificial gate structure having a gate dielectric and a sacrificial dielectric material is formed over the first and second active regions. FIGS. 11A-12B illustrate some embodiments corresponding to block 2104.

At block 2106, first doped regions are formed within the first active region on opposing sides of the sacrificial dielectric material, and second doped regions are formed within the second active region on opposing sides of the sacrificial dielectric material. FIGS. 13A-13B illustrate some embodiments corresponding to block 2106.

At block 2108, a first dielectric layer is formed over the substrate and around the sacrificial dielectric material. FIG. 14 illustrates some embodiments corresponding to block 2108.

At block 2110, a part of the sacrificial dielectric material is removed from within the sacrificial gate structure to form first and second openings. FIG. 15 illustrates some embodiments corresponding to block 2110.

At block 2112, a second composition of one or more materials is formed within the first and second openings. The second composition of one or more materials defines one or more second gate electrode regions within the NMOS region and one or more first gate electrode regions within the PMOS region. FIG. 16 illustrates some embodiments corresponding to block 2112.

At block 2114, a planarization process is performed on the second composition of one or more materials to remove the excess second composition of one or more materials from over the first dielectric layer. FIG. 17 illustrates some embodiments corresponding to block 2114.

At block 2116, a remainder of the sacrificial gate material is removed to form one or more first openings abutting the second gate electrode regions within the NMOS region, and one or more second openings abutting the first gate electrode regions within the PMOS region. FIG. 18 illustrates some embodiments corresponding to block 2116.

At block 2118, a first composition of one or more materials is formed within the first and second openings in place of the remainder of the sacrificial gate material. The first composition of one or more materials defines one or more first gate electrode regions within the NMOS region, and one or more second gate electrode regions within the PMOS region. FIG. 19 illustrates some embodiments corresponding to block 2118.

At block 2120, a second dielectric layer is formed over the first dielectric layer, and a conductive contact is formed within the second dielectric layer. FIG. 20 illustrates some embodiment corresponding to block 2120.

FIGS. 22A-34 illustrate cross-sectional views and top views corresponding to some alternative embodiments of a method of forming an integrated chip having a transistor device comprising a gate structure configured to improved device performance. Although FIGS. 22A-34 are described with reference to a method, it will be appreciated that the structures shown in FIGS. 22A-34 are not limited to the method but rather may stand alone separate of the method.

Figure 22A:
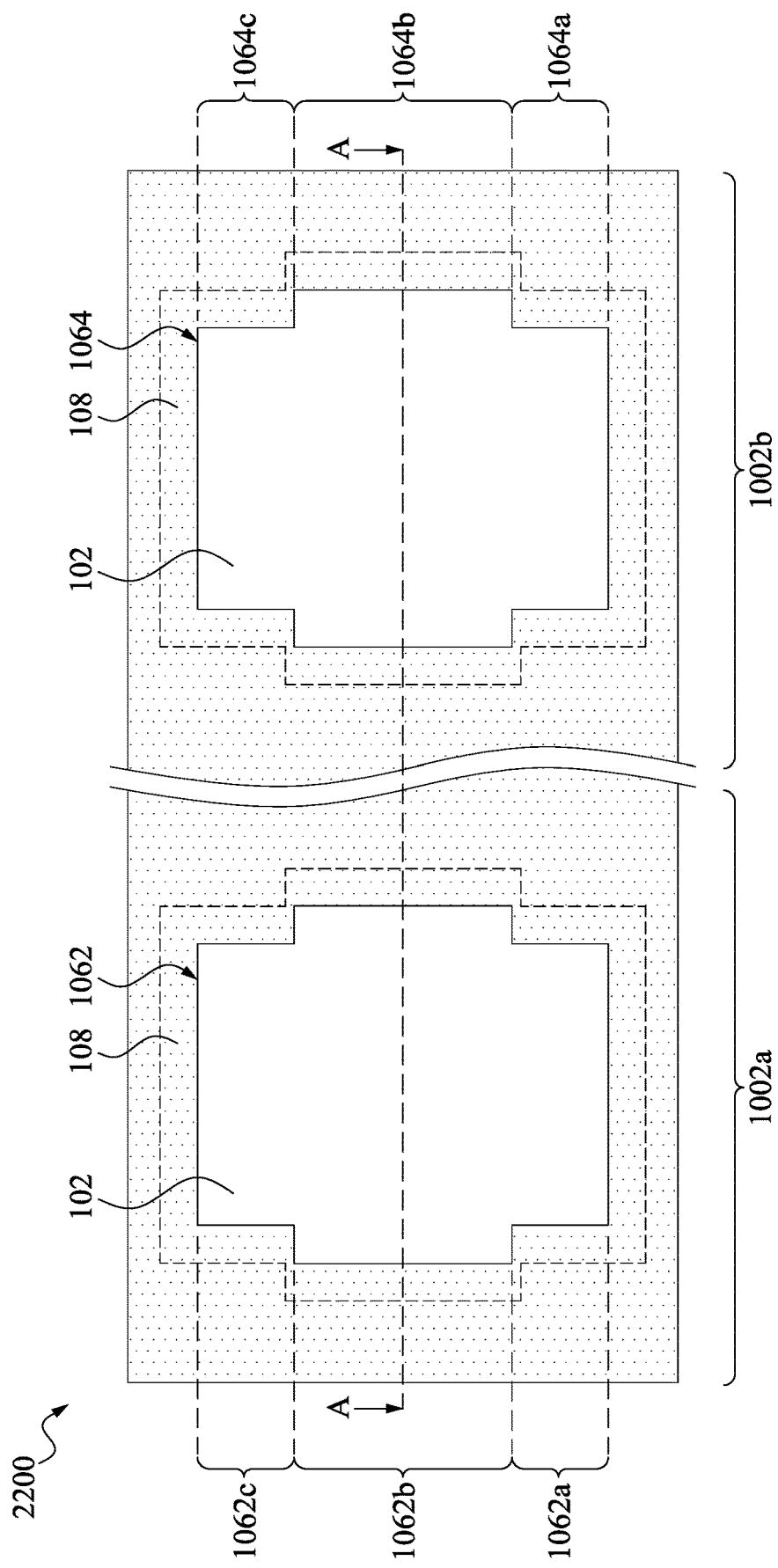
Figure 22B:
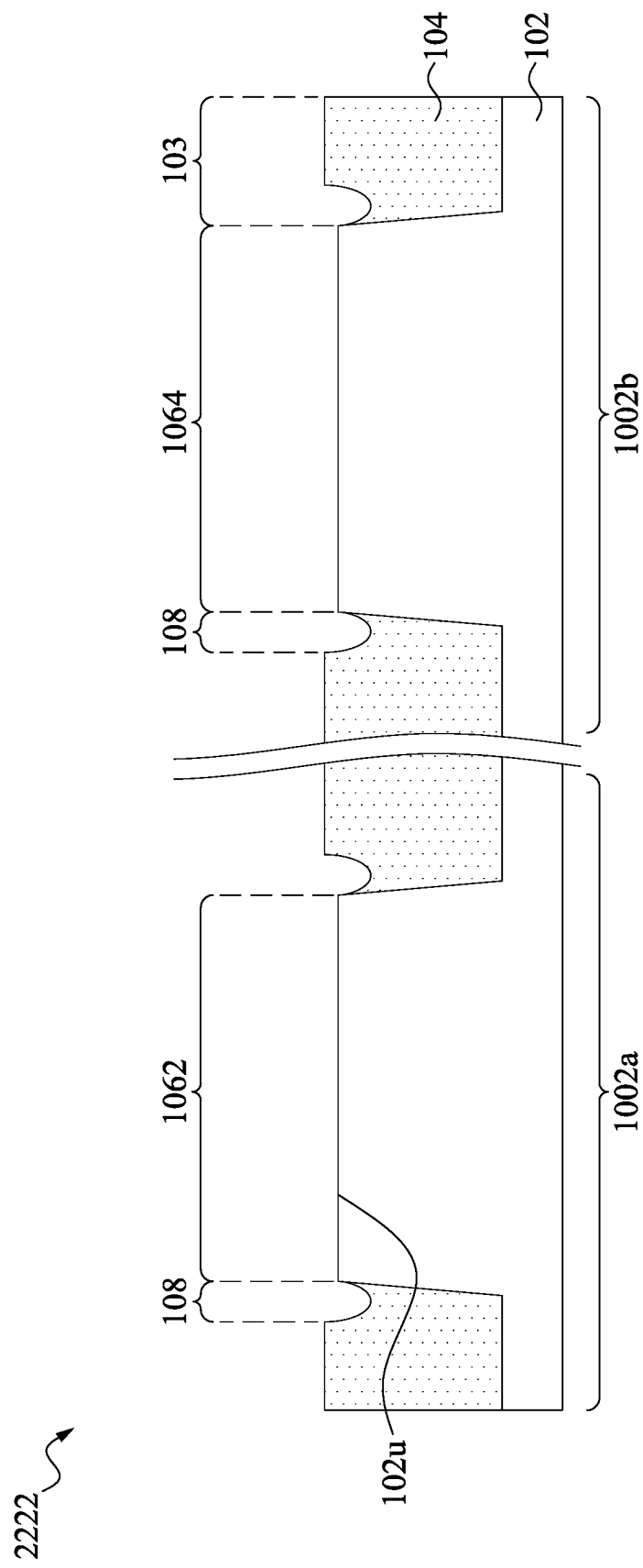

As shown in top view 2200 of FIG. 22A and cross-sectional view 2222 of FIG. 22B, an isolation structure 104 is formed within a trench 103 within a substrate 102. The isolation structure 104 defines a first active region 1062 within a first region 1002a corresponding to a first transistor type (e.g., an NMOS transistor) and a second active region 1064 within a second region 1002b corresponding to a second transistor type (e.g., a PMOS transistor). The first active region 1062 and the second active region 1064 expose upper surface 102u of the substrate 102. Details about the isolation structure 104 and the active regions 1062 and 1064 are discussed previously with respect to FIGS. 10A and 10B and thus not repeated for the sake of brevity.

Figure 23A:
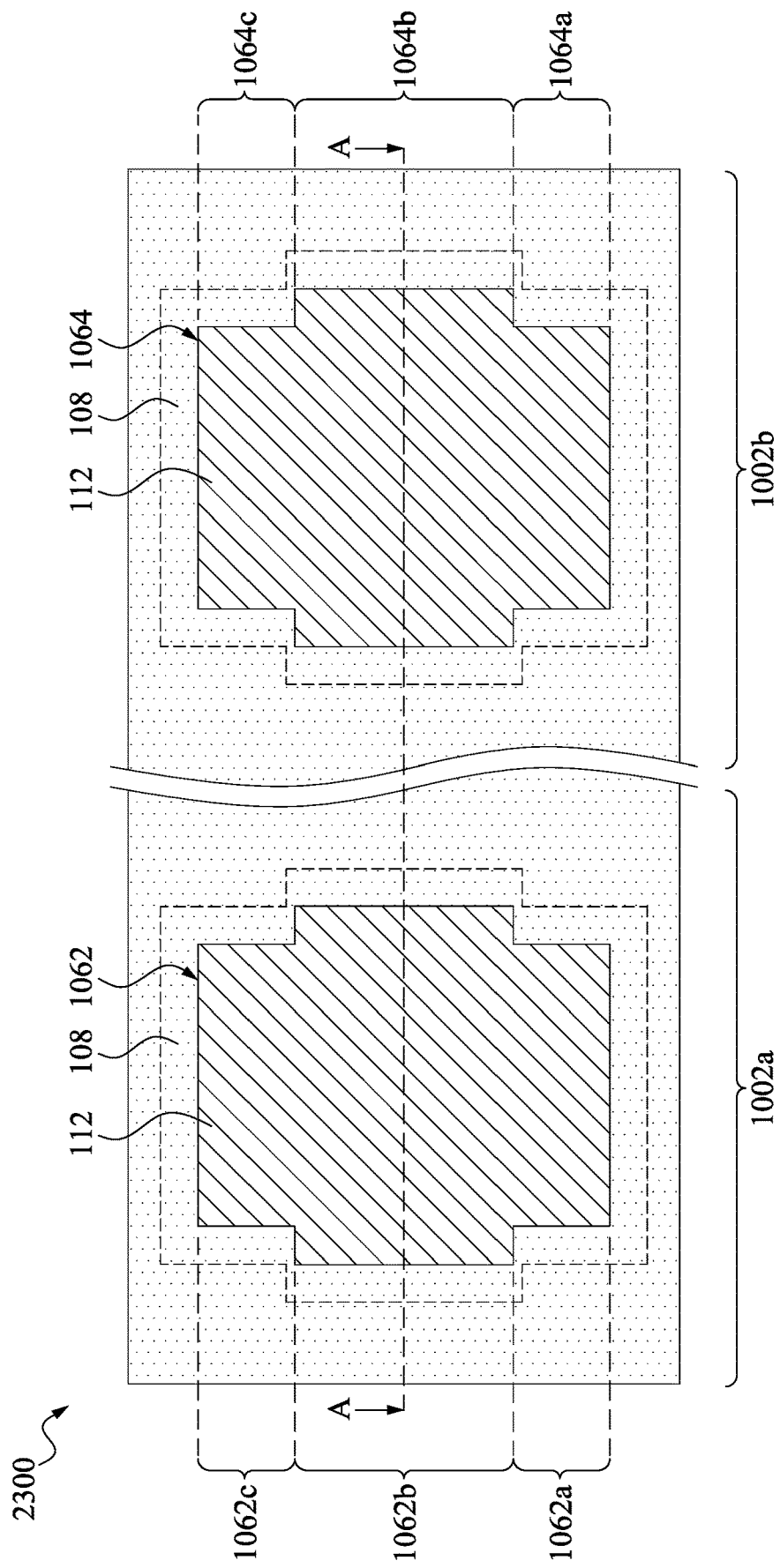
Figure 23B:
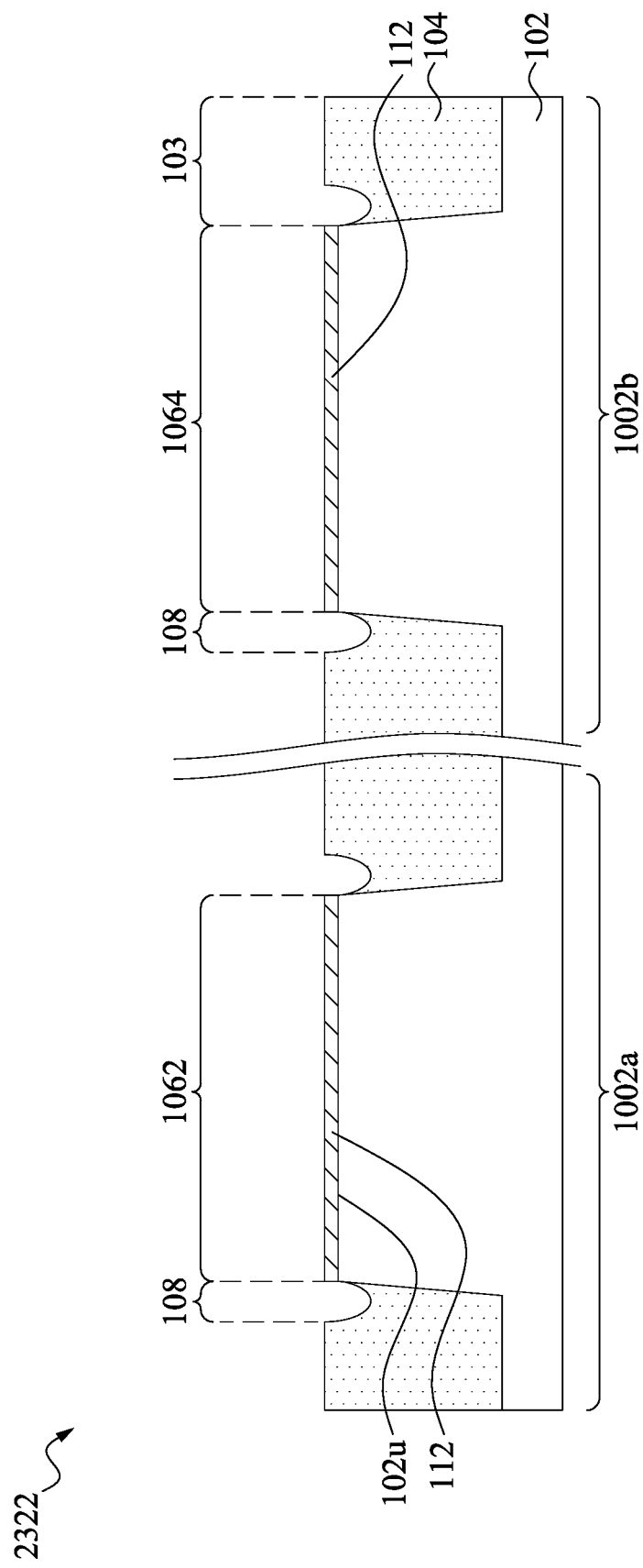

As shown in top view 2300 of FIG. 23A and cross-sectional view 2322 of FIG. 23B, a gate dielectric 112 is formed over the substrate 102 and within the first active region 1062 and the second active region 1064. Details about the gate dielectric 112 are discussed previously with respect to FIGS. 11A and 11B and thus not repeated for the sake of brevity.

Figure 24A:
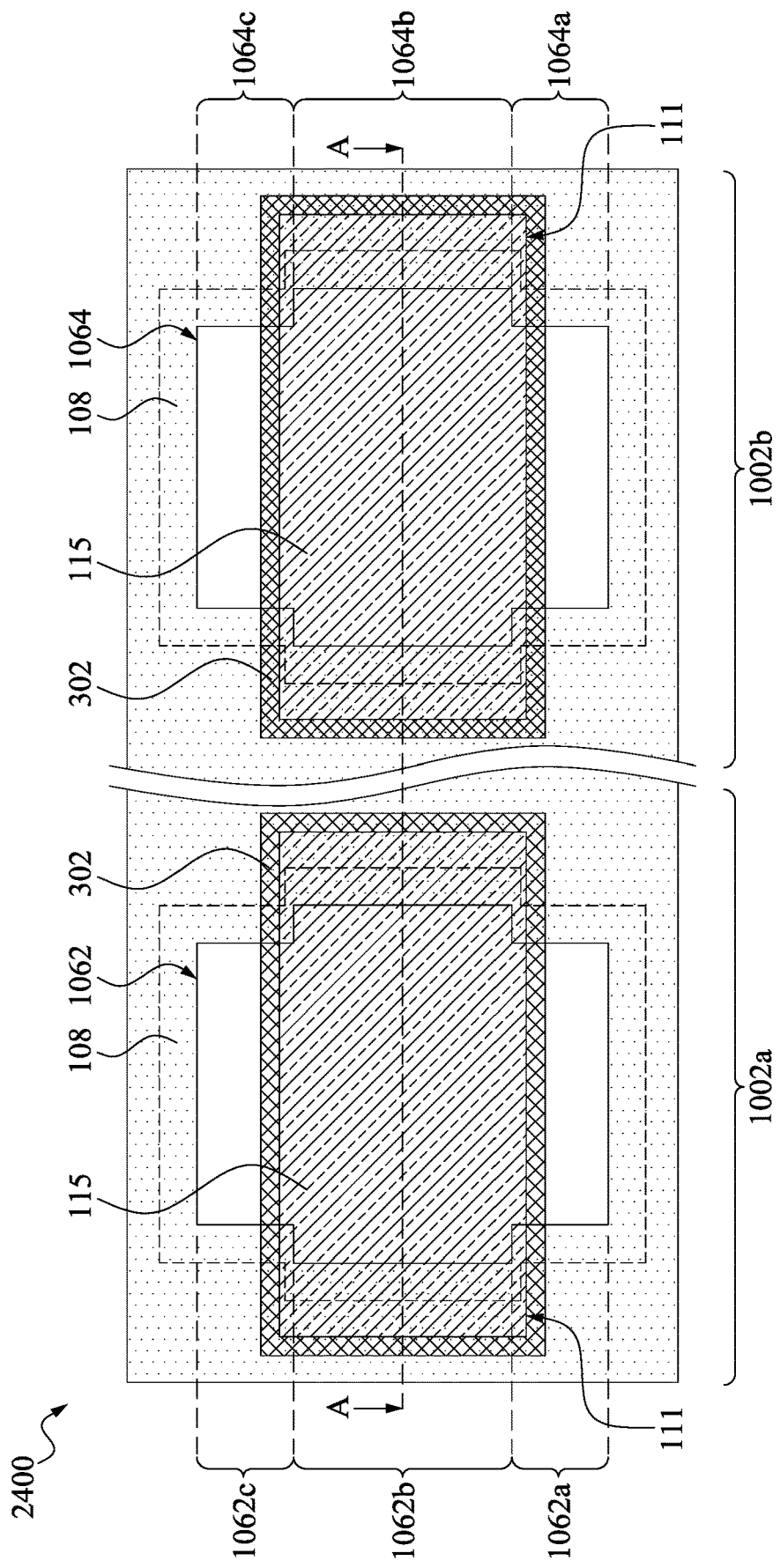
Figure 24B:
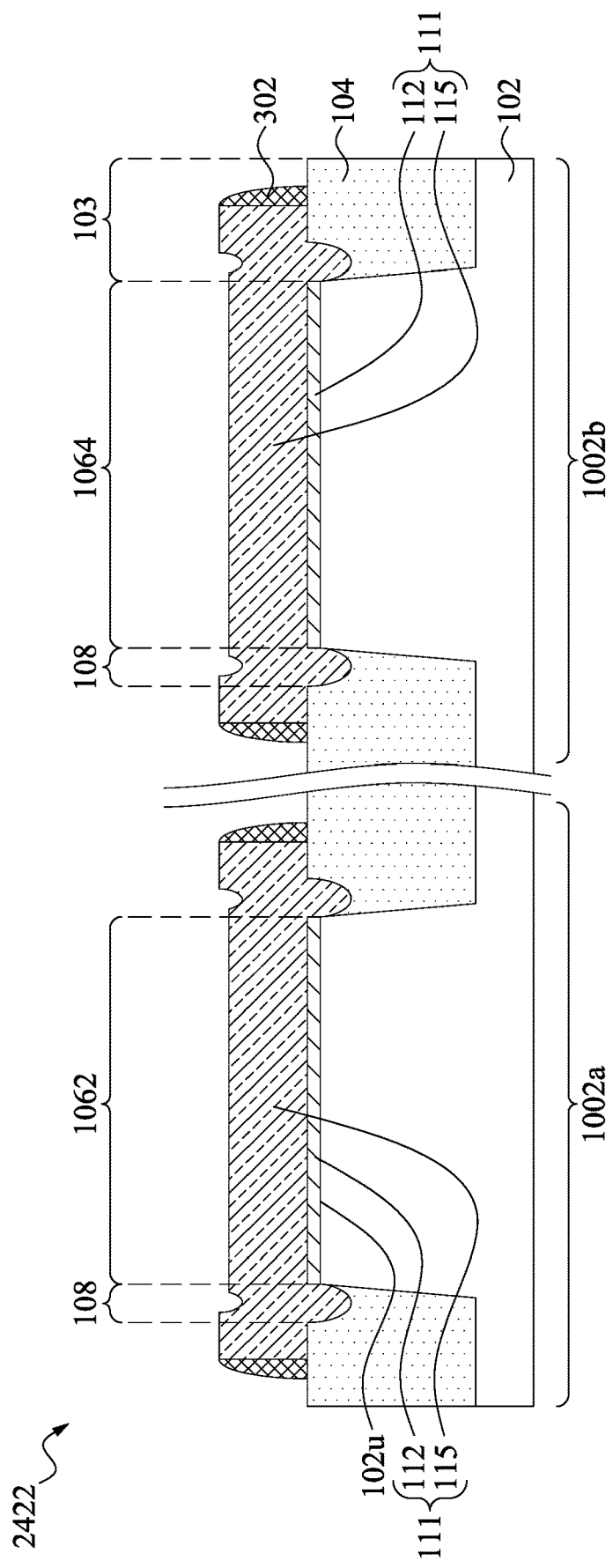

As shown in top view 2400 of FIG. 24A and cross-sectional view 2442 of FIG. 24B, a sacrificial gate material 115 is formed over the gate dielectric 112 and within the divots in the isolation structure 104. The sacrificial gate material 115 and the underlying gate dielectric 112 are in combination referred to as sacrificial gate structures 111. In some embodiments, sidewall spacers 302 may be formed along sides of the sacrificial gate structures 111. Details about the sacrificial gate material 115 and sidewall spacers 302 are discussed previously with respect to FIGS. 12A and 12B and thus not repeated for the sake of brevity.

Figure 25A:
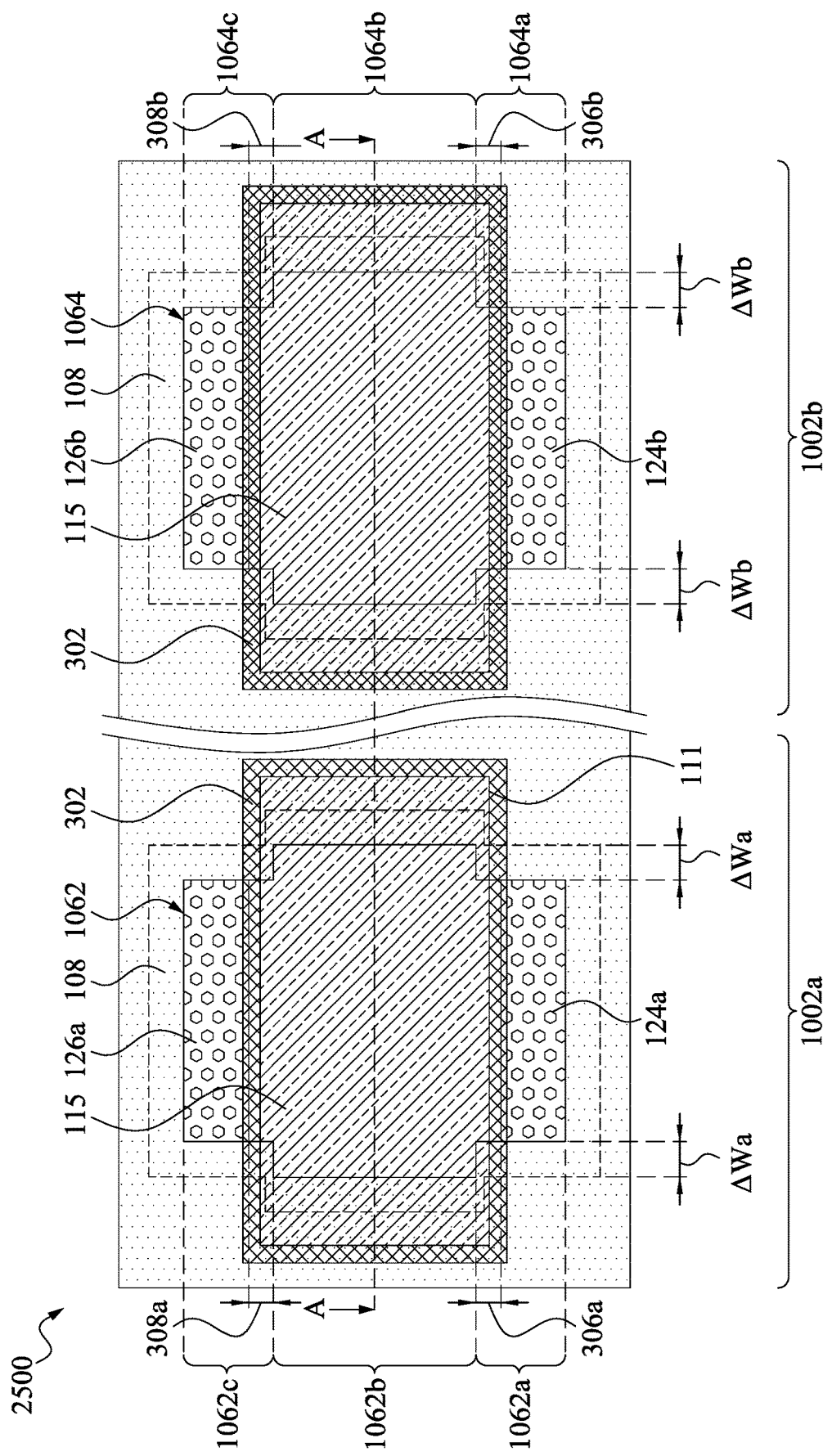
Figure 25B:
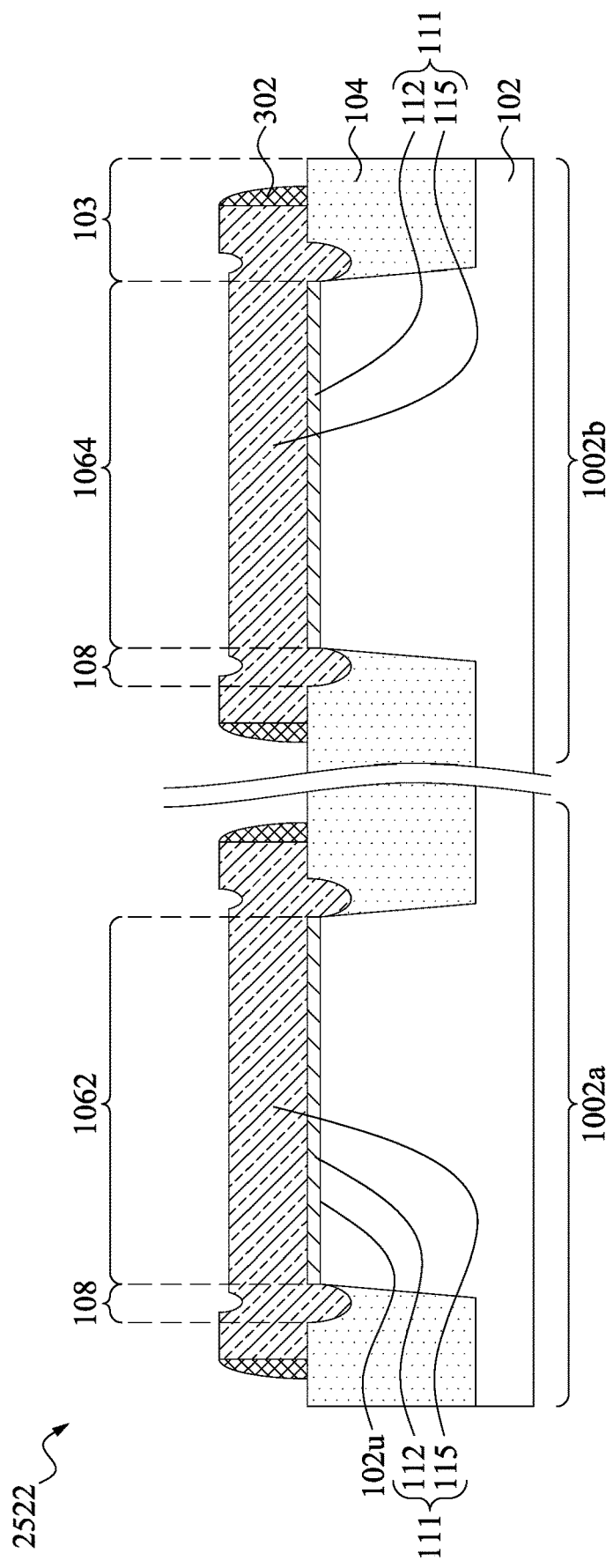

As shown in top view 2500 of FIG. 25A and cross-sectional views 2522 of FIG. 25B, a first doped region 124a and a second doped region 126a are formed within the substrate 102 on opposing sides of the sacrificial gate material 115 within the first active region 1062. A first doped region 124b and a second doped region 126b are formed within the substrate 102 on opposing sides of the sacrificial gate material 115 within the second active region 1064. In some embodiments, the first doped region 124a and the second doped region 126a may be formed by a first implantation process, while the first doped region 124b and the second doped region 126b may be formed by a second implantation process. For example, the first implantation process may be performed by selectively implanting a first dopant species (e.g., comprising an n-type dopant, such as phosphorus, arsenic, etc.) into the substrate 102 according to a first mask covering the second region 1002b. Similarly, the second implantation process may be performed by selectively implanting a second dopant species (e.g., comprising a p-type dopant, such as boron, gallium, etc.) into the substrate 102 according to a second mask covering the first region 1002a. Other details about the doped regions 124a, 126a, 124b, and 126b are discussed previously with respect to FIGS. 13A and 13B and thus not repeated for the sake of brevity.

Figure 26:
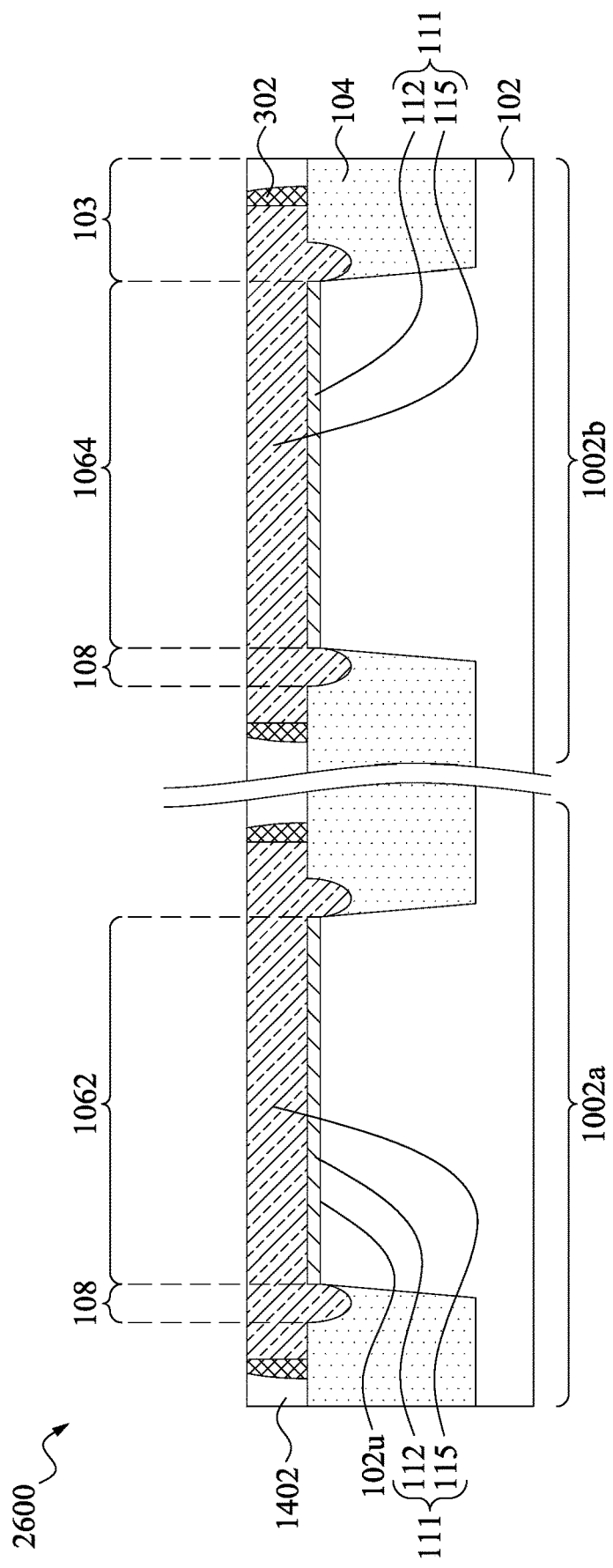

As shown in cross-sectional view 2600 of FIG. 26, a first dielectric layer 1402 (e.g., a first inter-level dielectric (ILD) layer) is formed over the substrate 102. The first dielectric layer 1402 covers the sacrificial gate material 115 and the sidewall spacers 302. A planarization process is performed to remove the first dielectric layer 1402 from over the sacrificial gate material 115 and the sidewall spacers 302. In various embodiments, the first dielectric layer 1402 may include an oxide, PSG, a low k dielectric, or some other dielectric, and may be formed by vapor deposition process (e.g., CVD, PVD, or ALD).

Figure 27:
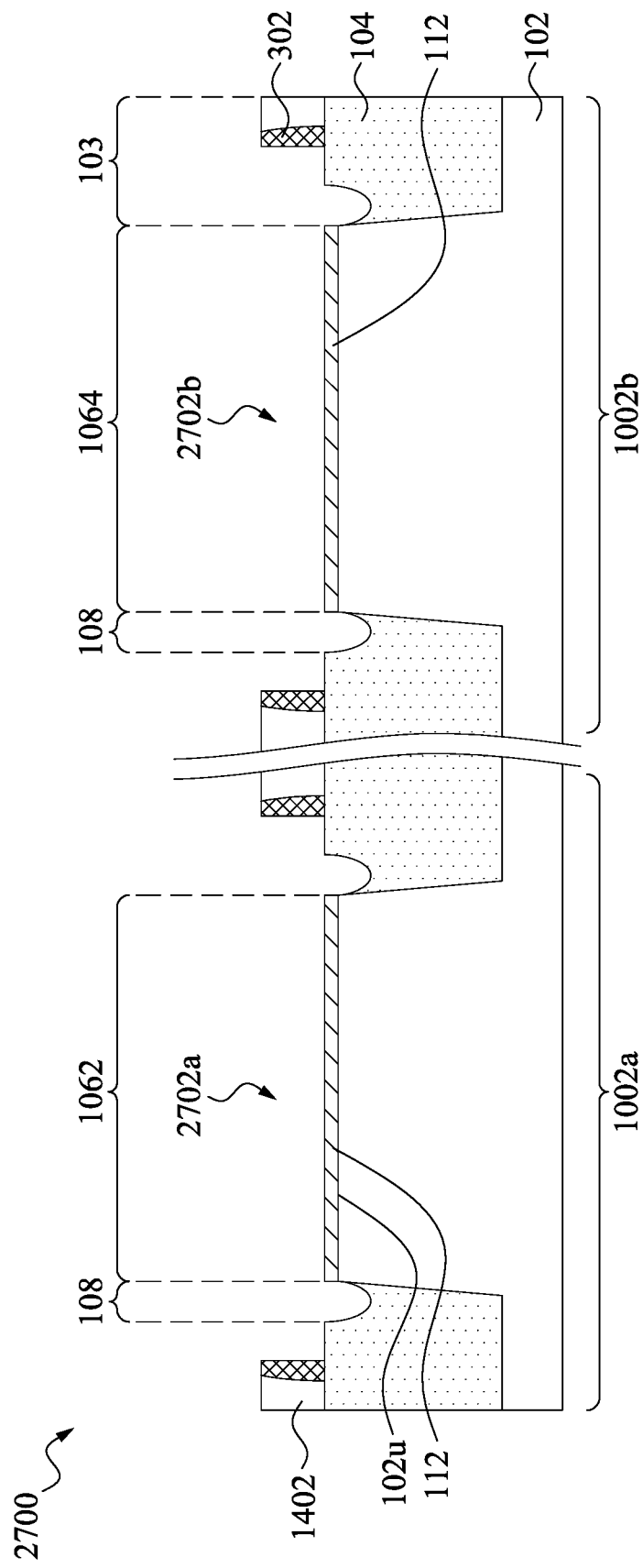

As shown in cross-sectional view 2700 of FIG. 27, the sacrificial gate material 115 within the sacrificial gate structures 111 is removed. Removal of the sacrificial gate material 115 results in the formation of replacement gate cavities 2702a and 2702b between sidewall spacers 302. The replacement gate cavity 2702a is within the NMOS region 1002a, and the replacement gate cavity 2702b is within the PMOS region 1002b.

Figure 28:
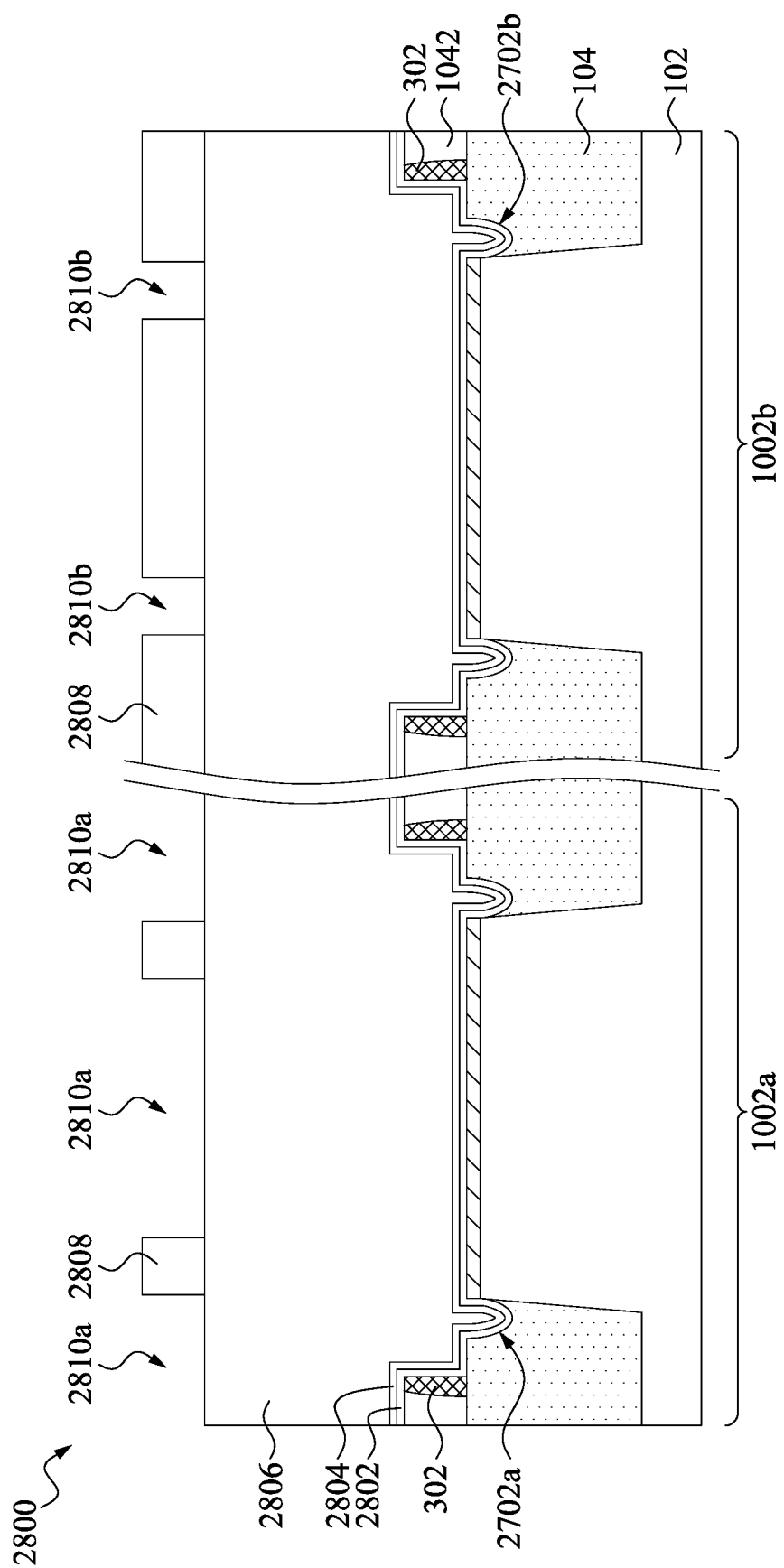

As shown in cross-sectional view 2800 of FIG. 28, a barrier layer 2802, a first gate metal 2804 and a sacrificial dielectric material 2806 are formed in sequence to fill the replacement gate cavities 2702a and 2702b. In some embodiments, the barrier layer 2802 is configured to prevent the diffusion of the subsequently formed metals (e.g., first gate metal 2804) into the gate dielectric layer 112. The barrier layer 2802 may be made of metal carbonitride (such as titanium carbonitride or tantalum carbonitride) or metal nitride (such as titanium nitride or tantalum nitride). In various embodiments, the barrier layer 2802 may be formed by way of a vapor deposition technique (e.g., PVD, CVD, PE-CVD, ALD, etc.). In some embodiments, the first gate metal 2804 may include a p-type gate metal such as nickel, cobalt, molybdenum, platinum, lead, gold, tantalum nitride, molybdenum silicide, ruthenium, chromium, tungsten, copper, or the like. In various embodiments, the first gate metal 2804 may be formed by way of a vapor deposition technique (e.g., PVD, CVD, PE-CVD, ALD, etc.). In some embodiment, the sacrificial dielectric material 2806 may comprise a spin-on-glass (SOG).

After formation of the sacrificial dielectric material 2806, a masking layer comprising a photosensitive material 2808 is formed over the sacrificial dielectric material 2806. The photosensitive material 2808 is patterned to define first and second openings 2810a and 2810a within the photosensitive material 2808, wherein the first openings 2810a are within the first region 1002a and the second openings 2810b are within the second region 1002b.

Figure 29:
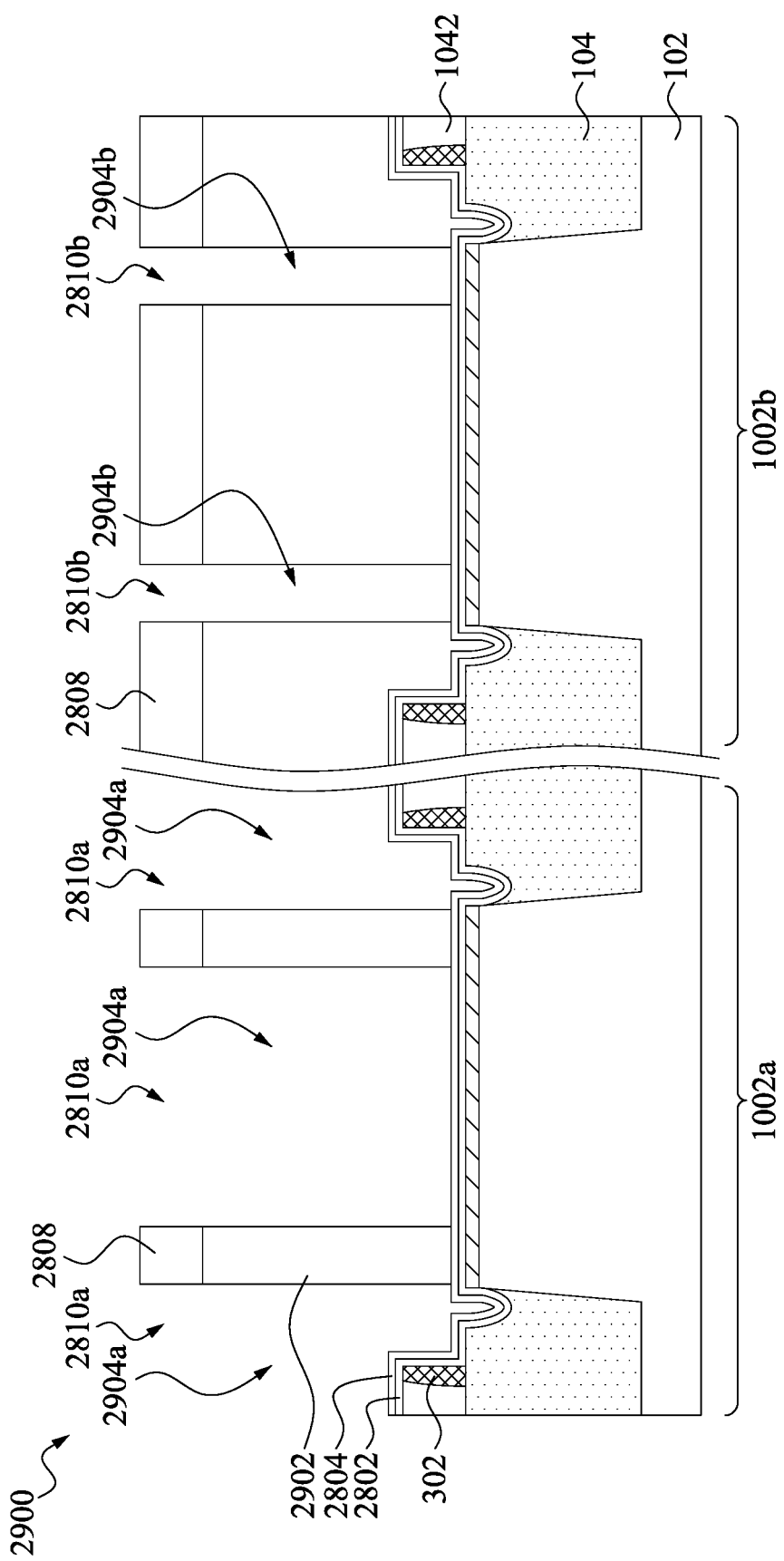

As shown in cross-sectional view 2900 of FIG. 29, the sacrificial dielectric material 2806 is selectively exposed to an etchant according to the photosensitive material 2808, so as to remove parts of the sacrificial dielectric material 2806 that underlie the first and second openings 2810a and 2810b within the photosensitive material 2808. The remaining portions of the sacrificial dielectric material 2806 can be referred to as a patterned mask 2902 having one or more first openings 2904a within the first region 1002a and one or more second openings 2904b within the second region 1002b.

Figure 30:
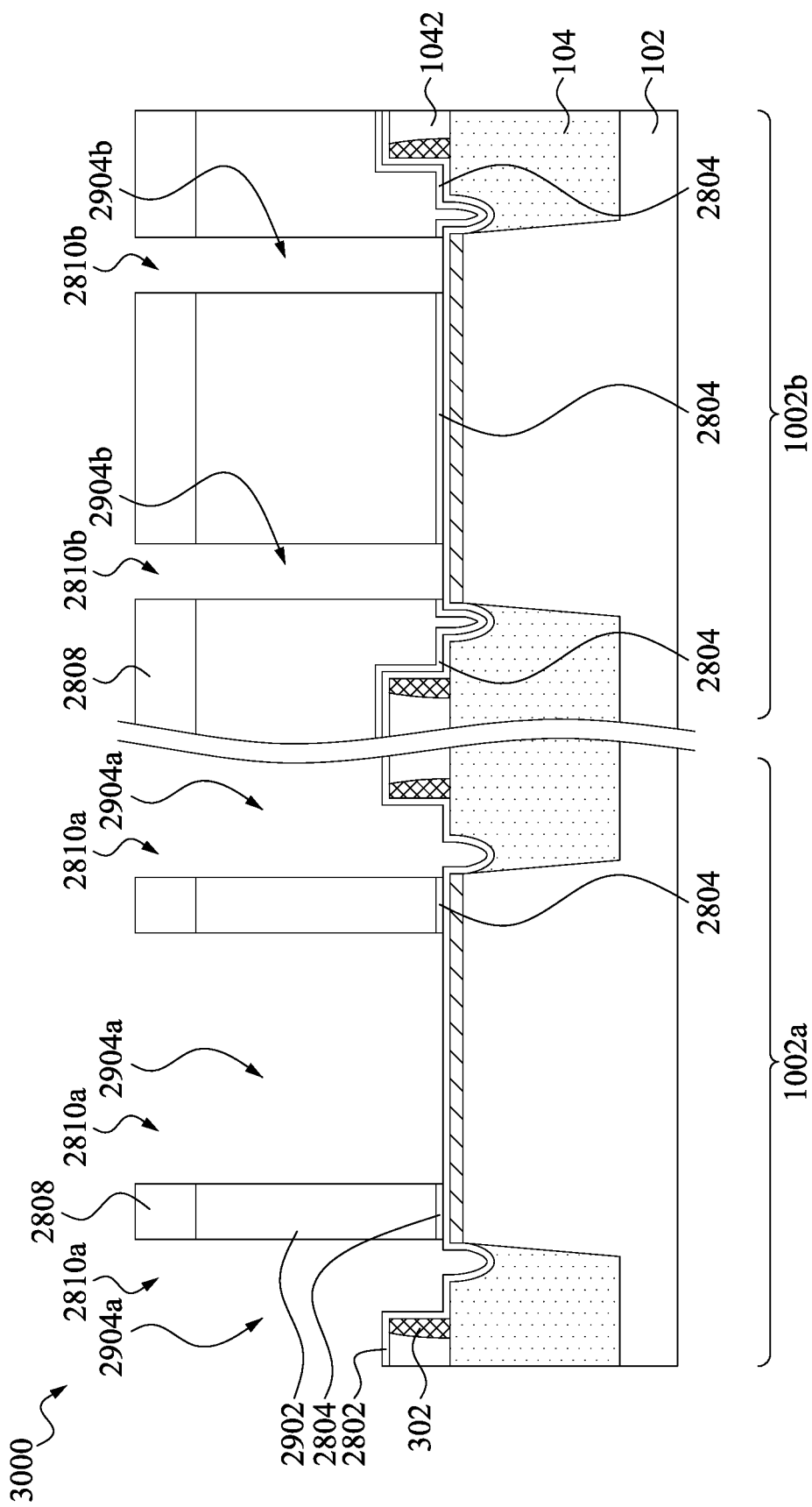

As shown in cross-sectional view 3000 of FIG. 30, the first gate metal 2804 is selectively exposed to an etchant according to the patterned mask 2902, so as to remove parts of the first gate metal 2804 that underlie the first and second openings 2904a and 2904b within the patterned mask 2902. The patterned mask 2902 remains over the divots 108 within the second region 1002b, while the patterned mask 2902 is removed over the divots 108 within the first region 1002a. After etching first gate metal 2804, a remainder of the photosensitive material 2808 and the patterned mask 2902 is removed. The resulting structure is shown in cross-sectional view 3100 of FIG. 31.

Figure 32:
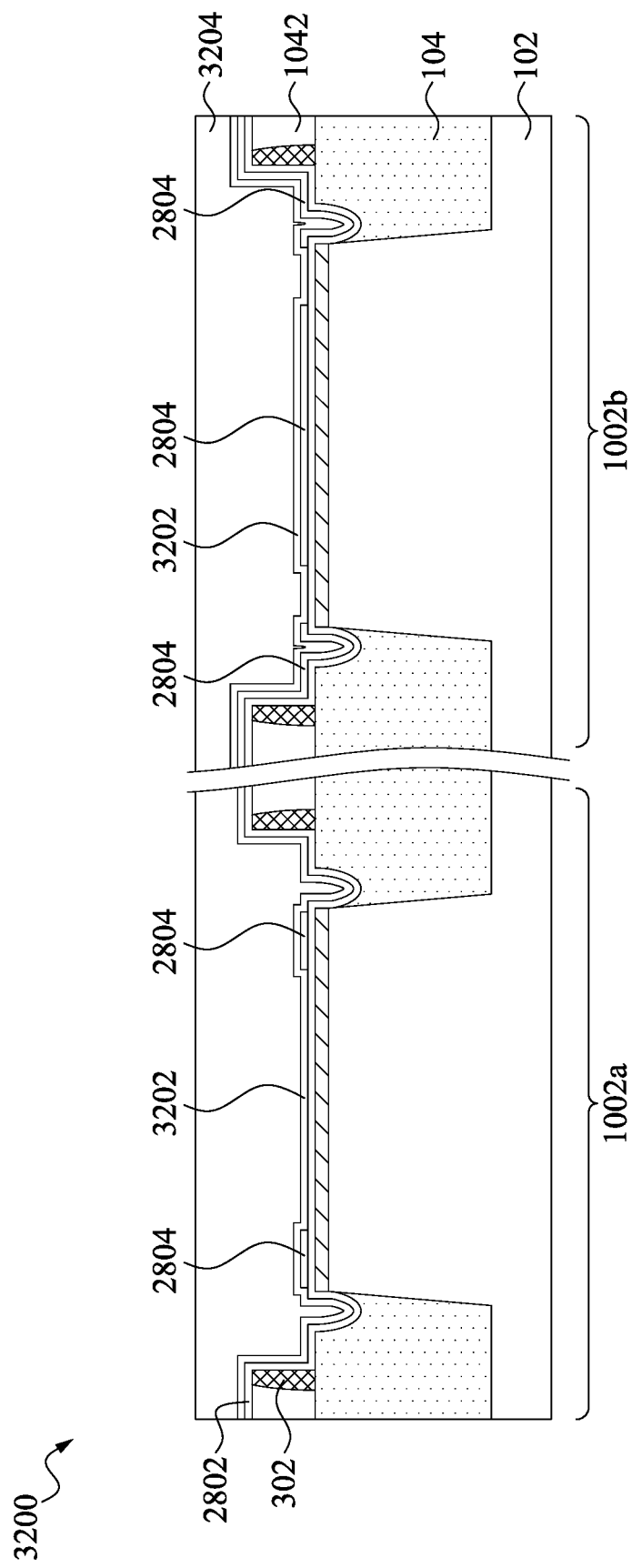

As shown in cross-sectional view 3200 of FIG. 32, a second gate metal 3202 and a fill metal 3204 are formed in sequence to fill the replacement gate cavities 2702a and 2702b and over the first gate metal 2804. In some embodiments, the second gate metal 3202 may comprise an n-type gate metal such as aluminum, tantalum, titanium, hafnium, zirconium, titanium silicide, tantalum nitride, tantalum silicon nitride, chromium, tungsten, copper, titanium aluminum, or the like. In various embodiments, the second gate metal 3202 may be formed by way of a vapor deposition technique (e.g., PVD, CVD, PE-CVD, ALD, etc.). The fill metal 3204 may comprise aluminum, tungsten, gold, platinum, cobalt, other suitable metal, alloy thereof, or combinations thereof. The fill metal 3204 may be deposited by using a PVD process, CVD process, a plating process, ALD process, the like, or combinations thereof.

Figure 33:
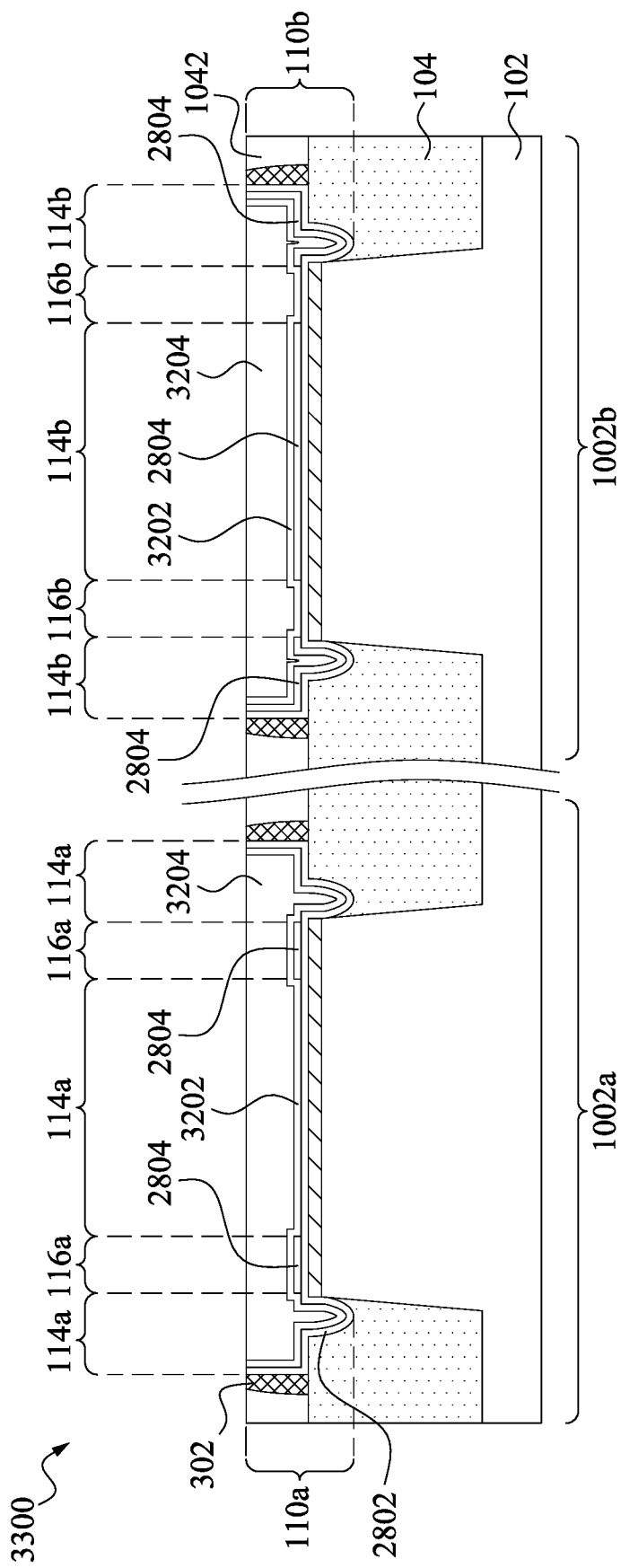

As shown in cross-sectional view 3300 of FIG. 33, a planarization process is performed on the fill metal 3204 until reaching the first dielectric layer 1402. The planarization process results in a first gate structure 110a in the NMOS region 1002a and a second gate structure 110b in the PMOS region 1002b. The first gate structure 110a includes first and second gate electrode regions 114a and 116a, wherein the first gate metal 2804 is absent from the first gate electrode region 114a but present within the second gate electrode region 116a. In this way, the first and second gate electrode regions 114a and 116a have different work functions. For example, if the first gate metal 2804 is a p-type gate metal having a higher work function than that of an n-type gate metal, the second gate electrode region 116a has a higher work function than that of the first gate electrode region 114a. The second gate structure 110b within the PMOS region 1002b includes first and second gate electrode regions 114b and 116b, wherein the first gate metal 2804 is present within the first gate electrode region 114b but absent from the second gate electrode region 116b. In this way, the first and second gate electrode regions 114b and 116b have different work functions. For example, if the first gate metal 2804 is a p-type gate metal having a higher work function than that of an n-type gate metal, the first gate electrode region 114b has a higher work function than that of the second gate electrode region 116b.

Figure 34:
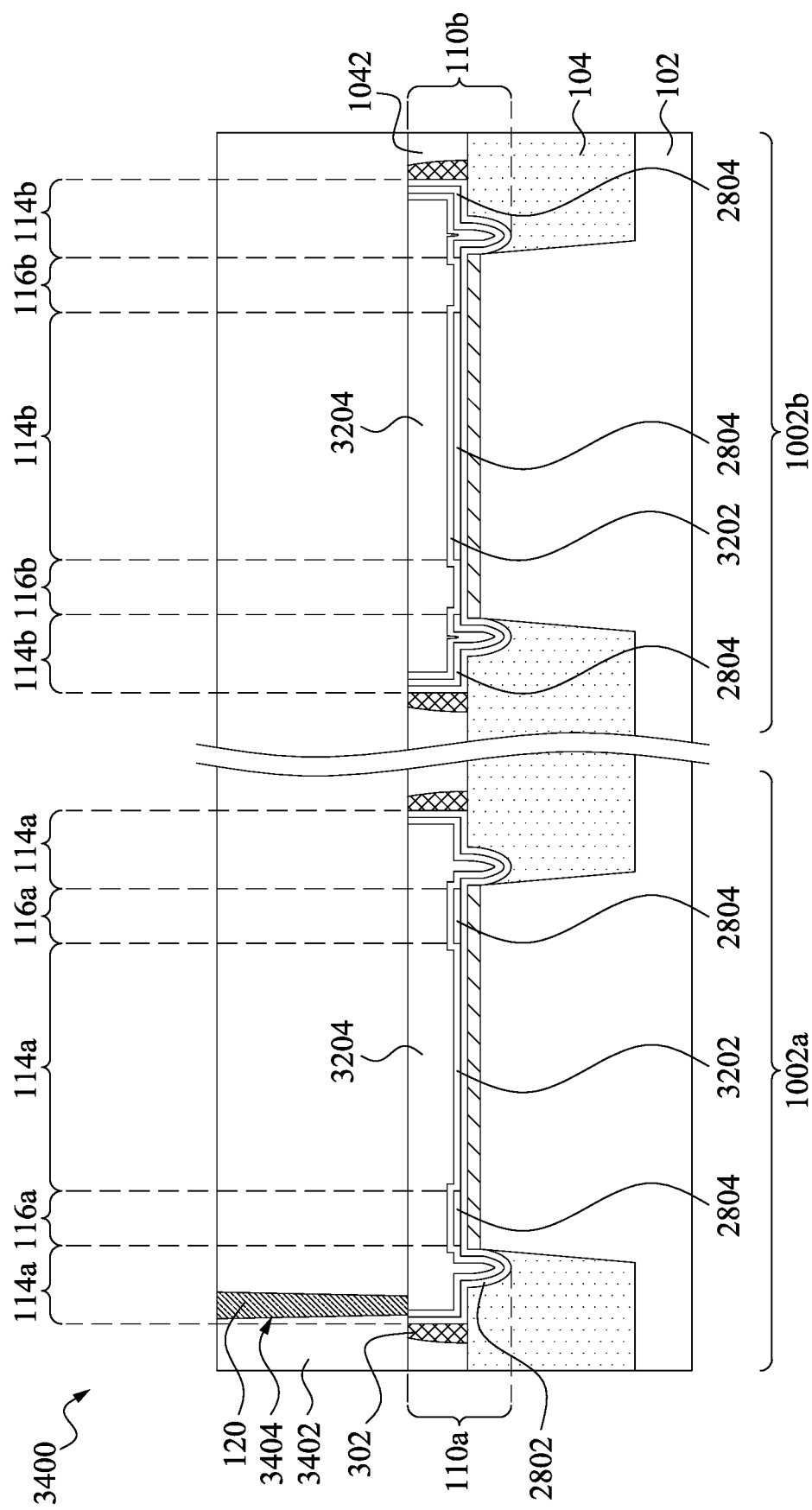

As shown in cross-sectional view 3400 of FIG. 34, a second dielectric layer 3402 (e.g., a second ILD layer) is formed over the first dielectric layer 1402 and the first and second gate structures 110a and 110b. A conductive contact 120 is formed within the second dielectric layer 3402. The conductive contact 120 extends from a top surface of the second dielectric layer 3402 to the gate structure 110a. In some embodiments, the conductive contact 120 may be formed by selective etching the second dielectric layer 3402 to form an opening 3404. The opening 3404 is subsequently filled with a conductive material to form the conductive contact 120. A planarization process (e.g., a chemical mechanical polishing process) may be performed after filling the conductive material to co-planarize upper surfaces of the second dielectric layer 3402 and the conductive contact 120. In various embodiments, the conductive material may include tungsten, copper, aluminum copper, or some other conductive material.

Figure 35:
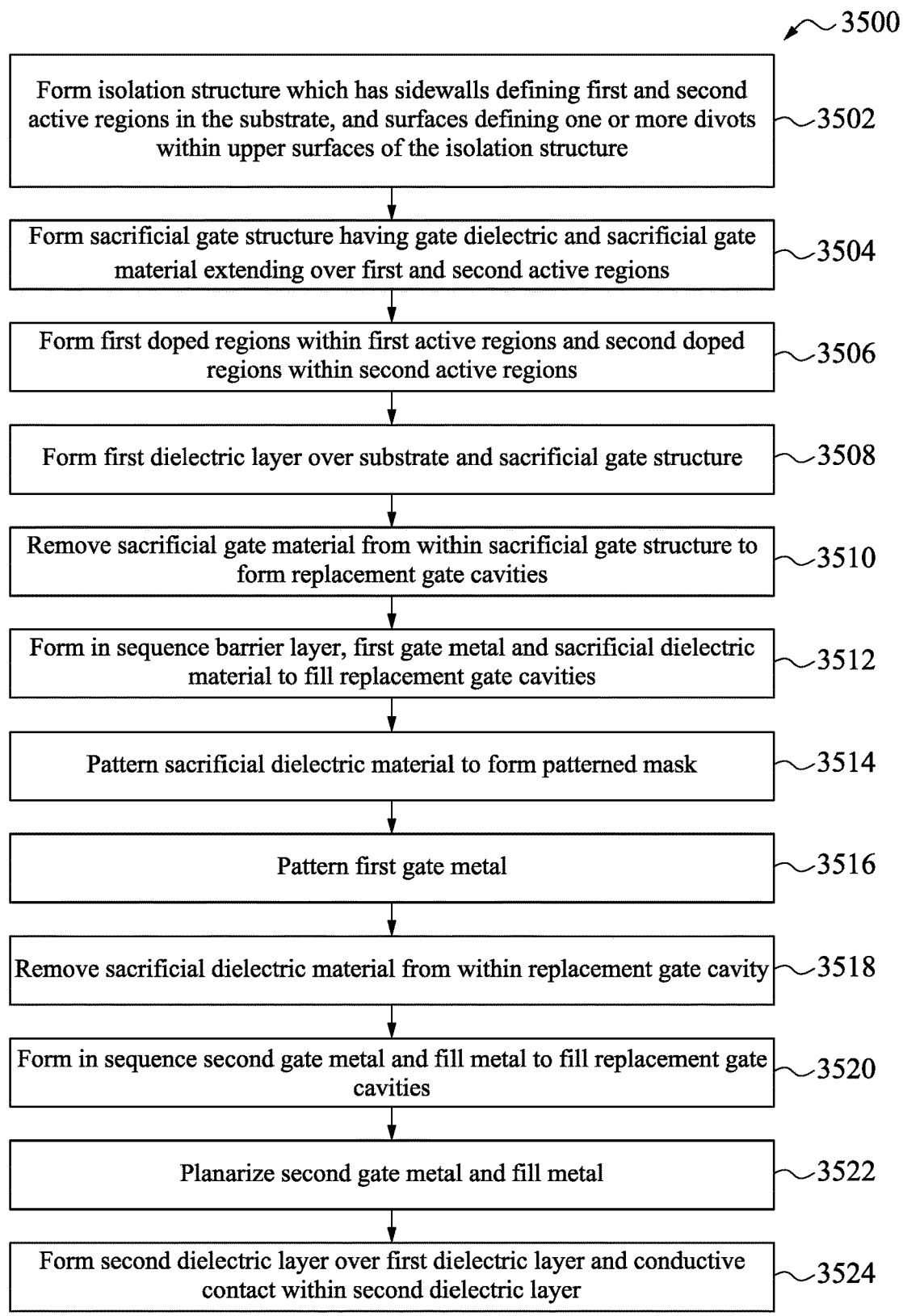

FIG. 35 illustrates a flow diagram of some alternative embodiments of a method 3500 of forming an integrated chip having a transistor device comprising a gate structure configured to improved device performance.

At block 3502, an isolation structure is formed within a substrate. The isolation structure includes sidewalls defining first and second active regions in the substrate and surfaces defining one or more divots within upper surfaces of the isolation structure. The first and second active regions are within NMOS and PMOS regions, respectively. FIGS. 22A-22B illustrate some embodiments corresponding to block 3502.

At block 3504, a sacrificial gate structure having a gate dielectric and a sacrificial dielectric material is formed over the first and second active regions. FIGS. 23A-24B illustrate some embodiments corresponding to block 3504.

At block 3506, first doped regions are formed within the first active region on opposing sides of the sacrificial dielectric material, and second doped regions are formed within the second active region on opposing sides of the sacrificial dielectric material. FIGS. 25A-25B illustrate some embodiments corresponding to block 3506.

At block 3508, a first dielectric layer is formed over the substrate and around the sacrificial dielectric material. FIG. 26 illustrates some embodiments corresponding to block 3508.

At block 3510, the sacrificial gate material is removed from within the sacrificial gate structure to form replacement gate cavities. FIG. 27 illustrates some embodiments corresponding to block 3510.

At block 3512, a barrier layer, a first gate metal and a sacrificial dielectric material are formed in sequence to fill the replacement gate cavities. FIG. 28 illustrates some embodiments corresponding to block 3512.

At block 3514, the sacrificial dielectric material is patterned to form a patterned mask. FIG. 29 illustrates some embodiments corresponding to block 3514.

At block 3516, the first gate metal is patterned using the patterned mask as an etch mask. FIG. 30 illustrates some embodiments corresponding to block 3516.

Figure 31:
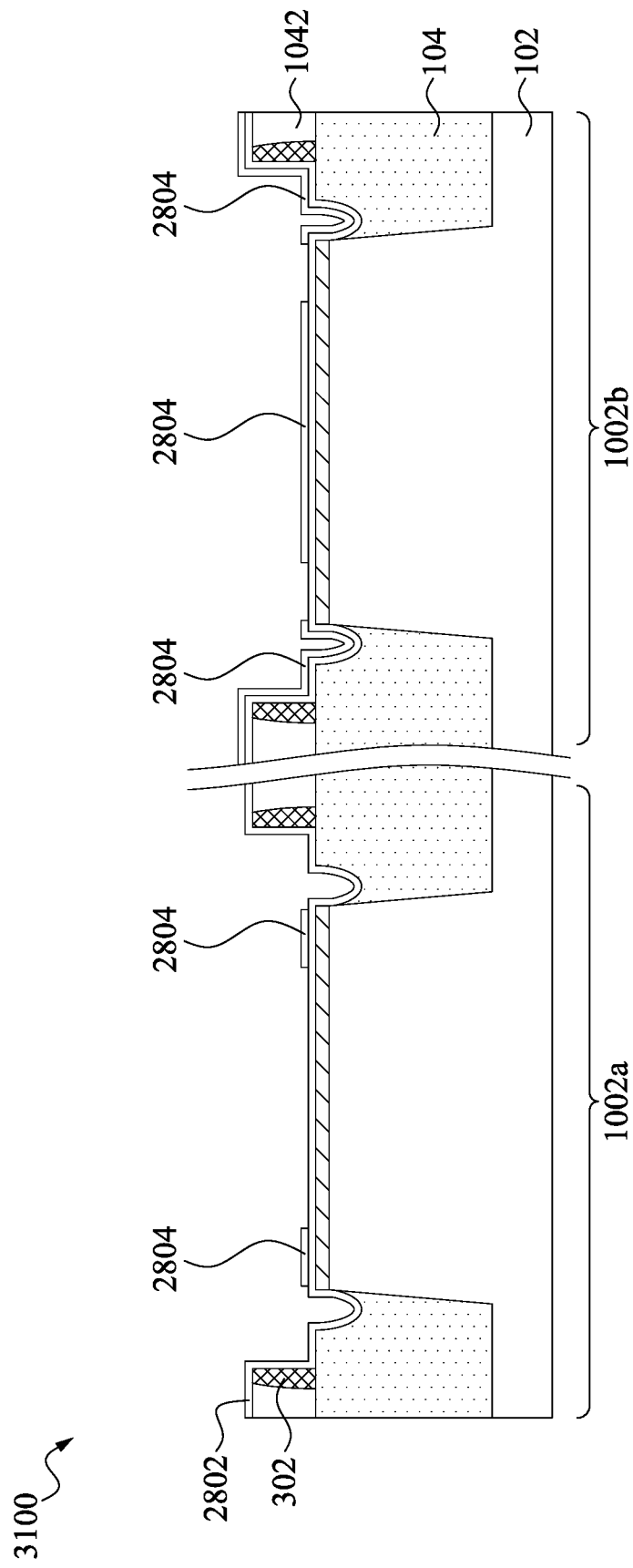

At block 3518, the sacrificial dielectric material is removed from within the replacement gate cavities. FIG. 31 illustrates some embodiments corresponding to block 3518.

At block 3520, a second gate metal and a fill metal are formed within the replacement gate cavities and over the first gate metal. FIG. 32 illustrates some embodiments corresponding to block 3520.

At block 3522, a planarization process is performed to remove the excess fill metal and second gate metal from over the first dielectric layer. FIG. 33 illustrates some embodiments corresponding to block 3522.

At block 3524, a second dielectric layer is formed over the first dielectric layer, and a conductive contact is formed within the second dielectric layer. FIG. 34 illustrates some embodiment corresponding to block 3524.

Based on the above discussions, it can be seen that the present disclosure offers advantages. It is understood, however, that other embodiments may offer additional advantages, and not all advantages are necessarily disclosed herein, and that no particular advantage is required for all embodiments. One advantage is that the kink effect is reduced, because the source and drain regions have smaller widths than the channel region, and because different gate electrode regions have different work functions. Another advantage is that the saturation drain current ($I_{DSAT}$) can be improved (e.g., more than 10% improvement), because the source and drain regions have smaller widths than the channel region, and because different gate electrode regions have different work functions. Yet another advantage is that narrow width effect can be reduced, because the source and drain regions have smaller widths than the channel region, and because different gate electrode regions have different work functions.

In some embodiments, an integrated chip comprises a substrate, an isolation structure and a gate structure. The isolation structure is disposed in the substrate and enclosing an active region in the substrate. The active region comprises a source region and a drain region separated by a channel region along a first direction. The gate structure is disposed over the channel region and comprising a first gate electrode region and a second gate electrode region arranged one next to another laterally along a second direction perpendicular to the first direction. The first gate electrode region has a first composition, and the second gate electrode region has a second composition different than the first composition.

In some embodiments, an integrated chip comprises an isolation structure disposed within a substrate and defining an active region in the substrate. A first doped region is disposed within the active region. A second doped region is disposed within the active region and separated from the first doped region by a middle region of the active region along a first direction. A gate structure extends over the active region along a second direction perpendicular to the first direction. The gate structure comprises a first gate electrode region having a first work function and a second gate electrode region of discrete segments having second work functions different from the first work function. The discrete segments of the second gate electrode region are separated by a center portion of the first gate electrode region along the second direction.

In some embodiments, an integrated chip comprises an isolation structure and a gate structure. The isolation structure is disposed within a trench in a substrate and defining an active region comprising a first doped region, a second doped region, and a middle region arranged between the first doped region and the second doped region along a first direction. The gate structure is disposed over the active region and comprising a first gate electrode region and a second gate electrode region, the second gate electrode region including discrete segments disposed within openings of the first gate electrode region on opposite sides of the first doped region or the second doped region along a second direction perpendicular to the first direction. The first gate electrode region has a first composition, and the second gate electrode region has a second composition different than the first composition.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated chip, comprising:
   a substrate;
   an isolation structure disposed in the substrate and enclosing an active region in the substrate, the active region comprising a source region and a drain region separated by a channel region along a first direction; and
   a gate structure disposed over the channel region and comprising a first gate electrode region and a second gate electrode region arranged one next to another laterally along a second direction perpendicular to the first direction, the first gate electrode region having a first composition and the second gate electrode region having a second composition different than the first composition;
   wherein a length of the first gate electrode region along the first direction is greater than a length of the second gate electrode region along the first direction.

2. The integrated chip of claim 1, further comprising:
   a first divot and a second divot of the isolation structure disposed on opposite sides of the channel region along the second direction, the first divot and the second divot recessed below an uppermost surface of the isolation structure;
   wherein the gate structure extends downwardly into the first divot and the second divot.

3. The integrated chip of claim 2, wherein the first gate electrode region fills in the first divot and the second divot, and the second gate electrode region is disposed above and between the first divot and the second divot.

4. The integrated chip of claim 3, wherein the second gate electrode region comprises a first portion and a second portion respectively next to the first divot and the second divot and separated by a center portion of the first gate electrode region.

5. The integrated chip of claim 2, wherein the second gate electrode region comprises segments filling the first divot and the second divot and separated by a center portion of the first gate electrode region.

6. The integrated chip of claim 1, wherein the first gate electrode region is a continuous segment, while the second gate electrode region comprises two separate and distinct segments disposed directly above and across an interface of the isolation structure and the active region.

7. The integrated chip of claim 1, segments of the second gate electrode region respectively separates a first portion and a second portion of the first gate electrode region from a center portion of the first gate electrode region along the second direction.

8. The integrated chip of claim 1, wherein the second gate electrode region extends past opposing sides of the channel region along the first direction.

9. The integrated chip of claim 1, wherein the length of the second gate electrode region along the first direction is less than a length of the channel region along the first direction.

10. The integrated chip of claim 1, wherein the length of the second gate electrode region along the first direction is greater than the length of the channel region along the first direction.

11. The integrated chip of claim 1, wherein the source region has a first width along the second direction, the drain region has a second width along the second direction, and the channel region has a third width along the second direction larger than the first width and the second width.

12. The integrated chip of claim 1, wherein the first composition comprises an n-type gate metal, and the second composition comprises a p-type gate metal.

13. An integrated chip, comprising:
   an isolation structure disposed within a substrate and defining an active region in the substrate;
   a first doped region disposed within the active region;
   a second doped region disposed within the active region and separated from the first doped region by a middle region of the active region along a first direction,
   a gate structure extending over the active region along a second direction perpendicular to the first direction, the gate structure comprising a first gate electrode region having a first work function and a second gate electrode region having second work functions different from the first work function, the second gate electrode region having discrete segments separated by a center portion of the first gate electrode region along the second direction; and
   a first divot and a second divot of the isolation structure disposed on opposite sides of the middle region of the active region along the second direction, the first divot and the second divot recessed below an uppermost surface of the isolation structure;

wherein the first gate electrode region fills in the first divot and the second divot, and the second gate electrode region is disposed above and between the first divot and the second divot.

14. The integrated chip of claim 13, wherein the first gate electrode region comprises an n-type gate metal, and the second gate electrode region comprises a p-type gate metal.

15. The integrated chip of claim 13, wherein the discrete segments of the second gate electrode region are arranged along the second direction.

16. The integrated chip of claim 13, wherein the first gate electrode region encloses the second gate electrode region.

17. The integrated chip of claim 13, wherein the middle region of the active region extends past opposing sides of the first doped region along the second direction.

18. An integrated chip, comprising:
- an isolation structure disposed within a trench in a substrate and defining an active region comprising a first doped region, a second doped region, and a middle region arranged between the first doped region and the second doped region along a first direction; and
- a gate structure disposed over the active region and comprising a first gate electrode region and a second gate electrode region, the second gate electrode region including discrete segments disposed within openings of the first gate electrode region on opposite sides of the first doped region or the second doped region along a second direction perpendicular to the first direction, the first gate electrode region having a first composition and the second gate electrode region having a second composition different than the first composition;
- a first divot and a second divot of the isolation structure disposed on opposite sides of the middle region of the active region along the second direction, the first divot and the second divot recessed below an uppermost surface of the isolation structure;
- wherein the second gate electrode region comprises segments filling the first divot and the second divot.

19. The integrated chip of claim 18, wherein the middle region of the active region extends past opposing sides of the first doped region or the second doped region along the second direction.

20. The integrated chip of claim 18, wherein the first gate electrode region encloses the second gate electrode region from a top view.

* * * * *